United States Patent
Ooishi

(10) Patent No.: US 6,940,777 B2
(45) Date of Patent: Sep. 6, 2005

(54) SEMICONDUCTOR DEVICE AND SEMICONDUCTOR MEMORY DEVICE PROVIDED WITH INTERNAL CURRENT SETTING ADJUSTMENT CIRCUIT

(75) Inventor: Tsukasa Ooishi, Hyogo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/694,780

(22) Filed: Oct. 29, 2003

(65) Prior Publication Data

US 2004/0094778 A1 May 20, 2004

Related U.S. Application Data

(63) Continuation-in-part of application No. 10/410,206, filed on Apr. 10, 2003, now abandoned.

(30) Foreign Application Priority Data

Oct. 31, 2002 (JP) ......................................... 2002-318078
Jul. 18, 2003 (JP) ......................................... 2003-276468

(51) Int. Cl.[7] ............................................. G11C 7/00
(52) U.S. Cl. ................... 365/226; 365/229; 365/189.09
(58) Field of Search ................................. 365/226, 229, 365/189.07; 327/540, 541, 536, 537

(56) References Cited

U.S. PATENT DOCUMENTS

| 5,644,250 A | * | 7/1997 | Ooishi | .......................... 326/16 |
| 5,920,226 A | * | 7/1999 | Mimura | ....................... 327/537 |
| 6,184,744 B1 | * | 2/2001 | Morishita | ..................... 327/541 |
| 6,201,754 B1 | | 3/2001 | Ooishi et al. | |
| 6,256,224 B1 | | 7/2001 | Perner et al. | |
| 6,329,873 B2 | * | 12/2001 | Morishita | ..................... 327/541 |
| 6,337,828 B2 | | 1/2002 | Ooishi et al. | |
| 6,347,056 B1 | | 2/2002 | Ledford et al. | |
| 2003/0081453 A1 | | 5/2003 | Hidaka | |

FOREIGN PATENT DOCUMENTS

JP 11-339470 12/1999

OTHER PUBLICATIONS

Roy Scheuerlein et al., "A 10ns Read and Write Non–Volatile Memory Array using a Magnetic Tunnel Junction and FET Switch in Each Cell," IEEE ISSCC Digest of Technical Papers, Feb. 2000, pp. 94–95, 128–129, 409–410.
NIKKEI Microdevices, "Forefront of Non–Volatile Memory The Future in Intel's Mind: From Flash Memory to "OUM"," Mar. 2002, pp. 65–78 (with partial English Translation).

* cited by examiner

Primary Examiner—Gene N. Auduong
(74) Attorney, Agent, or Firm—Burns, Doane, Swecker & Mathis LLP

(57) ABSTRACT

An operating current is supplied from a power supply node to an internal circuit. In a test mode, current supply from a power supply to the power supply node is stopped by a current switch, and an externally adjustable test current is supplied to the power supply node. The test current is set in accordance with an acceptable value of a leakage current in the internal circuit. Evaluation is made as to whether the leakage current in the internal circuit is not greater than the acceptable value, in accordance with an output of a voltage comparison circuit detecting a voltage drop at the power supply node.

31 Claims, 41 Drawing Sheets

FIG.6

| ADJUSTMENT LEVEL | -8 | -7 | -6 | -5 | -4 | -3 | -2 | -1 | 0 | +1 | +2 | +3 | +4 | +5 | +6 | +7 |
|---|---|---|---|---|---|---|---|---|---|---|---|---|---|---|---|---|
| ADJUSTMENT SIGNALS (FROM BIST CIRCUIT 30) P0 | 0 | 1 | 0 | 1 | 0 | 1 | 0 | 1 | 0 | 1 | 0 | 1 | 0 | 1 | 0 | 1 |
| P1 | 0 | 0 | 1 | 1 | 0 | 0 | 1 | 1 | 0 | 0 | 1 | 1 | 0 | 0 | 1 | 1 |
| P2 | 0 | 0 | 0 | 0 | 1 | 1 | 1 | 1 | 0 | 0 | 0 | 0 | 1 | 1 | 1 | 1 |
| P3 | 1 | 1 | 1 | 1 | 1 | 1 | 1 | 1 | 0 | 0 | 0 | 0 | 0 | 0 | 0 | 0 |
| VCMP LEVEL | H | H | H | H | H | H | L | L | L | L | L | L | L | L | L | L |
| OUTPUT OF EX-OR 93 | L | L | L | L | L | L | H | L | L | L | L | L | L | L | L | L |

LOW Vbb ← → HIGH Vbb

ADJUSTMENT SIGNALS ACCUMULATED TO MEMORY 36:
- P0=1
- P1=0
- P2=1
- P3=1

SEMICONDUCTOR DEVICE AND SEMICONDUCTOR MEMORY DEVICE PROVIDED WITH INTERNAL CURRENT SETTING ADJUSTMENT CIRCUIT

This disclosure is a continuation-in-part of Application No. 10/410,206, filed Apr. 10, 2003, the contents of which are incorporated herein by reference.

BACKGROUND OF THE INVENTION

1. Field of the Invention

The present invention relates to semiconductor devices and semiconductor memory devices, and more particularly to a semiconductor device and a semiconductor memory device provided with a function to adjust the internal current setting.

2. Description of the Background Art

Semiconductor devices and semiconductor memory devices often require adjustment of the setting of internal currents such as a leakage current in a standby mode and an operating current for accurate performance of an desired operation. A typical configuration employed is one which evaluates the internal currents in an operation test (test mode) and adjusts the setting of the internal currents by fuse cut or the like, based on the evaluation results.

In particular, it is a critical issue to suppress the leakage current in the standby mode for a semiconductor device and a semiconductor memory device mounted to battery-driven portable equipment, for which there is an increasing demand for lower power consumption.

A configuration for suppressing the leakage current in the standby mode is disclosed, e.g., in Japanese Patent Laying-Open No. 11-339470. Specifically, it discloses a configuration of a dynamic random access memory (DRAM) which permits adjustment of a potential difference between a non-selected level of a word line and a low level of a bit line, such that the leakage current of a MOS transistor for use in address selection in an off state is not to exceed a desired current value.

On the other hand, a magnetic random access memory (MRAM) device and an Ovonic unified memory (OUM) device have recently attracted attention as new types of memory devices.

For example, as disclosed in Roy Scheuerlein et. al, "A 10 ns Read and Write Non-Volatile Memory Array Using a Magnetic Tunnel Junction and FET Switch in each Cell", 2000 IEEE ISSCC Digest of Technical Papers, TA7.2, an MRAM device performs nonvolatile data storage using a plurality of thin film magnetic elements formed on a semiconductor integrated circuit, permitting random accesses to the respective thin film magnetic elements. In particular, recent announcement shows that performance of the MRAM device is significantly improved by using memory cells (hereinafter, also referred to as "MTJ memory cells") formed of the thin film magnetic elements utilizing magnetic tunnel junctions (MTJ). The MTJ memory cell stores data as it is magnetized by a magnetic field generated by a data write current, in a direction in accordance with data to be written.

Further, as disclosed in Yasuaki Nagahiro, "Forefront of Non-Volatile Memory—The Future in Intel's Mind: From Flash Memory to "OUM"", Nikkei Microdevices, Nikkei Business Publications, Inc., March 2002, pp. 65–78, a memory cell constituting an OUM device (hereinafter, also referred to as "OUM cell") is formed with a thin film chalcogenide layer and a power-generating element. Chalcogenide attains an amorphous state or a crystalline state in accordance with a heat pattern from the power-generating element through which a data write current passes. The chalcogenide layer has electric resistances which differ in the amorphous state and in the crystalline state. The OUM cell is supplied with a data write current of one of the two patterns corresponding to the two heat patterns in accordance with data to be written, and attains the amorphous state or the crystalline state to store the data.

In the MRAM device and the OUM device, data write is performed in response to supply of a data write current (internal current). Thus, it is necessary to adjust the setting of the data write current with high precision.

In adjustment of the internal current setting as described above, it is desired that both evaluation of the internal current in a test mode and adjustment of the internal current setting based on the evaluation result can be performed with simple configurations. That is, it is necessary to make the configurations of the evaluation circuit of a leakage current or a data write current in the test mode and the setting adjustment circuit of the same in an actual operation as simple as possible.

SUMMARY OF THE INVENTION

An object of the present invention is to provide a semiconductor device and a semiconductor memory device which permit evaluation of internal currents such as a leakage current and a data write current in a test mode and adjustment of the setting of the same in actual operations including a normal operation mode and a standby mode, with simple circuit configurations.

The semiconductor device according to the present invention is provided with an internal circuit which receives supply of an operating current from a power supply node, a current switch which is connected between an operating voltage source and the power supply node, and a leakage detecting circuit which detects whether a leakage current in the internal circuit is not greater than a reference level. The leakage detecting circuit includes a reference current supply portion which supplies a current of the reference level to the power supply node during an off period of the current switch, and a voltage comparison circuit which compares a voltage of the power supply node with a prescribed voltage during the off period.

Preferably, the internal circuit includes at least one field effect transistor, and the semiconductor device further includes an internal voltage control circuit which controls an internal voltage being applied to one of source, gate, drain and substrate of the field effect transistor included in the internal circuit, and an internal voltage interconnection which transmits the internal voltage. The internal voltage control circuit includes an internal voltage comparison circuit which compares a voltage of the internal voltage interconnection with an object voltage, a voltage control circuit which controls the internal voltage based on a comparison result in the internal voltage comparison circuit, and a voltage adjust portion which changes the object voltage in response to an adjustment input.

The semiconductor memory device according to the present invention is provided with a plurality of memory cells each having data written therein in response to supply of a data write current, a transistor formed of a field effect transistor and driving the data write current, an internal voltage control circuit controlling an internal voltage applied to the transistor, and an internal voltage interconnection for transmission of the internal voltage. The internal voltage control circuit includes an internal voltage comparison circuit which compares a voltage of the internal voltage interconnection with an object voltage, a voltage control circuit which controls the internal voltage based on the comparison result of the internal voltage comparison circuit, and a voltage adjust portion which changes the object voltage in response to an adjustment input.

The semiconductor memory device according to another configuration of the present invention includes a plurality of memory cells each having data written therein in response to supply of a data write current, a first write current line arranged for each of prescribed groups of the plurality of memory cells and having the data write current flown thereon in one of first and second directions, and a plurality of transistors driving the data write current. The plurality of transistors include a first driver transistor for driving the current of the first direction to the first write current line, and a second driver transistor for driving the current of the second direction to the first write current line. The semiconductor memory device further includes a first current adjust portion capable of adjusting current amounts flown by the first and second driver transistors independently from each other.

Thus, a main advantage of the present invention is that the leakage current in the internal circuit can be evaluated with a simple circuit configuration, without a need to measure the internal current itself flowing inside the semiconductor device.

In this semiconductor device, adjusting the voltage being applied to the field effect transistor (MOS transistor) within the internal circuit permits control of the leakage current in the internal circuit of the semiconductor device not to exceed a prescribed level.

In the semiconductor memory device provided with the memory cells on which data write is performed in response to the supply of the data write current, the data write current can be adjusted to a proper level by controlling the voltage being applied to the transistor driving the data write current. Accordingly, it is possible to set the data write current to a level necessary to ensure a data write margin, and also prevent an increase of power consumption due to excessive supply of the data write current.

Further, even in the case where there occurs asymmetry of data writing characteristics in an actually produced memory cell depending on a direction of the data write current, it is possible to adjust the data write current to a proper level to thereby perform data write in a stable manner.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a conceptual diagram illustrating settings of adjustment signals and operation test results.

DESCRIPTION OF THE PREFERRED EMBODIMENTS

Figure 1:
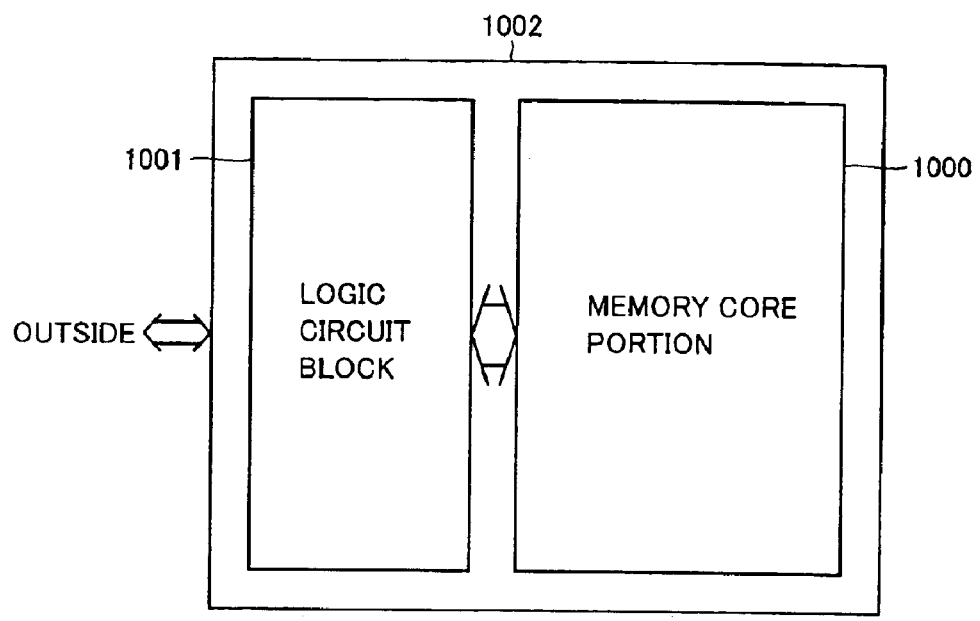
FIG. 1 is a schematic diagram showing a configuration of the semiconductor device according to a first embodiment of the present invention.

Hereinafter, embodiments of the present invention will be described in detail with reference to the drawings. In the drawings, the same reference characters denote the same or corresponding portions.

First Embodiment (Overall Configuration)

The semiconductor device according to the first embodiment of the present invention is generally described with reference to FIGS. 1–3. In the description below, a signal prefixed by "/" represents an inverse signal of the corresponding signal without the prefix "/".

As shown in FIG. 1, the semiconductor device according to the first embodiment is provided with a memory core portion 1000 and a logic circuit block 1001. Memory core portion 1000 and logic circuit block 1001 are formed on a same chip 1002. Although not shown, SRAM, gate array, FPGA, nonvolatile RAM, ROM and others may also be mounted thereon.

Figure 2:
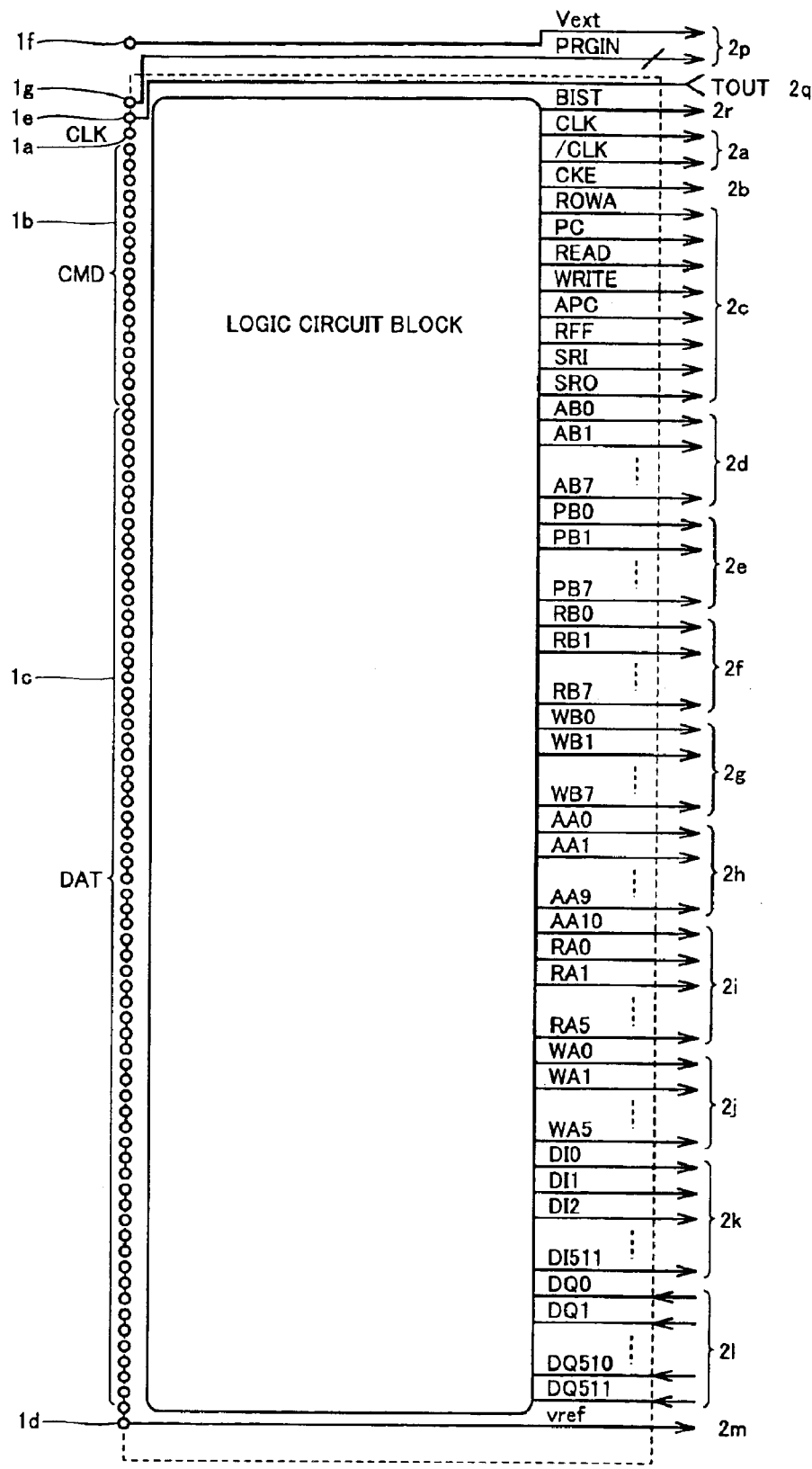
FIG. 2 illustrates the logic circuit block shown in FIG. 1.

As shown in FIG. 2, logic circuit block 1001 and memory core portion 1000 perform signal transmission/reception via connect nodes 2a–2m, 2p–2r. Commands, addresses and data are transmitted from logic circuit block 1001 to memory core portion 1000, and correspondingly, data are transmitted from memory core portion 1000 to logic circuit block 1001.

Logic circuit block 1001 receives an external clock signal CLK from a pin 1a, a command CMD from a pin 1b, and a reference voltage vref from a pin 1d. It inputs/outputs data DAT using a pin 1c. Further, in a test mode, a test output TOUT is output from a pin 1e which indicates an operation test result at memory core portion 1000. An external test voltage Vext is applied to a pin 1f for use in the operation test in the test mode. A program input PRGIN is input to a pin 1g for storage of information in a program circuit within memory core portion 1000.

Logic circuit block 1001 performs logical processing on an input signal, and outputs a corresponding signal to memory core portion 1000. Reference voltage vref received at pin 1d and external test voltage Vext applied to pin 1f are output without modification to nodes 2m and 2p, respectively.

As shown in FIG. 2, memory core portion 1000 receives the following signals via connect nodes 2a–2k, 2p, 2r. Clock signals CLK, /CLK are supplied from node 2a. A clock enable signal CKE is supplied from node 2b. Supplied from node 2c are control signals including a signal ROWA indicating activation of a word line, a signal PC associated with reset (precharge) of the word line, a signal READ associated with a read operation of column-related circuits, a signal WRITE associated with a write operation of the column-related circuits, a signal APC designating an auto-precharge operation, a signal REF associated with a refresh operation, and signals SRI and SWO associated with a self-refresh mode.

At most four commands of signals ROWA, PC, READ, WRITE can be output simultaneously.

Act bank signals AB0–AB7 are supplied from node 2d. The act bank signals designate banks to be accessed upon row-related and column-related accesses. Precharge bank signals PB0–PB7 are supplied from node 2e. Read bank signals RB0–RB7 are supplied from node 2f, and write bank signals WB0–WB7 are supplied from node 2g.

Act address signals AA0–AA10 are supplied from node 2h. Read address signals RA0–RA5 are supplied from node 2i, and write address signals WA0–WA5 are supplied from node 2j.

Input data DI0–DI511 are supplied from node 2k. Output data DQ0–DQ511 output from memory core portion 1000 are transmitted to logic circuit block 1001 via node 21.

From node 2p, external test voltage Vext and program input PRGIN provided to respective pins 1f and 1g are transmitted to memory core portion 1000. Node 2q transmits test output TOUT output from memory core portion 1000 in the test mode, to pin 1e. From node 2r, a BIST signal for activating a prescribed built in self test (BIST) is supplied to memory core portion 1000.

Figure 3:
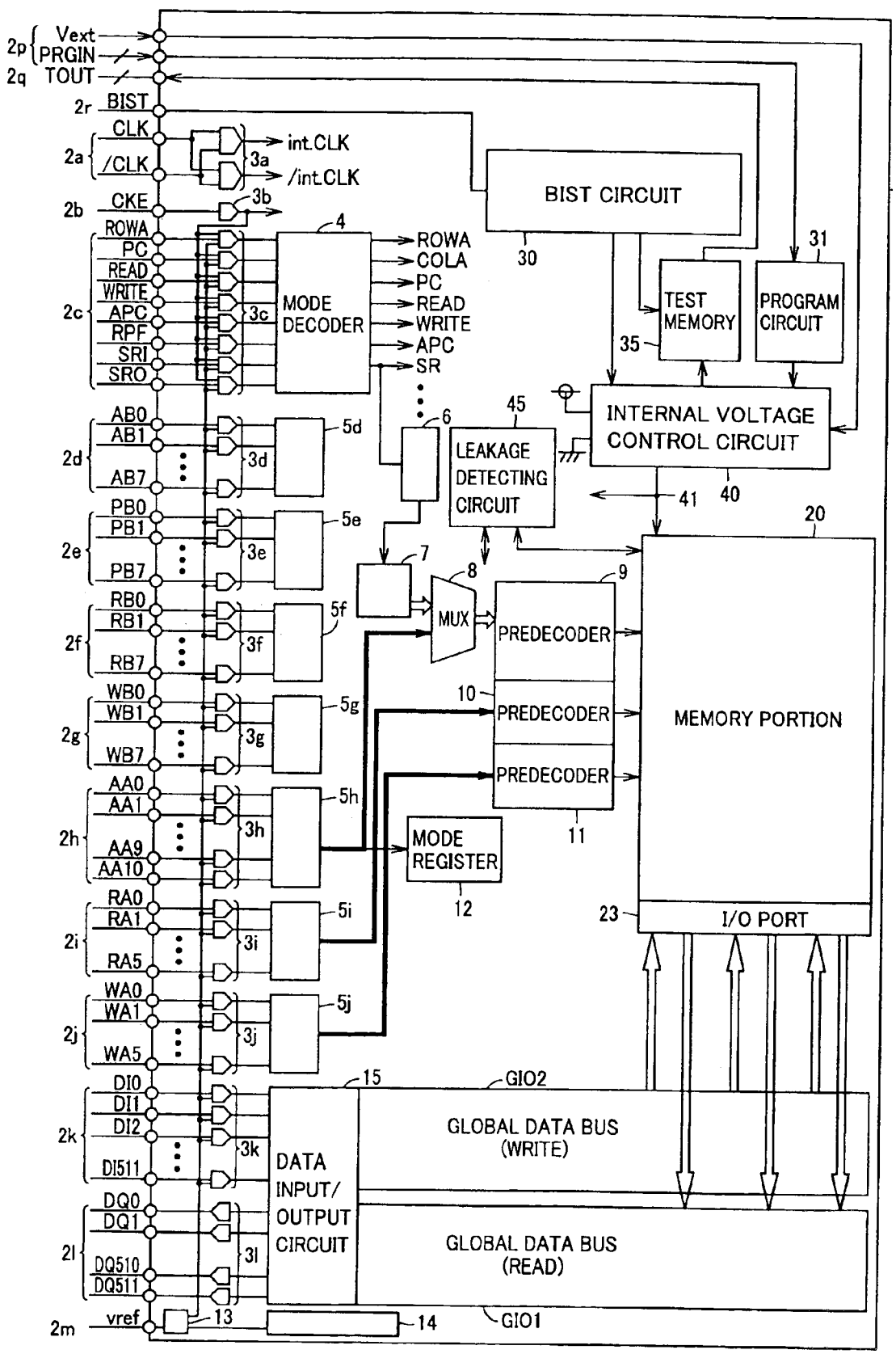
FIG. 3 shows, by way of example, a configuration of the memory core portion shown in FIG. 1.

Referring to FIG. 3, memory core portion 1000 includes buffers 3a–3l, a mode decoder 4, an act bank latch 5d, a precharge bank latch 5e, a read bank latch 5f, a write bank latch 5g, a row address latch 5h, a read address latch 5i, a write address latch 5j, a self refresh timer 6, a refresh address counter 7, a multiplexer 8, predecoders 9, 10, 11, a mode register 12, a reference voltage control circuit 13, a synchronous circuit 14, a data input/output circuit 15, a memory portion 20, an I/O port 23 and global data buses GIO1, GIO2.

Buffer 3a receives clock signals CLK, /CLK and outputs internal clocks int.CLK, /int.CLK. Buffers 3c–3k each receive reference voltage vref from reference voltage control circuit 13. Buffer 3b receives clock enable signal CKE. Buffer 3c operates in accordance with an output of buffer 3b, and takes in the control signals received at node 2c. Mode decoder 4 receives an output of buffer 3c, and outputs internal control signals (signal ROWA, signal COLA, signal PC, signal READ, signal WRITE, signal APC, signal SR and others).

Act bank latch 5d latches act bank signals AB0–AB7 via buffer 3d. Precharge bank latch 5e latches precharge bank signals PB0–PB7 via buffer 3e. Read bank latch 5f latches read bank signals RB0–RB7 via buffer 3f. Write bank latch 5g latches write bank signals WB0–WB7 via buffer 3g. Row address latch 5h latches act address signals AA0–AA10 via buffer 3h. Read address latch 5i latches read address signals RA0–RA5 via buffer 3i. Write address latch 5j latches write address signals WA0–WA5 via buffer 3j.

Buffer 3k takes in input data DI0–DI511. Buffer 31 takes in data output from data input/output circuit 15, and outputs the same to node 21.

Self refresh timer 6 starts an operation in receipt of signal SR output from mode decoder 4. Refresh address counter 7 generates an address for performing a refresh operation according to a designation of self refresh timer 6. Multiplexer 8 outputs an output of row address latch 5h in a normal operation, and outputs an output of refresh address counter 7 in a self refresh operation. Predecoder 9 decodes a row address received from multiplexer 8. Predecoder 10 decodes a column address received from read address latch 5i. Predecoder 11 decodes a column address received from write address latch 5j. Mode register 12 holds information corresponding to a prescribed operation mode (e.g., data corresponding to a burst length or the like) in accordance with the output of row address latch 5h.

Global data bus GIO1 transmits data read out of memory portion 20 to data input/output circuit 15. Global data bus GIO2 transmits input data received at data input/output circuit 15 to memory portion 20. Although not shown, it is assumed that memory portion 20 is divided into eight banks that are activated by the corresponding act bank signals AB0–AB7. It is further assumed that a row decoder and a column decoder are arranged for the respective bank. The row decoder performs selection in the corresponding row direction in response to an output of predecoder 9. The column decoder performs selection in the corresponding column direction in response to outputs of predecoders 10 and 11.

Each bank is controlled by bank addresses, which exist corresponding to the respective commands. For example, signal ROWA and act bank signal ABn (n=0–7) cause activation of a word line in the corresponding bank. Signal PC and precharge bank signal PBn (n=0–7) cause reset of a word line in the corresponding bank. Signal READ and read bank signal RBn (=0–7) cause data read from a sense amplifier in the corresponding bank. Further, signal WRITE and write bank signal WBn (n=0–7) cause data write to a sense amplifier in the corresponding bank. Memory portion 20 sends/receives data to/from global data buses GIO1, GIO2 via I/O port 23.

Synchronous circuit 14 is formed of, e.g., a PLL circuit. Synchronous circuit 14 generates an internal test clock (BIST clock) in a test mode. At the time other than the test mode, reference voltage vref input from pin 1d (outside) determines threshold voltages of input buffers 3c–3k. At this time, synchronous circuit 14 being a test-related circuit is in a stopped state. On the other hand, in the test mode, pin 1d is used as a pin for providing a power supply voltage to synchronous circuit 14. At this time, a reference voltage generated internally is supplied to the buffers 3c–3k.

In the test mode, memory core portion 1000 operates on the basis of the relevant BIST clock, instead of internal clock int.CLK output from buffer 3a, for example. Alternatively, certain circuits performing the operation test may operate based on the BIST clock instead of internal clock int.CLK.

Memory core portion 1000 is further provided with a BIST circuit 30, a program circuit 31, a test memory 35, an internal voltage control circuit 40, an internal voltage interconnection 41, and a leakage detecting circuit 45.

BIST circuit 30 controls execution of a preset, prescribed operation test in response to the BIST signal. Test memory 35 temporarily stores data indicating the operation test result, and also externally outputs the same as test output TOUT. Program circuit 31 stores program information, in a non-volatile manner, for use in setting various kinds of parameters at the time of an actual operation of memory core portion 1000. The program information is written into a program element such as a fuse element, in response to program input PRGIN. The program information can be obtained, e.g., by analyzing test output TOUT of the operation test.

Internal voltage control circuit 40 controls an internal voltage transmitted by internal voltage interconnection 41. Internal voltage interconnection 41 supplies the internal voltage to the internal circuit group within memory core portion 1000. A level of the internal voltage controlled by internal voltage control circuit 40 is set based on the program information stored in program circuit 31.

Leakage detecting circuit 45 is provided for detecting whether a leakage current occurring in a standby mode at the internal circuit group within memory core portion 1000 is not greater than a reference level (acceptable level).

(Control of Internal Voltage and Configuration for Operation Test)

Figure 4:
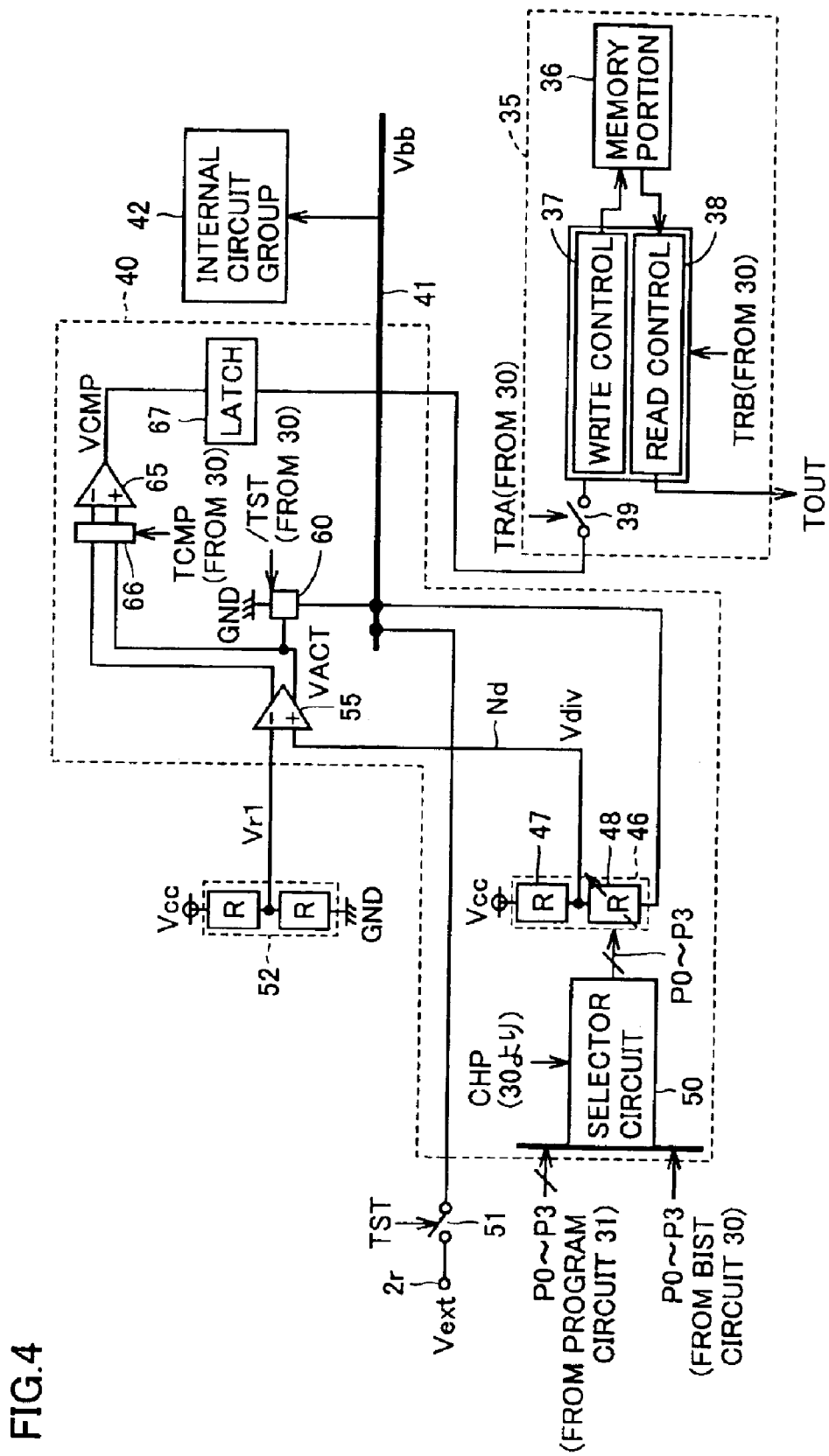
FIG. 4 is a block diagram showing the configurations of the test memory and the internal voltage control circuit shown in FIG. 3.

FIG. 4 shows configurations of test memory 35 and internal voltage control circuit 40 shown in FIG. 3.

Firstly, a configuration for control of the internal voltage is described.

Referring to FIG. 4, it is assumed that internal voltage control circuit 40 controls an internal voltage Vbb that is applied as a substrate voltage to N channel MOS (N-MOS) transistors constituting internal circuit group 42. Such an internal voltage Vbb is generally set to a negative voltage. Internal voltage Vbb is supplied to internal circuit group 42 via internal voltage interconnection 41. Here, internal circuit group 42 collectively represents the circuit group within memory core portion 1000 that operate in receipt of internal voltage Vbb. In the present embodiment, the MOS transistor is shown as a representative of the field effect transistors.

Internal voltage control circuit 40 includes a voltage-divider circuit 46, a selector circuit 50, a voltage comparator 55 and a voltage generating circuit 60, for control of internal voltage Vbb.

Voltage-divider circuit 46 has a fixed resistance circuit 47 and a variable resistance circuit 48 that are connected between power supply voltage Vcc and internal voltage interconnection 41 via a node Nd. Hereinafter, in the accompanying drawings, an independent symbol "R" represents a "resistor element", and any "R" added with a subscript or a number, e.g., RB, 1R, R2 or the like, represents a resistance value.

Voltage-divider circuit 46 divides a voltage difference between internal voltage Vbb and power supply voltage Vcc by a divide ratio K (K is an actual number satisfying 0<K<1) that is in accordance with a resistance ratio between fixed resistance circuit 47 and variable resistance circuit 48, to generate a detection voltage Vdiv corresponding to internal voltage Vbb at node Nd. Variable resistance circuit 48 has a resistance value changed according to adjustment signals P0–P3 transmitted from selector circuit 50. That is, the setting of divide ratio K can also be adjusted in accordance with adjustment signals P0–P3.

Selector circuit 50 responds to a switch signal CHP from BIST circuit 30, and supplies adjustment signals P0–P3 generated by BIST circuit 30 to voltage-divider circuit 46 in a test mode. On the other hand, during actual operations other than the test mode, selector circuit 50 supplies adjustment signals P0–P3 programmed in program circuit 31 to variable resistance circuit 48. Adjust signals P0–P3 for use in the actual operations may be programmed for a normal operation (normal mode) and for a standby operation (standby mode), independently from each other, in program circuit 31.

Now, the configuration of the voltage-divider circuit and the setting and adjustment of the divide ratio are described.

Figure 5:
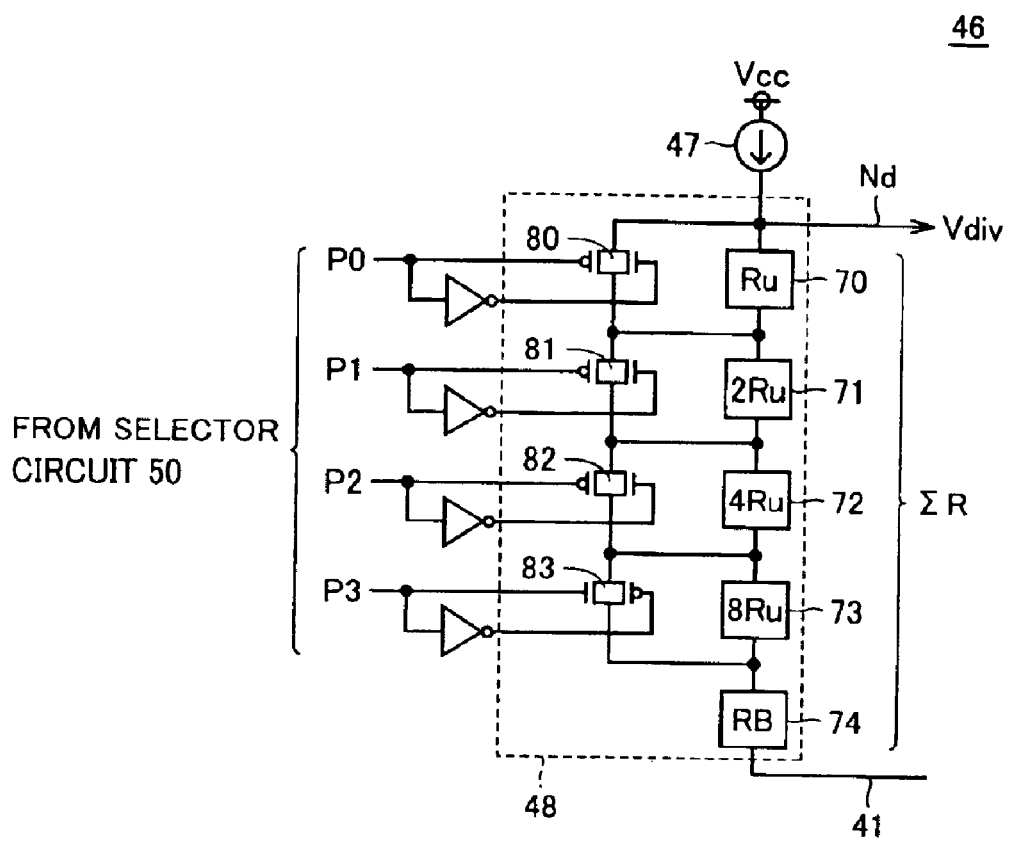
FIG. 5 is a circuit diagram showing in detail the configuration of the voltage-divider circuit in FIG. 4.

FIG. 5 shows in detail the configuration of voltage-divider circuit 46 shown in FIG. 4.

Referring to FIG. 5, fixed resistance circuit 47 shown in FIG. 4 operates as a current source, and a detection voltage Vdiv is generated in node Nd in accordance with a resistance value ΣR of variable resistance circuit 48. Detection voltage Vdiv is expressed by the following expression (1) using divide ratio K described above.

$$Vdiv = (Vcc - Vbb) \cdot K \, (0 < K < 1) \qquad (1)$$

Variable resistance circuit 48 includes resistor elements 70–74 connected in series between node Nd and internal voltage interconnection 41, and bypass switches 80–83 provided corresponding to resistor elements 70–73, respectively.

Assuming that resistor element 70 has a resistance value of Ru, resistor elements 71, 72 and 73 have electric resistances of 2Ru (twice the amount of Ru), 4Ru and 8Ru, respectively. Further, resistor element 74 has a resistance value of RB.

Bypass switches 80–83 are connected in parallel with respective resistor elements 70–73. Bypass switch 80 turns on when adjustment signal P0 is at a low level ("0"), and forms a bypass path of resistor element 70. On the other hand, bypass switch 80 turns off when adjustment signal P0 is at a high level ("1"). Hereinafter, a high level and a low level as binary voltage states are also represented as an H level and an L level.

Similar to bypass switch 80, bypass switches 81 and 82 turn on when the corresponding adjustment signals P1 and P2 are at an L level, to form bypass paths of resistor elements 71 and 72, respectively. By comparison, bypass switch 83 turns on when the corresponding adjustment signal P3 is at an H level, to form a bypass path of resistor element 73.

It is assumed that the resistance values of the bypass paths formed by respective bypass switches 80–83 are negligible compared to Ru. As a result, a resistance value ΣR of variable resistance circuit 48 changes in 16 steps in response to adjustment signals P0–P3 of four bits.

FIG. 6 shows settings of adjustment signals P0–P3 and operation test results.

Referring to FIG. 6, the settings of the adjustment signals at the time of adjustment level "–8" are (P0, P1, P2, P3)=(0, 0, 0, 1). Thus, bypass switches 80–83 each turn on, which results in ΣR=RB.

At adjustment levels from "–7" to "–1", adjustment signals P0–P2 are incremented, with P0 being the least significant bit, every time the adjustment level is increased by 1. In response thereto, ΣR changes from "RB+Ru" to "RB+7Ru", by +Ru at a time.

At adjustment level "0", the settings of the adjustment signals are (P0, P1, P2, P3)=(0, 0, 0, 0). Thus, bypass switches 80–82 turn on, and bypass switch 83 turns off. As a result, ΣR=RB+8Ru is set.

At adjustment levels from "+1" to "+7", adjustment signals P0–P2 are incremented, with P0 being the least significant bit, every time the adjustment level is increased by 1. In response, ΣR changes from "RB+9Ru" to "RB+15Ru" by +Ru at a time.

As such, the resistance value of variable resistance circuit 48 can be set in $2^4$=16 steps from "RB" to "RB+15R", in response to adjustment signals P0–P3 of four bits. Accordingly, it is also possible to set the divide ratio K of voltage-divider circuit 46 in 16 steps in response to adjustment signals P0–P3.

Referring again to FIG. 4, voltage comparator 55 compares a reference voltage Vr1 fixedly generated by reference voltage generating circuit 52 with detection voltage Vdiv generated by voltage-divider circuit 46, to substantially compare reference voltage Vr1 with internal voltage Vbb. Specifically, voltage comparator 55 activates a control signal VACT to an H level when detection voltage Vdiv is lower than reference voltage Vr1, deciding that internal voltage Vbb is greater than an object level. When detection voltage Vdiv is greater than reference voltage Vr1, it decides that internal voltage Vbb is lower than the object level, and inactivates control signal VACT to an L level.

In other words, voltage-divider circuit 46 and voltage comparator 55 compare internal voltage Vbb with an object level Vtrg that is expressed by the following expression (2) with reference voltage Vr1 and divide ratio K of voltage-divider circuit 46.

$$Vtrg = Vcc - Vr1/K \qquad (2)$$

Voltage generating circuit 60 operates in response to control signal VACT from voltage comparator 55. Specifically, voltage generating circuit 60 operates in response to activation of control signal VACT, and supplies negative charges to internal voltage interconnection 41. On the other hand, when control signal VACT is inactive, voltage generating circuit 60 attains a non-operative state, and negative charges are not supplied to internal voltage interconnection 41. The configuration of a common charge pump circuit for supplying negative charges is applicable to voltage generating circuit 60. The control system of the internal voltage thus configured can maintain internal voltage Vbb not to exceed the object level Vtrg.

As described above, the internal voltage control is performed by converting internal voltage Vbb to detection voltage Vdiv by voltage-divider circuit 46. Thus, it is possible to control negative internal voltage Vbb even if reference voltage Vr1 is set to a positive voltage. Since it is generally difficult to accurately set a negative voltage level as a reference voltage, the configuration as described above is advantageous for an internal voltage of a negative voltage.

Now, the operation test configuration in a test mode related to the internal voltage control is described.

Referring again to FIG. 4, internal voltage control circuit 40 further includes a voltage comparator 65, a transmission gate 66, and a latch circuit 67.

Voltage comparator 65 further amplifies the output of voltage comparator 55 in a test mode, to generate a voltage comparison signal VCMP. Transmission gate 66 transmits the output of voltage comparator 55 to voltage comparator 65 in the test mode, in response to a test control signal TCMP from BIST circuit 30. Latch circuit 67 temporarily holds voltage comparison signal VCMP output from voltage comparator 65.

In the test mode, a switch 51 turning on in response to a test control signal TST connects internal voltage interconnection 41 to node 2r to which external test voltage Vext is transmitted. External test voltage Vext is set corresponding to an object level (e.g., a design value) of internal voltage Vbb.

On the other hand, the operation of voltage generating circuit 60 is stopped in response to a test control signal /TST from BIST circuit 30. That is, in the test mode, internal voltage Vbb on internal voltage interconnection 41 is forcibly set to the object level from the outside.

Under these conditions, BIST circuit 30 changes adjustment signals P0–P3 stepwise to implement adjustment levels "−8" to "+7" shown in FIG. 6. In the respective adjustment level, voltage comparison signal VCMP indicating a comparison result of detection voltage Vdiv in accordance with internal voltage Vbb (i.e., external test voltage Vext) and reference voltage Vr1 is monitored. This makes it possible to obtain desired settings of adjustment signals P0–P3 which can maintain internal voltage Vbb at an object level during the actual operation.

Now, the test configuration for efficiently externally outputting desired adjustment signals P0–P3 as described above is described.

Referring again to FIG. 4, test memory 35 has a write control portion 37, a memory portion 36, a read control portion 38, and a switch 39.

Switch 39 is provided between latch circuit 67 and write control portion 37, and transmits voltage comparison signal VCMP held in latch circuit 67 to write control portion 37 in response to test control signal TRA from BIST circuit.

Figure 7:
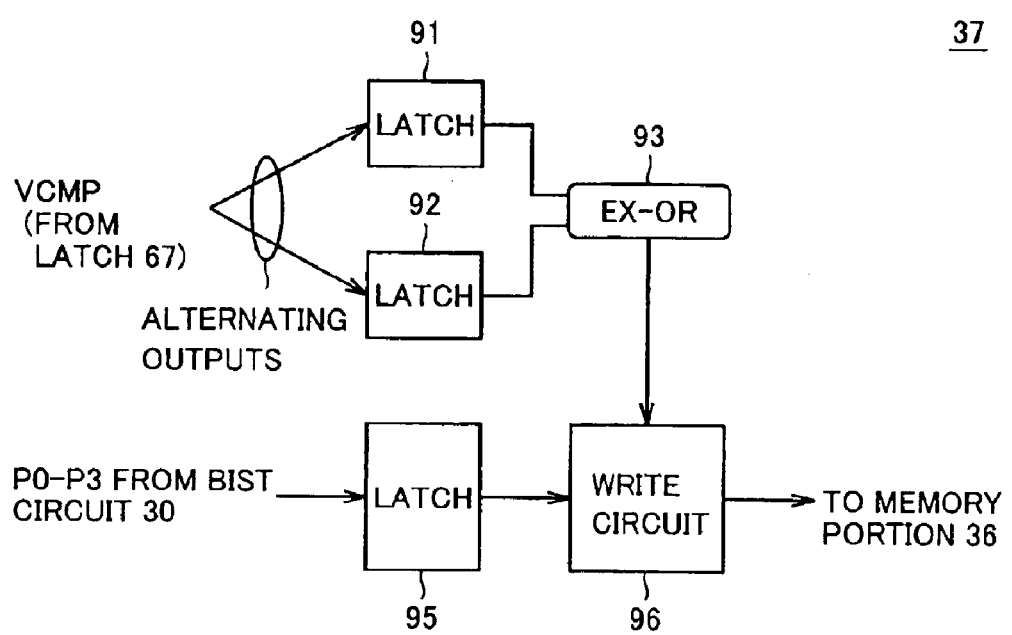
FIG. 7 is a block diagram showing the configuration of the write control portion shown in FIG. 4.

Referring to FIG. 7, write control portion 37 has latch circuits 91, 92 for temporarily holding voltage comparison signal VCMP held in latch circuit 67, a logic circuit 93 which performs matching of data held in latch circuits 91, 92, a latch circuit 95 which holds levels of adjustment signals P0–P3 set by BIST circuit 30, and a write circuit 96 which writes adjustment signals P0–P3 held in latch circuit 95 to memory portion 36 in response to an output of logic circuit 93.

Adjust signals P0–P3 held in latch circuit 95 are sequentially updated in response to the respective adjustment levels shown in FIG. 6. In the respective adjustment levels, voltage comparison signal VCMP obtained as a test result is output alternately to latch circuits 91 and 92, every time the adjustment level is changed. For example, when voltage comparison signal VCMP at adjustment level "−8" is output to latch circuit 91, voltage comparison signal VCMP at the next adjustment level "−7" is output to latch circuit 92. Further, at the next adjustment level "−6", voltage comparison signal VCMP is output to latch circuit 91, and the content held in latch circuit 91 is updated.

Examples of such operation test results are also shown in FIG. 6.

Referring again to FIG. 6, at adjustment level "−8" where adjustment signals P0, P1, P2, P3=(0, 0, 0, 1), divide ratio K becomes minimal, while divide ratio K becomes maximal at adjustment level "+7" where adjustment signals P0, P1, P2, P3=(1, 1, 1, 0). At the intermediate adjustment levels from "−7" to "+6", divide ratio K increases every time the adjustment level is raised by one step.

In the actual operation, the operation frequency of voltage generating circuit 60 increases as the divide ratio becomes smaller, i.e., as the detection voltage Vdiv relatively lowers, and thus, internal voltage Vbb is set still lower (to the negative voltage side).

In the test mode, in the course of sequentially updating adjustment signals P0–P3 to realize adjustment levels "−8" to "+7" in turn, voltage comparison signal VCMP changes from an H level to an L level at an adjustment level where a divide ratio necessary to set internal voltage Vbb to an external test voltage Vext (i.e., an object level in the actual operation) is realized. Correspondingly, at the relevant adjustment level, the output of logic circuit (EX-OR) 93 shown in FIG. 6 is set to an H level.

In the operation test results shown in FIG. 6, voltage comparison signal VCMP is set to an H level at adjustment levels from "−8" to "−3", and is set to an L level at adjustment levels from "−2" to "+7". Accordingly, the output of logic circuit (EX-OR) 93 is set to an H level at adjustment level "−2", while it is set to an L level at the remaining adjustment levels.

As a result, write control portion 37 shown in FIG. 7 causes adjustment signals (P0, P1, P2, P3)=(1, 0, 1, 1) corresponding to adjustment level "−3" to be written into memory portion 36 for storage. Adjust signals P0–P3 stored in memory portion 36 are externally output as test output TOUT via the path shown in FIGS. 2 and 3, in response to a test control signal TRB from BIST circuit 30.

Application of program input PRGIN based on the obtained operation test results to pin 1g permits programming of adjustment signals (P0, P1, P2, P3)=(1, 0, 1, 1) for use in control of internal voltage Vbb in the actual operation. As a result, in the actual operation, internal voltage control circuit 40 can control internal voltage Vbb to a level not greater than external test voltage Vext in the test mode.

Figure 8:
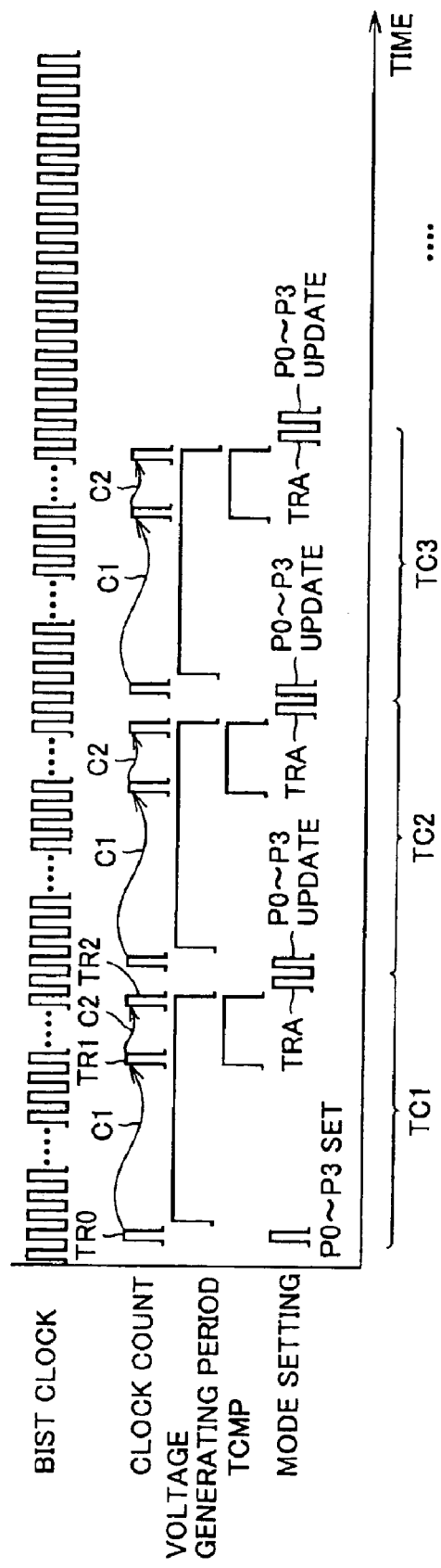
FIG. 8 is a timing chart illustrating an operation test associated with internal voltage control.

FIG. 8 is a timing chart illustrating an operation test associated with internal voltage control in a test mode.

Referring to FIG. 8, the operation test consists of a plurality of test cycles corresponding to respective adjustment levels "−8" to "+7" shown in FIG. 6. Leading three test cycles TC1–TC3 are representatively shown in FIG. 8.

As described above, in the test mode, BIST clock of a constant period is generated, and the operation test associated with the internal voltage control is carried out in response to the relevant BIST clock. At each test cycle, the number of BIST clock cycles is counted. A trigger signal TR0 is generated which is activated at the start of a test cycle. A trigger signal TR1 is generated after a lapse of clock cycles of a prescribed count number C1 from the generation of trigger signal TR0. A trigger signal TR2 is further generated after a lapse of clock cycles of a prescribed count number C2 from the generation of trigger signal TR1.

In response to generation of trigger signal TR0, BIST circuit 30 sets adjustment signals P0–P3 that can realize the adjustment level corresponding to the relevant test cycle. Internal voltage control circuit 40 starts an operation corresponding to the adjustment signals P0–P3 thus set.

The prescribed count number C1 is set corresponding to a timing where detection voltage Vdiv generated by voltage-divider circuit 46 becomes stable and the output of voltage comparator 55 reaches a prescribed amplitude. At this timing, test control signal TCMP from BIST circuit 30 is activated, and voltage comparison signal VCMP corresponding to the relevant test cycle is generated.

Further, in response to generation of trigger signal TR2, BIST circuit 30 activates test control signal TRA. Thus, voltage comparison signal VCMP at the relevant test cycle is transmitted to test memory 35.

In each of test cycles at and after TC2, the identical operations are carried out after adjustment signals P0–P3 are updated to implement the corresponding adjustment level. As a result, the test cycles corresponding to respective adjustment levels "−8" to "+7" shown in FIG. 6 are carried out, and accordingly, settings of adjustment signals P0–P3 to be employed in the actual operation, i.e., to achieve internal voltage Vbb of an object level, can be obtained.

(Configuration for Detecting Leakage. Current in Internal Circuit Group)

The configuration for evaluating a leakage current in the internal circuit group is now described.

Figure 9:
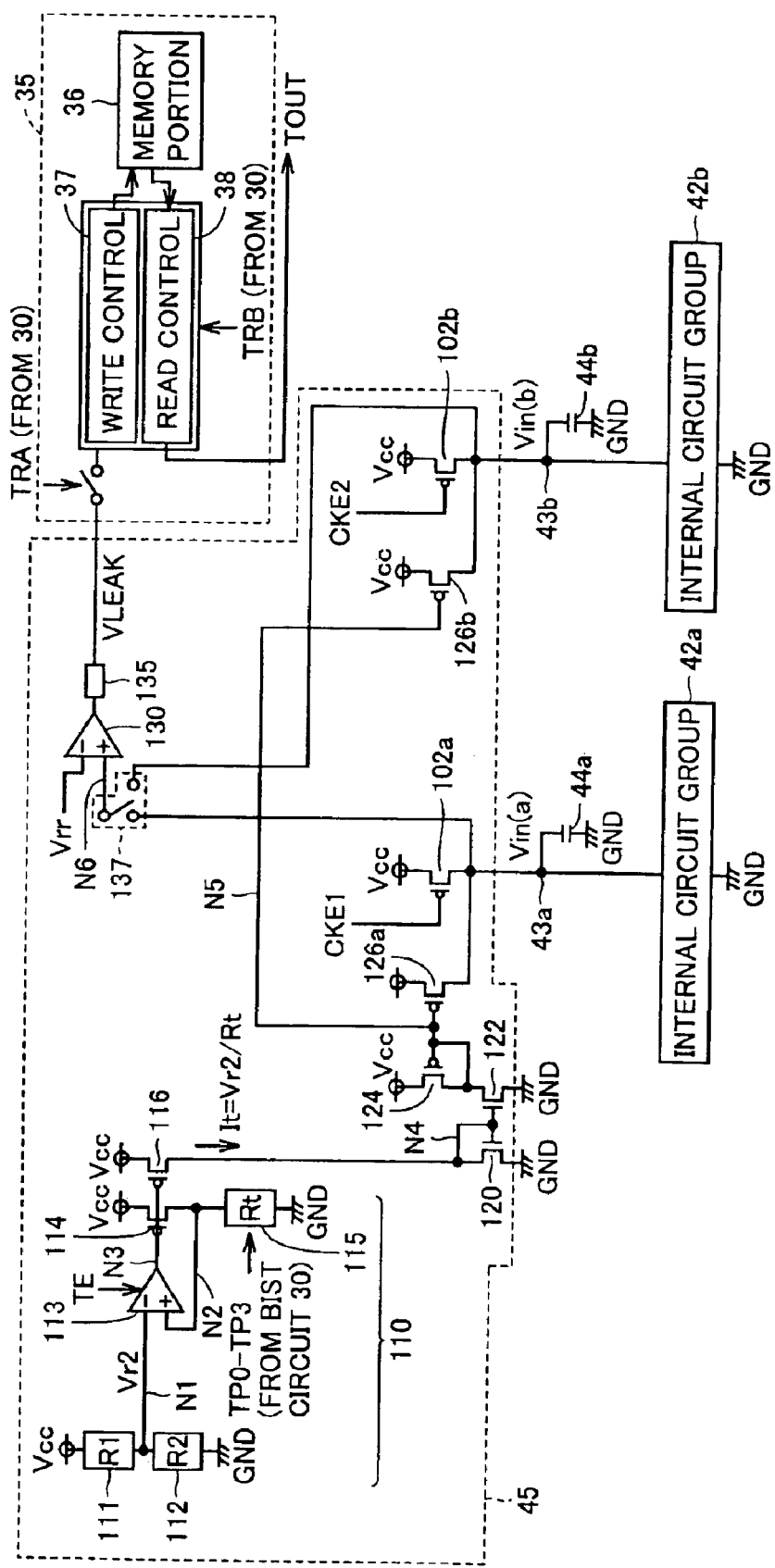
FIG. 9 is a circuit diagram showing the configuration of the leakage detecting circuit shown in FIG. 3.

Referring to FIG. 9, leakage detecting circuit 45 is provided to detect whether the leakage currents in respective internal circuit groups 42a, 42b in a standby mode are not greater than a reference level (acceptable level).

Internal circuit group 42a is supplied with an operating current from a power supply node 43a. A voltage smoothing capacitor 44a is provided at power supply node 43a. Similarly, internal circuit group 42b is supplied with an operating current from a power supply node 43b, where a voltage smoothing capacitor 44b is provided. Hereinafter, voltages of power supply nodes 43a and 43b are also referred to as internal operating voltages Vin(a) and Vin(b), respectively.

Leakage detecting circuit 45 includes current switches 102a, 102b, a test current adjust portion 110, and a current mirror circuit for supplying a current corresponding to a test current It to power supply nodes 43a and 43b in a test mode. The current mirror circuit has N-MOS transistors 120, 122, and P channel MOS (P-MOS) transistors 116, 124, 126a, 126b. In the present embodiment, it is assumed that the current mirror circuit supplies a current at the same level as test current It to power supply nodes 43a and 43b.

Current switches 102a and 102b are electrically coupled between power supply voltages Vcc (i.e., operating voltage sources) being operating power supply voltages of internal circuit groups 42a and 42b, and power supply nodes 43a and 43b, respectively. Current switches 102a and 102b are formed, e.g., of P-MOS transistors having their gates receiving control signals /CKE1 and /CKE2, respectively. Control signals /CKE1 and /CKE2 are activated to an L level during the operations of internal circuit groups 42a and 42b. Thus, control signals /CKE1 and /CKE2 are each inactivated to an H level in a standby mode and in a test mode.

Test current adjust portion 110 includes a resistor element 111 connected between a power supply voltage Vcc and a node N1, a resistor element 112 connected between node N1 and a ground voltage GND, a voltage comparator 113 which amplifies a voltage difference between nodes N1 and N2 to output to a node N3, a variable resistance circuit 115 connected between node N2 and ground voltage GND, and a P-MOS transistor 114. Transistor 114 is connected between power supply voltage Vcc and node N2. Transistor 114 has its gate connected to node N3.

A prescribed voltage Vr2 is generated in node N1 in accordance with resistance values R1 and R2 of resistor elements 111 and 112. Variable resistance circuit 115 has a configuration similar to that of variable resistance circuit 48 shown in FIG. 5, and receives adjustment signals TP0–TP3, instead of adjustment signals P0–P3, from BIST circuit 30. Thus, as in the case of variable resistance circuit 48, the resistance value Rt of variable resistance circuit 115 can be set in 16 steps in response to adjustment signals TP0–TP3.

In test current adjust portion 110, node N2 is virtually connected to node N1, and the voltage level of node N2 becomes equal to prescribed voltage Vr2. As a result, the test current It given by a current passing through transistor 114 and variable resistance circuit 115 is set to Vr2/Rt, based on prescribed voltage Vr2 and resistance value Rt of variable resistance circuit 115.

As such, test current adjust portion 110 can variably set test current It in 16 steps in response to adjustment signals TP0–TP3 from BIST circuit 30.

Transistor 116 is connected between power supply voltage Vcc and a node N4, and transistor 120 is connected between node N4 and ground voltage GND. Transistor 122 is connected between a node N5 and ground voltage GND. Transistor 116 has its gate connected to node N3, and transistors 120 and 122 have their gates both connected to node N4. Transistor 124 is connected between power supply voltage Vcc and node N5, and has its gate connected to node N5.

Transistor 126a is connected between power supply voltage Vcc and power supply node 43a, and transistor 126b is connected between power supply voltage Vcc and power supply node 43b. Transistors 126a and 126b have their gates both connected to node N5.

As a result, transistors 126a and 126b can supply test current It adjusted by test current adjust portion 110 to power supply nodes 43a and 43b, respectively. In a test mode, transistors 126a, 126b carry out the supply of test current It to power supply nodes 43a, 43b, with current switches 102a and 102b being in an off state.

At this time, test current It is set corresponding to specification limit (acceptable value) of leakage currents in internal circuit groups 42a and 42b. Accordingly, internal operating voltages Vin(a) and Vin(b) of power supply nodes 43a and 43b in the test mode will not become lower than a prescribed voltage Vrr that is determined by power supply voltage Vcc and on resistances of current transistors 126a and 126b, as long as the leakage currents in internal circuit groups 42a and 42b do not exceed the specification limit.

On the contrary, if the leakage currents in internal circuit groups 42a and 42b exceed the specification limit, internal operating voltage Vin(a) or Vin(b) will become lower than the prescribed voltage Vrr.

Thus, a voltage comparator 130 for comparing the voltage of node N6 with prescribed voltage Vrr and a switch 137 for selectively connecting node N6 to power supply nodes 43a and 43b are further provided, which are used in the test mode to determine whether the leakage currents in internal circuit groups 42a and 42b are greater than the specification limit by an output signal VLEAK from voltage comparator 130.

A latch circuit 135 is further provided to temporarily hold output signal VLEAK from voltage comparator 130. It can be configured such that output signal VLEAK held in latch circuit 135 is externally output as test output TOUT via test memory 35, like the voltage comparison signal VCMP shown in FIG. 4.

As described above, in the configuration according to the first embodiment, provision of leakage detecting circuit 45 permits evaluation of a leakage current in an internal circuit group, without a need to measure an internal current actually flowing inside the semiconductor device. As a result, the leakage current in the internal circuit can be evaluated with a simple configuration.

Second Embodiment

In the second embodiment, the configuration of a leakage current control circuit is described which is formed of a combination of the internal voltage control circuit and the leakage detecting circuit shown in the first embodiment and which has both functions to evaluate and adjust the leakage current.

Figure 10:
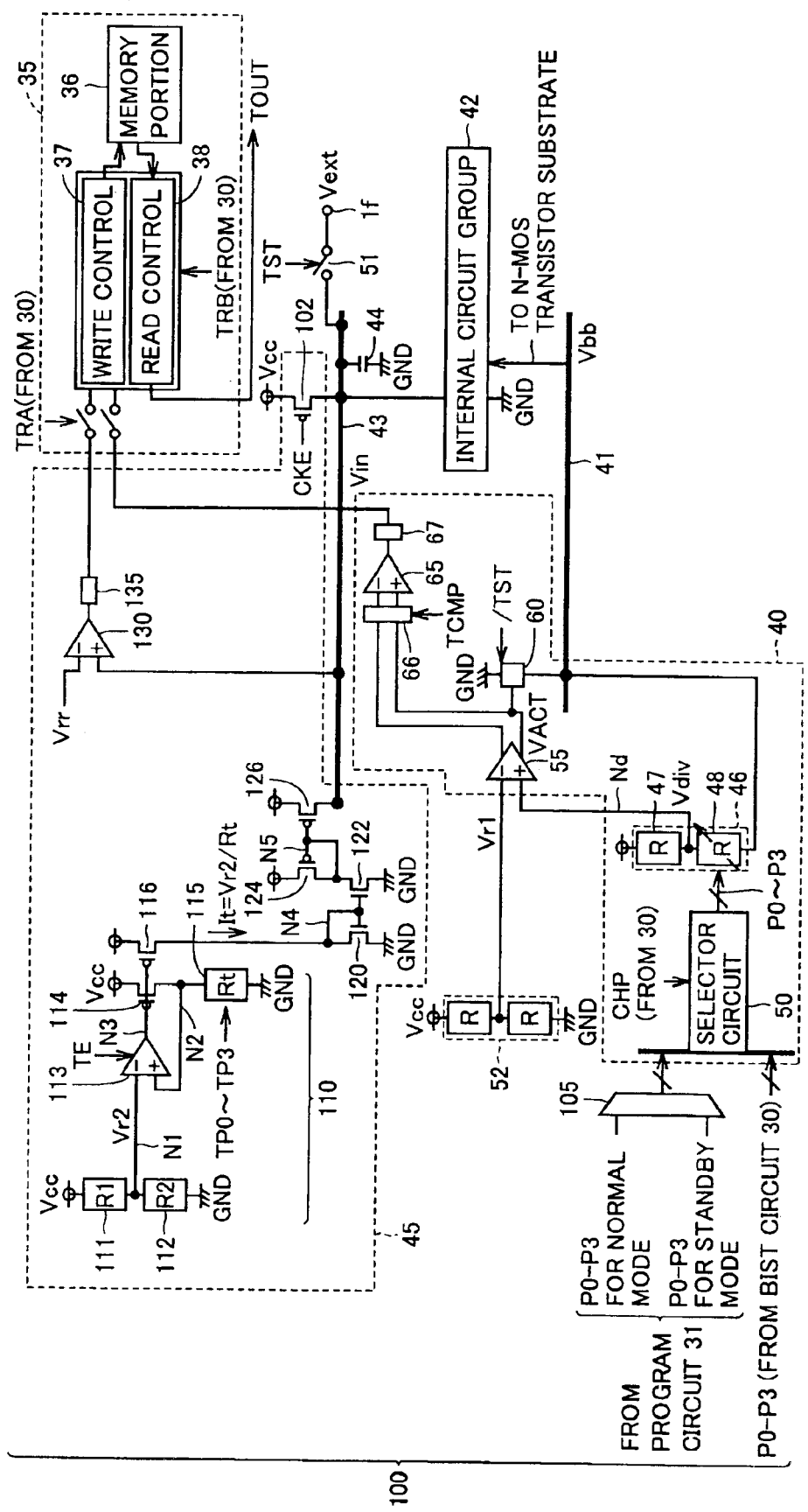
FIG. 10 is a circuit diagram showing a configuration of the leakage current control circuit according to a second embodiment of the present invention.

Referring to FIG. 10, the leakage current control circuit 100 according to the second embodiment includes internal voltage control circuit 40 shown in FIG. 4 and leakage detecting circuit 45 shown in FIG. 9.

Leakage detecting circuit 45 provides internal circuit group 42 with test current It adjustable in accordance with adjustment signals TP0–TP3 from BIST circuit 30, to determine whether the leakage current in internal circuit group 42 is greater than a specification value.

Internal voltage control circuit 40 responds to adjustment signals P0–P3 supplied from BIST circuit 30 or program circuit 31, and controls internal voltage Vbb which corresponds to the substrate voltage of the N-MOS transistor group constituting internal circuit group 42.

In a test mode, adjustment signals TP0–TP3 being applied to test current adjust portion 110 are set to correspond to the specification limit of the leakage current in internal circuit group 42. In this state, BIST circuit 30 sets adjustment signals P0–P3 to be given to internal voltage control circuit 40 in steps corresponding to respective adjustment levels "−8" to "+7" shown in FIG. 6.

At the respective adjustment level, internal voltage Vbb is set to a level corresponding to adjustment signals P0–P3. The leakage current in internal circuit group 42 also changes according to the level of the substrate voltage (internal voltage Vbb) of the N-MOS transistor group. Specifically, setting internal voltage Vbb to a deeper negative voltage permits reduction of the leakage current upon turn-off of the N-MOS transistor group, thereby decreasing the leakage current in internal circuit group 42.

As a result, desired adjustment signals P0–P3 for setting internal voltage Vbb such that the leakage current in internal circuit group 42 does not exceed the specification limit, can be obtained in the test mode. The desired adjustment signals P0–P3 can be read to the outside of the semiconductor device as test output TOUT, via test memory 35 described in conjunction with FIG. 7.

Program input PRGIN based on an analysis of test output TOUT thus obtained in the test mode is applied to pin 1g, so that adjustment signals P0–P3 for use in a standby mode of the actual operation are programmed in program circuit 31. As a result, in the standby mode of the actual operation, leakage current control circuit 100 can control internal voltage Vbb in accordance with the programmed adjustment signals P0–P3, to restrict the leakage current in internal circuit group 42 not to exceed the specification limit (acceptable value).

On the other hand, in a normal mode of the actual operation, each N-MOS transistor in internal circuit group 42 needs to drive a sufficient current to carry out a prescribed operation. Thus, it is preferable that adjustment signals P0–P3 for setting a level of internal voltage Vbb are set separately for the standby mode and for the normal mode. Adjust signals P0–P3 for the normal mode can also be obtained in the test mode from another operation test. As a result, program circuit 31 stores respective adjustment signals P0–P3 for the standby mode and for the normal mode.

A selector 105 is further provided between program circuit 31 and internal voltage control circuit 40. Selector 105 responds to test control signal TST, and transmits either the adjustment signals P0–P3 for the normal mode or those for the standby mode to the internal voltage control circuit. As already described, selector circuit 50 in internal voltage control circuit 40 responds to switch signal CHP indicating whether it is in a test mode or in an actual operation mode (including the normal mode and the standby mode), and selectively transmits the adjustment signals P0–P3 having been transmitted from program circuit 31 and from BIST circuit 30 to variable resistance circuit 48. As a result, internal voltage Vbb is set to a proper level designed based on the operation test results, in each of the standby mode and the normal mode.

With such a configuration, not only the evaluation of the leakage current in the internal circuit group as in the first embodiment, but also the circuit adjustment for setting the leakage current to a level not greater than a specification limit (acceptable value), becomes possible with a simple circuit configuration.

Figure 11:
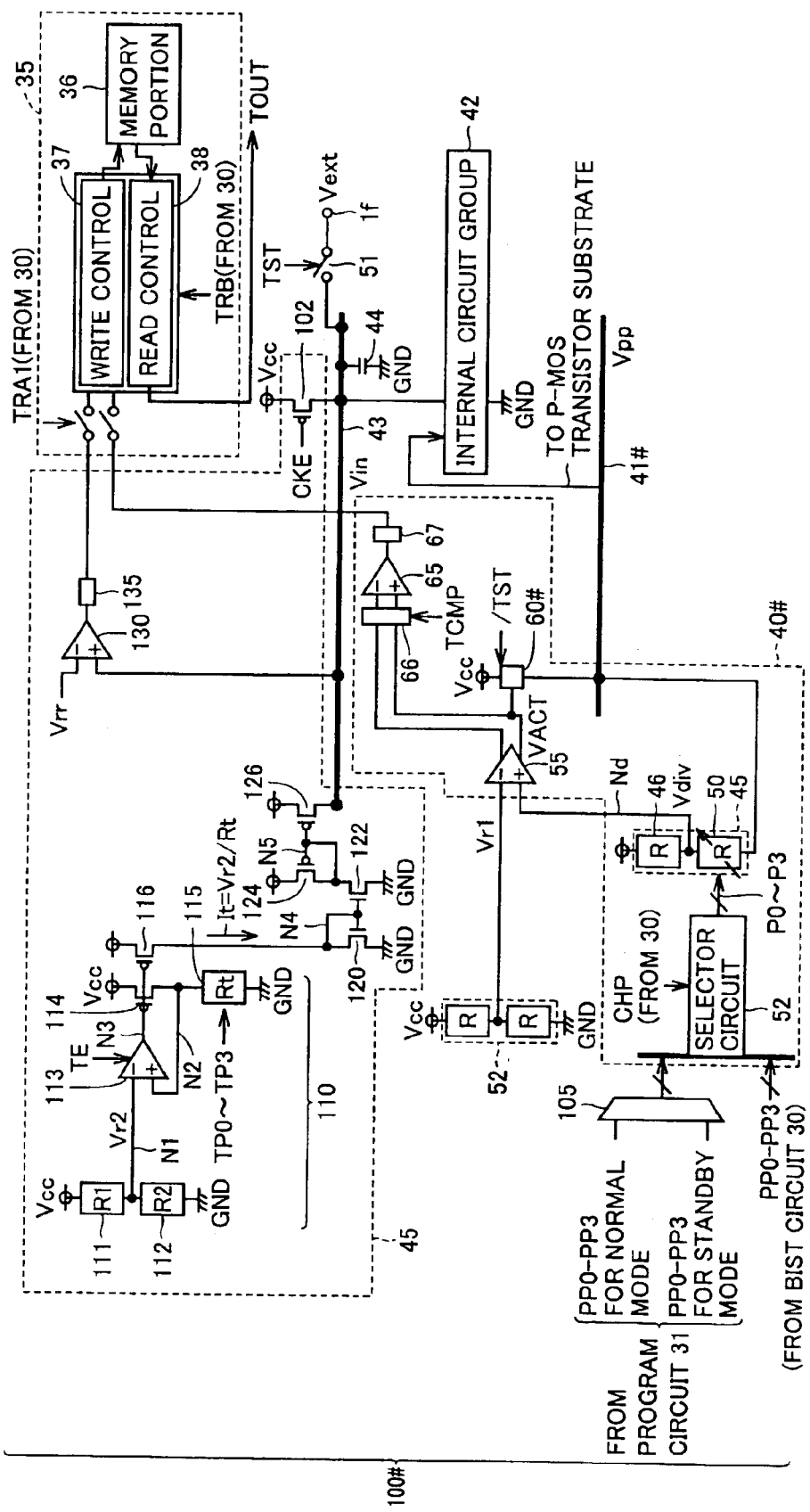
FIG. 11 is a circuit diagram showing another configuration of the leakage current control circuit according to the second embodiment.

In addition, a substrate voltage of each of P-MOS transistors in internal circuit group 42 can be controlled by a leakage current control circuit according to the second embodiment, as shown in FIG. 11.

Referring to FIG. 11, the leakage current control circuit 100# differs in configuration from leakage current control circuit 100 shown in FIG. 10 in that it includes an internal voltage control circuit 40# instead of internal voltage control circuit 40.

Internal voltage control circuit 40# responds to adjustment signals PP0–PP3 supplied from BIST circuit 30 or from program circuit 31, and controls internal voltage Vpp that corresponds to the substrate voltage of the P-MOS transistor group constituting internal circuit group 42. That is, internal voltage Vpp is a positive voltage. Internal voltage Vpp is applied to the P-MOS transistors via an internal voltage interconnection 41#.

As such, internal voltage control circuit 40# differs from internal voltage control circuit 40 in that it includes a charge supply circuit 160 for supplying positive charges to internal voltage interconnection 41# instead of voltage generating circuit 60 supplying negative charges. Otherwise, the basic configuration and operation of internal voltage control circuit 40# are identical to those of internal voltage control circuit 40, and thus, detailed description thereof is not repeated.

Modification of Second Embodiment

Figure 12:
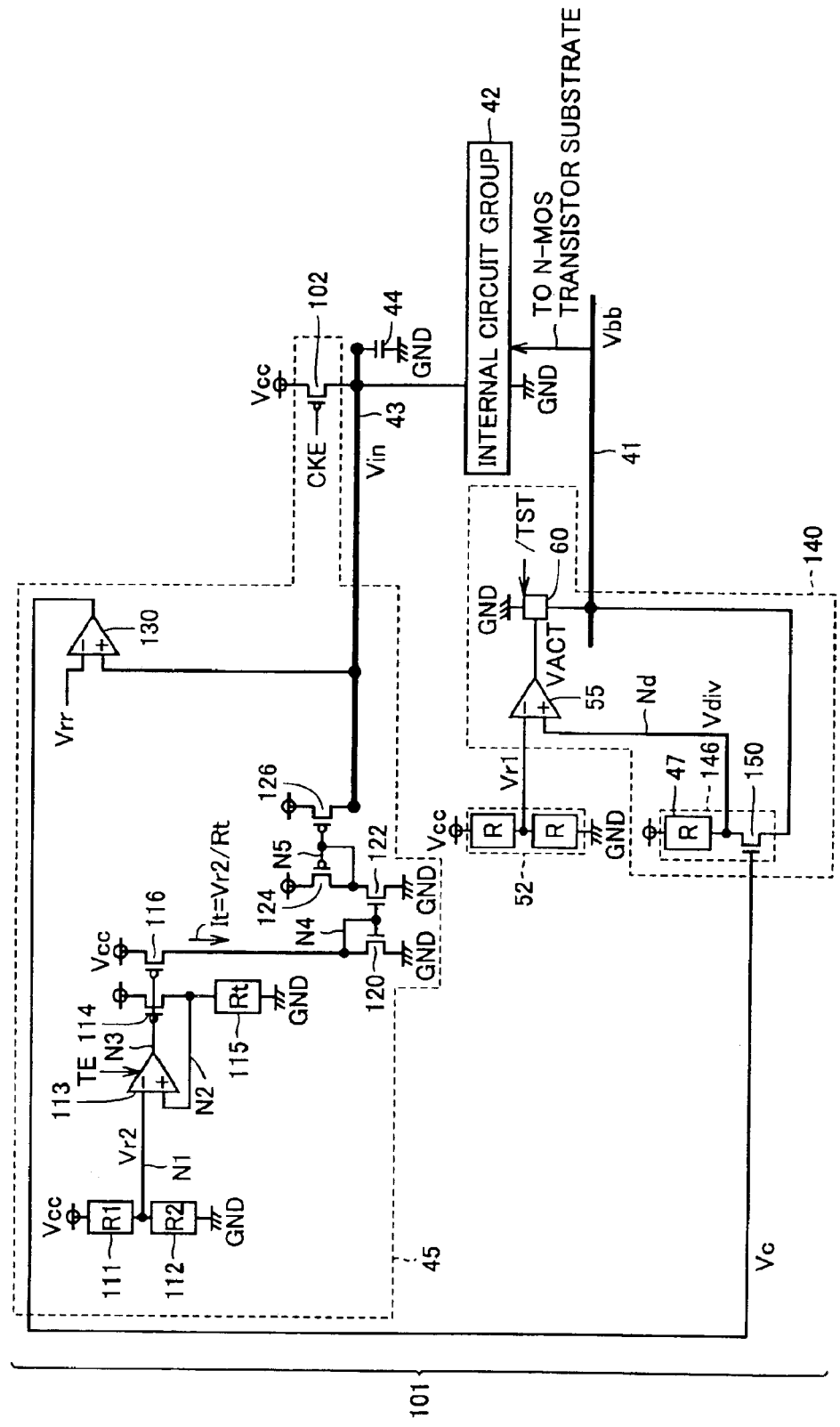
FIG. 12 is a circuit diagram showing a configuration of the leakage current control circuit according to a modification of the second embodiment.

Referring to FIG. 12, the leakage current control circuit 101 according to a modification of the second embodiment differs from leakage current control circuit 100 shown in FIG. 10 in that it includes an internal voltage control circuit 140 instead of internal voltage control circuit 40.

Internal voltage control circuit 140 includes, in place of voltage-divider circuit 46 having a divide ratio adjusted according to adjustment signals P0–P3, a voltage-divider circuit 146 having a divide ratio adjusted in accordance with a detected result in leakage detecting circuit 45.

Voltage-divider circuit 146 has a fixed resistance circuit 47 connected between power supply voltage Vcc and node Nd, and a transistor 150 connected between node Nd and internal voltage interconnection 41. Transistor 150 has its gate receiving a control voltage Vc output from voltage comparator 130 in leakage detecting circuit 45.

As a result, transistor 150 functions as a variable resistance having an electric resistance that changes according to control voltage Vc. As already described, control voltage Vc is set in accordance with a comparison result between a voltage of power supply node 43 of internal circuit group 42 and a prescribed voltage Vrr. Thus, the divide ratio K of voltage-divider circuit 146 also changes according to an evaluation result of the leakage current in internal circuit group 42.

Specifically, when the leakage current in internal circuit group 42 is greater than the specification limit, control voltage Vc also increases. As the resistance value of transistor 150 increases, voltage divider circuit 146 attempts to lower the set value of internal voltage Vbb (to the negative voltage side). Correspondingly, the substrate voltage of the N-MOS transistor in internal circuit group 42 becomes a deeper negative voltage, so that the leakage current decreases. With the feedback loop thus configured, internal voltage Vbb on internal voltage interconnection 41, i.e., the substrate voltage applied to the N-MOS transistor in internal circuit group 42, converges to a level where the leakage current in internal circuit group 42 becomes not greater than the specification value.

That is, leakage current control circuit 101 is provided to control the leakage current of the semiconductor device in a standby mode. It forms a feedback control loop of internal voltage Vbb (substrate voltage), based on the detection result of leakage detecting circuit 45. Thus, unlike the leakage current control circuit 100, leakage current control circuit 101 is unprovided with configurations associated with the setting of adjustment signals P0–P3 and the operation test. Otherwise, leakage current control circuit 101 has a configuration identical to that of leakage current control circuit 100 shown in FIG. 10, and thus, detailed description thereof is not repeated.

As described above, in the leakage current control circuit according to the modification of the second embodiment, an automatic control loop can be formed in a standby mode of the semiconductor device to control the leakage current in the internal circuit not to exceed a specification limit.

Figure 13:
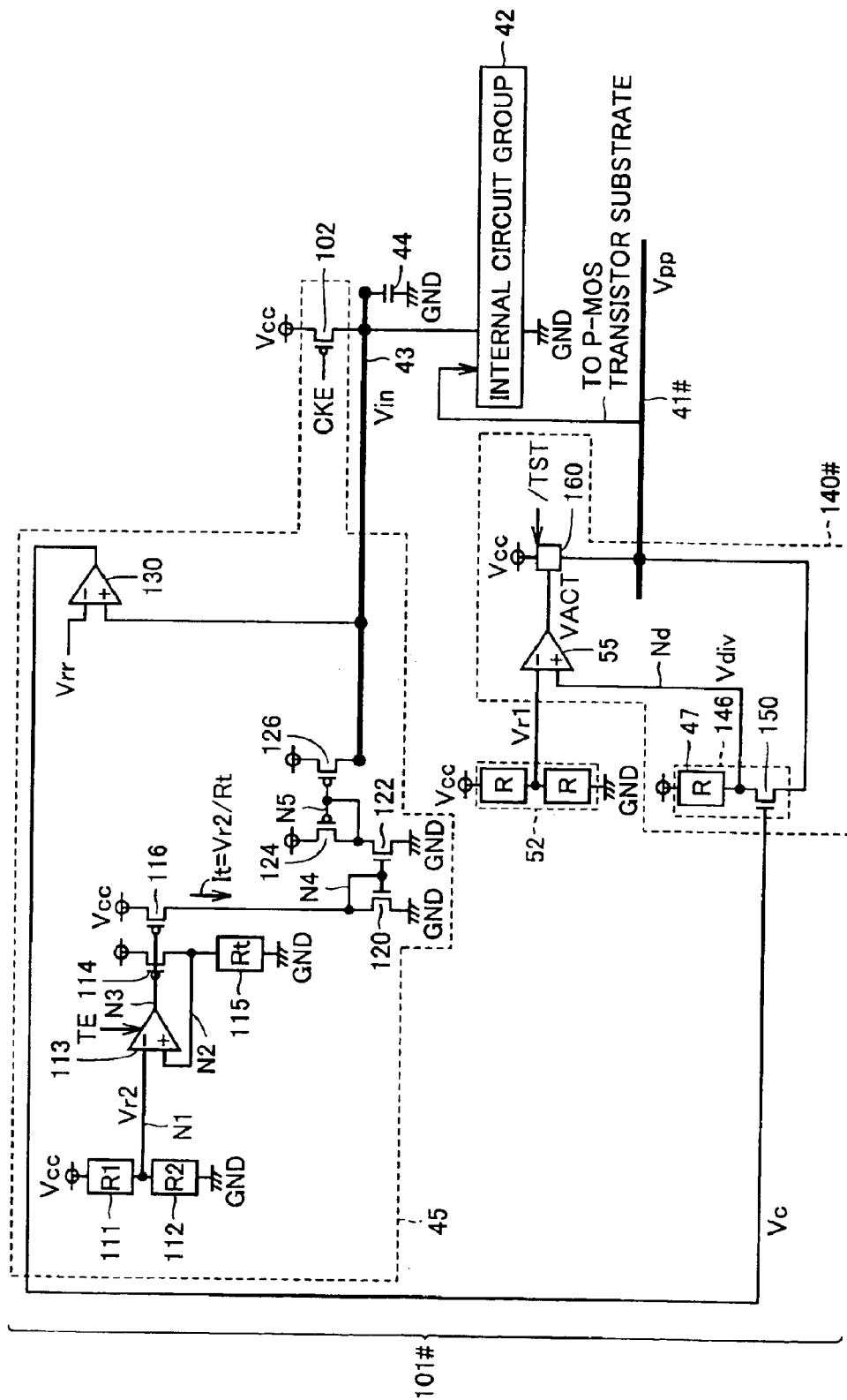
FIG. 13 is a circuit diagram showing another configuration of the leakage current control circuit according to the modification of the second embodiment.

In addition, the leakage current control circuit according to the modification of the second embodiment can control the substrate voltage of the P-MOS transistor within internal circuit group 42, as shown in FIG. 13.

Referring to FIG. 13, the leakage current control circuit 101# differs from leakage current control circuit 101 shown in FIG. 12 in that it includes an internal voltage control circuit 140# instead of internal voltage control circuit 140.

Internal voltage control circuit 140# responds to the detected result in leakage detecting circuit 45, and controls internal voltage Vpp on internal voltage interconnection 41#. As already described, internal voltage Vpp is applied to the P-MOS transistor group constituting internal circuit group 42 as the substrate voltage.

Thus, internal voltage control circuit 140# differs from internal voltage control circuit 140 in that it includes a voltage supply circuit 160 for supplying positive charges to internal voltage interconnection 41# instead of voltage generating circuit 60 supplying negative charges. Otherwise, internal voltage control circuit 140# is identical in configuration and basic operation to internal voltage control circuit 140, and thus, detailed description thereof is not repeated.

In the first and second embodiments above, the configurations for controlling the substrate voltage being applied to N-MOS or P-MOS transistors constituting the internal circuit group have been described. However, the internal voltage control circuit and the leakage current control circuit are commonly applicable to control of any voltages applied to the MOS transistors. That is, the internal voltage control circuit and the leakage current control circuit shown in the first and second embodiments can also be employed to similarly control voltages being applied to the gates and sources of the MOS transistor group included in the internal circuit, and accordingly, similar control of the leakage current becomes possible by sufficiently reverse-biasing the turned-off MOS transistor group.

Third Embodiment

In the third embodiment, a configuration for adjusting a data write current level in an MRAM device employing the internal voltage control circuit explained in the first embodiment, is described.

Figure 14:
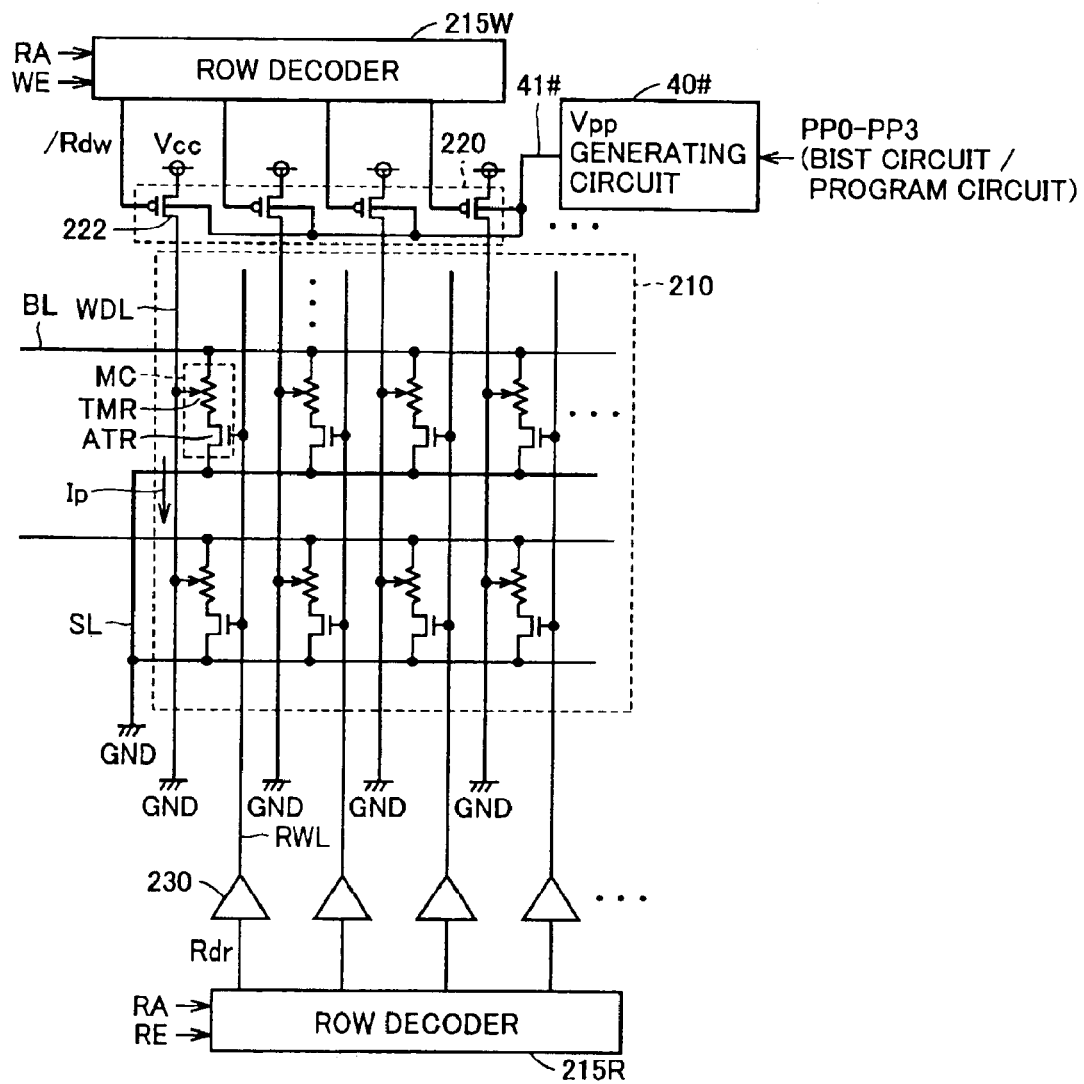
FIG. 14 is a first diagram showing a configuration of the MRAM device according to a third embodiment of the present invention.

FIG. 14 is a first diagram showing a configuration associated with data write of the MRAM device according to the third embodiment.

Referring to FIG. 14, the MRAM device according to the third embodiment is provided with a memory cell array 210, row decoders 215W, 215R, a write digit line drive circuit 220, a word line driver 230, and a Vpp generating circuit 40#.

Memory cell array 210 has a plurality of MTJ memory cells MC arranged in rows and columns. Here, the configuration and data principle of the MTJ memory cell are described.

Figure 15:
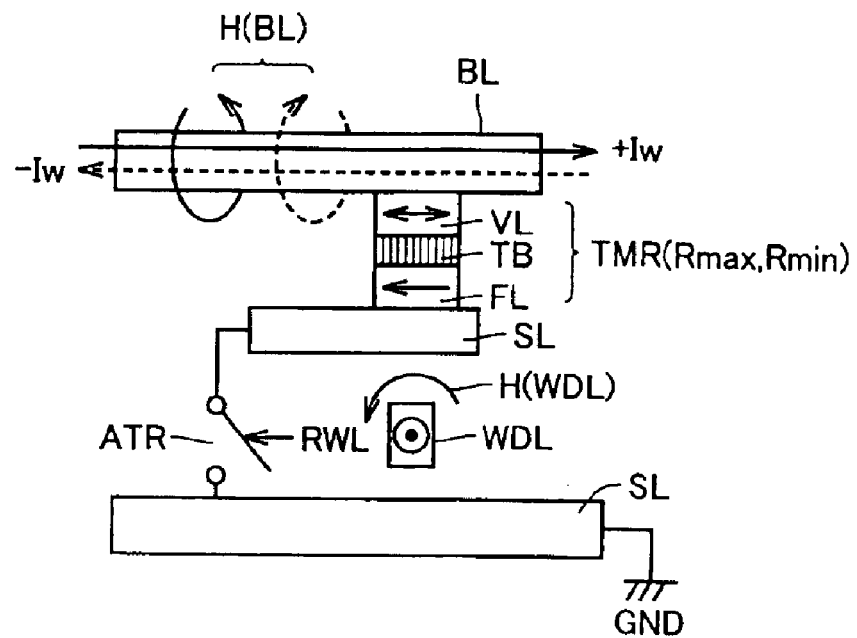
FIG. 15 is a conceptual diagram illustrating the structure and data storing principle of an MTJ memory cell.

FIG. 15 is a conceptual diagram illustrating the structure and the data storage principle of the MTJ memory cell.

Referring to FIG. 15, a tunneling magneto-resistance element TMR has a ferromagnetic material layer having a fixed, constant magnetization direction (hereinafter, also simply referred to as the "fixed magnetic layer") FL, and a ferromagnetic material layer which can be magnetized in a direction according to an externally applied magnetic field (hereinafter, also simply referred to as the "free magnetic layer") VL. A tunneling barrier (tunneling film) TB of an insulator film is provided between fixed magnetic layer FL and free magnetic layer VL. Free magnetic layer VL is magnetized in the same or opposite direction with respect to fixed magnetic layer FL, in accordance with a level of stored data being written. Fixed magnetic layer FL, tunneling barrier TB and free magnetic layer VL form a magnetic tunnel junction.

The electric resistance of tunneling magneto-resistance element TMR changes according to a relation between the magnetization directions of fixed magnetic layer FL and free magnetic layer VL. Specifically, the electric resistance of tunneling magneto-resistance element TMR becomes a minimal value Rmin when fixed magnetic layer FL and free magnetic layer VL have the same (parallel) magnetization directions, and it becomes a maximal value Rmax when they have the opposite (anti-parallel) magnetization directions.

At the time of data write, a read word line RWL is inactivated, and an access transistor ATR is turned off. In this state, data write magnetic fields H(BL) and H(WDL) for magnetization of free magnetic layer VL are generated by data write currents passing through a bit line BL and a write digit line WDL, respectively. In particular, the data write current on bit line BL flows in a direction of either +Iw or −Iw in accordance with a level of data to be written.

Figure 16:
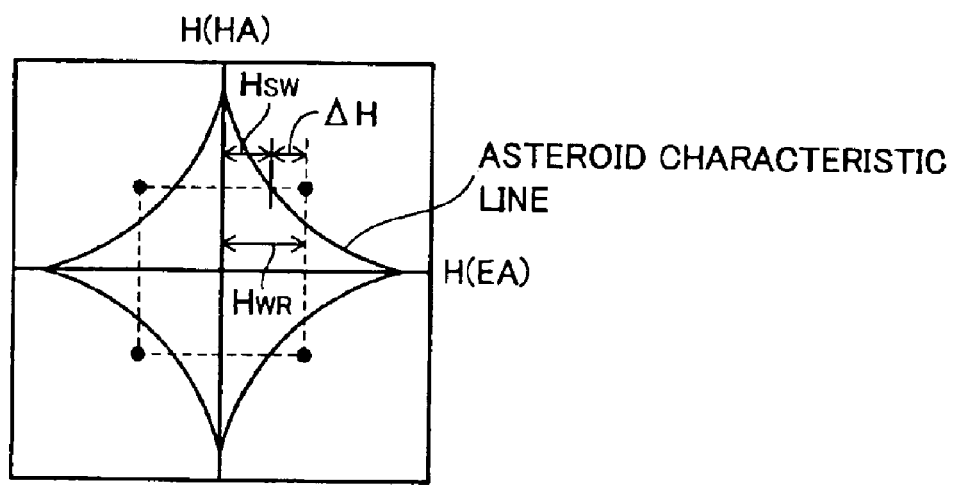
FIG. 16 is a conceptual diagram illustrating a relation between a data write current of the MTJ memory cell and a magnetization direction of the tunneling magneto-resistance element.

FIG. 16 is a conceptual diagram illustrating a relation between the data write current of the MTJ memory cell and the magnetization direction of the tunneling magneto-resistance element.

Referring to FIG. 16, the horizontal axis H(EA) represents a magnetic field being applied to free magnetic layer VL in tunneling magneto-resistance element TMR in an easy-to-magnetize axis (EA: Easy Axis) direction. The vertical axis H(HA) represents a magnetic field which acts on free magnetic layer VL in a hard-to-magnetize axis (HA: Hard Axis) direction. Magnetic fields H(EA) and H(HA) correspond to respective data write magnetic fields H(BL) and H(WDL) shown in FIG. 15.

In the MTJ memory cell, the fixed magnetization direction of fixed magnetic layer FL is along the easy axis of free magnetic layer VL. Free magnetic layer VL is magnetized along the easy axis direction, parallel or anti-parallel (opposite) to the magnetization direction of fixed magnetic layer FL, in accordance with the level of the stored data. The MTJ memory cell can store data of one bit, correlated with the two magnetization directions of free magnetic layer VL.

The magnetization direction of free magnetic layer VL can be rewritten only in the case where a sum of applied magnetic fields H(EA) and H(HA) reaches a region outside the asteroid characteristic line shown in FIG. 16. That is, the magnetization direction of free magnetic layer Vt would not change when the data write magnetic fields applied have intensity that falls into the region inside the asteroid characteristic line.

As seen from the asteroid characteristic line, a magnetization threshold value necessary to cause a change in magnetization direction of free magnetic layer VL along the easy axis can be lowered by applying to free magnetic layer VL the magnetic field in the hard axis direction. As shown in FIG. 16, an operating point at the time of data write is set such that the stored data in the MTJ memory cell, i.e., the magnetization direction of tunneling magneto-resistance element TMR, can be rewritten when prescribed data write currents are passed through both write digit line WDL and bit line BL.

With the operating point shown by way of example in FIG. 16, in the MTJ memory cell as a target of data write, the data write magnetic field in the easy axis direction is set to have an intensity of $H_{WR}$. That is, the data write current value passed through bit line BL or write digit line WDL is set to obtain the data write magnetic field HwR. In general, data write magnetic field $H_{WR}$ is represented as a sum of a switching magnetic field $H_{SW}$ necessary for switching of the magnetization directions and a margin $\Delta H$, i.e., $H_{WR}=H_{SW}+\Delta H$.

The magnetization direction once written into tunneling magneto-resistance element TMR, i.e., the stored data in the MTJ memory cell, is held in a non-volatile manner until data write is newly performed. Although the electric resistance of each memory cell exactly corresponds to a sum of the resistance of tunneling magneto-resistance element TMR, an on resistance of access transistor ATR and other parasitic resistances, the resistance values other than that of tunneling magneto-resistance element TMR are constant irrelevant to stored data. Thus, hereinafter, the two kinds of electric resistances of a normal memory cell in accordance with stored data are also represented as Rmax and Rmin, and a difference therebetween is represented as $\Delta R$ (i.e., $\Delta R=Rmax-Rim$).

Referring again to FIG. 14, in memory cell array 210, read word lines RWL and write digit lines WDL are arranged corresponding to respective rows of MTJ memory cells MC, and bit lines BL are arranged corresponding to respective columns of MTJ memory cells MC. Each MTJ memory cell MC has a tunneling magneto-resistance element TMR and an access transistor ATR connected in series between corresponding bit line BL and a source voltage line SL. Access transistor ATR is typically formed of an N-MOS transistor, which has its gate connected to corresponding read word line RWL. Source voltage line SL connected to a source of every access transistor ATR supplies a ground voltage GND.

Row decoder 215W generates a row decode signal /Rdw for each memory cell row, based on a row address RA indicated by an input address. At the time of data write, row decoder 215W activates row decode signal /Rdw of a selected memory cell row (hereinafter, also referred to as the "selected row") to an L level, and inactivates row decode signals /Rdw of the remaining memory cell rows (hereinafter, also referred to as the "non-selected rows") to an H level. During a period other than the data write, row decoder 215W inactivates every row decode signal /Rdw to an H level.

Write digit line drive circuit 220 has driver transistors 222 each connected between one end of respective write digit line WDL and power supply voltage Vcc. Driver transistor 222 is formed of a P-MOS transistor having its gate receiving row decode signal /Rdw of a corresponding memory cell row. The other end of each write digit line WDL is connected to ground voltage GND irrelevant to a row select result.

Thus, in a selected row at the time of data write, corresponding driver transistor 222 turns on in response to activation (to an L level) of row decode signal /Rdw, and a data write current Ip flows through write digit line WDL of the selected row in a direction from write digit line drive circuit 220 toward ground voltage GND. This data write current Ip applies a data write magnetic field to MTJ memory cell MC along the hard axis (HA).

Vpp generating circuit 40# controls internal voltage Vpp being applied as a substrate voltage to driver transistor 222 which is a P-MOS transistor. Internal voltage Vpp is transmitted via internal voltage interconnection 41#. Vpp generating circuit 40# has the same configuration as internal voltage control circuit 40# shown in FIG. 11, and thus, detailed description thereof is not repeated. Specifically, Vpp generating circuit 40# can set internal voltage Vpp in steps, in accordance with adjustment signals PP0–PP3 that are supplied from the BIST circuit in a test mode and from the program circuit in an actual operation.

Figure 17:
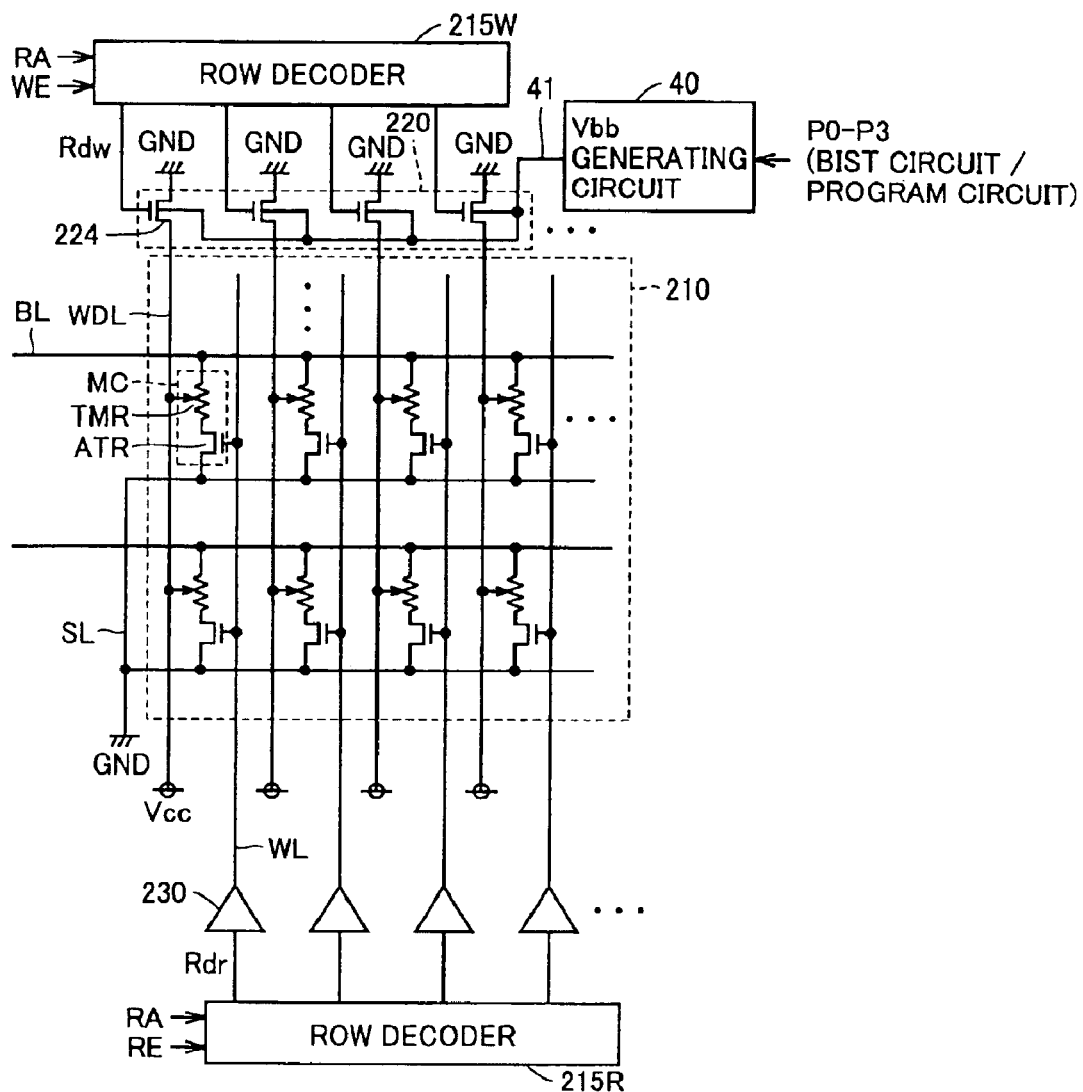
FIG. 17 is a second diagram showing the configuration of the MRAM device according to the third embodiment.

Alternatively, as shown in FIG. 17, write digit line drive circuit 220 may be configured with driver transistors 224 each formed of an N-MOS transistor that is connected between an end of respective write digit line WDL and ground voltage GND.

In this case, the gate of each driver transistor 224 receives a row decode signal Rdw having an inverse level of row decode signal /Rdw shown in FIG. 14. That is, row decode signal Rdw is activated to an H level in a selected row at the time of data write, and otherwise inactivated to an L level.

Vbb generating circuit 40 controls internal voltage Vbb that is applied to driver transistor 224 being an N-MOS transistor as a substrate voltage. Internal voltage Vbb is transmitted via internal voltage interconnection 41. The configuration of Vbb generating circuit 40 is identical to that of internal voltage control circuit 40 shown in FIG. 4, and thus, detailed description thereof is not repeated. Specifically, Vbb generating circuit 40 can set internal voltage Vbb stepwise, in accordance with adjustment signals P0–P3 provided from the BIST circuit in a test mode and from the program circuit in an actual operation.

With such a configuration, it is possible to change the threshold voltages of driver transistors 222, 224 and hence adjust their current driving capabilities, by controlling internal voltages Vbb, Vpp in accordance with adjustment signals P0–P3, PP0–PP3. Accordingly, adjustment of the level of data write current Ip, and fine adjustment of the intensity of the data write magnetic field in the hard axis direction, become possible.

Now, the configurations for supplying a data write current to bit line BL and for reading data are described with reference to FIG. 18.

Figure 18:
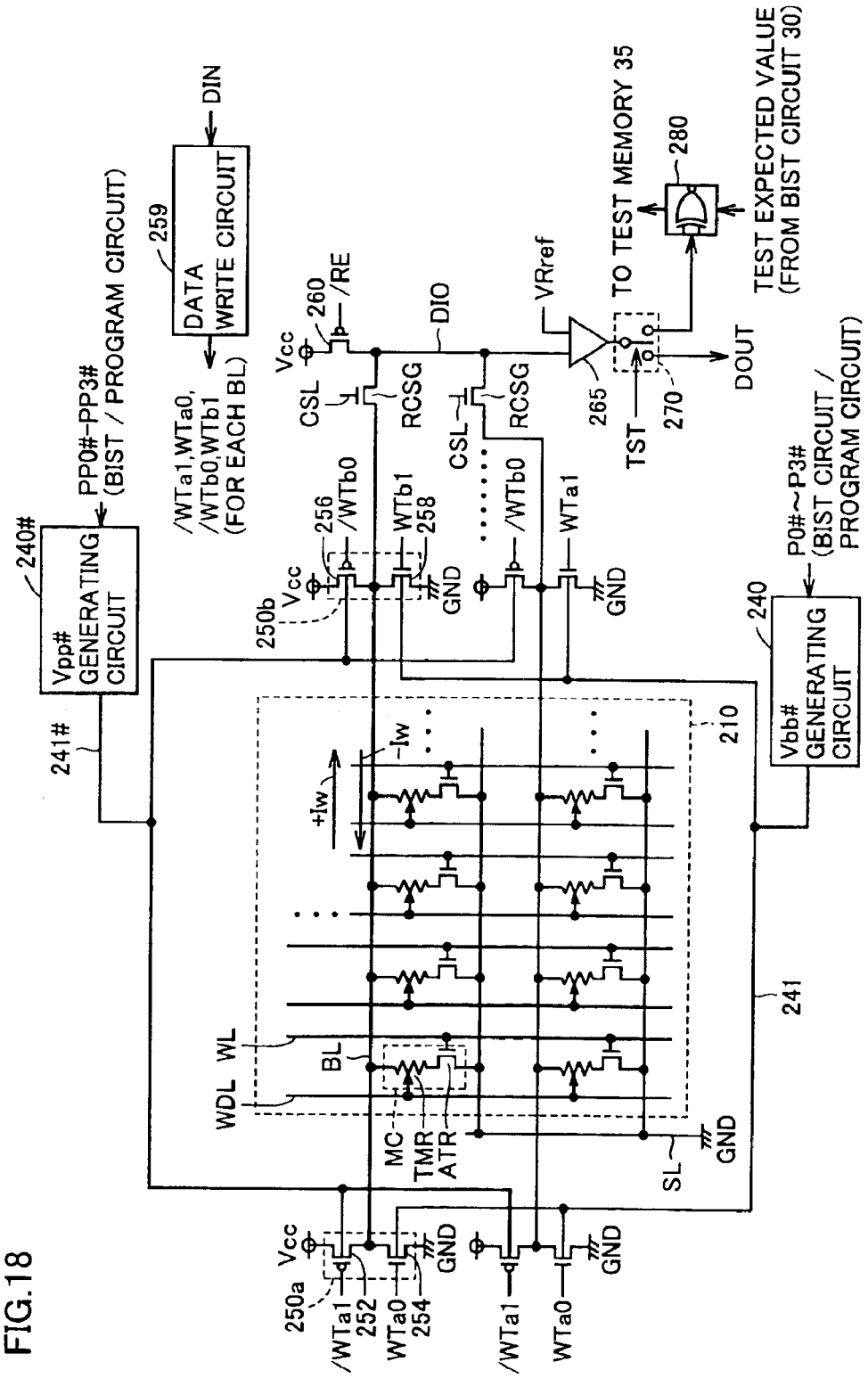
FIG. 18 is a third diagram showing the configuration of the MRAM device according to the third embodiment.

Referring to FIG. 18, the MRAM device according to the third embodiment is further provided with bit line drivers 250a, 250b provided corresponding to each memory cell column, and a data write circuit 251.

Bit line driver 250a has driver transistors 252 and 254 which are connected between one end of corresponding bit line BL and power supply voltage Vcc and ground voltage GND, respectively. Similarly, bit line driver 250b has driver transistors 256 and 258 which are connected between the other end of corresponding bit line BL and power supply voltage Vcc and ground voltage GND, respectively. Driver transistors 252, 256 are each formed of a P-MOS transistor, and driver transistors 254, 258 are each formed of an N-MOS transistor.

Driver transistors 252 and 254 have their gates receiving write control signals /WTa1 and WTa0, respectively, and driver transistors 256 and 258 have their gates receiving write control signals /WTb0 and WTb1, respectively.

In each memory cell column, bit line driver 250a responds to write control signals /WTa0 and WTa1, and drives the one end of corresponding bit line BL to either power supply voltage Vcc or ground voltage GND, or disconnects the same from both of them to cause a floating state. Similarly, bit line driver 250b drives the other end of corresponding bit line BL to either power supply voltage Vcc or ground voltage GND, or none of them to cause a floating state, in accordance with write control signals /WTb0 and WTb1. Each bit line BL in the floating state is precharged to a fixed voltage as necessary, by a precharge circuit (not shown).

Data write circuit 251 controls write control signals /WTa1, WTa0, /WTb0, WTb1 in each memory cell column, in accordance with written data DIN and a column select result. Write control signals /WTa1, WTa0, /WTb0, WTb1 are set such that data write current +Iw or −Iw flows through bit line BL of a selected column in a direction in accordance with written data DIN. Hereinafter, data write currents +Iw and −Iw on bit line BL flowing in different directions are also collectively represented as data write current ±Iw.

During a period other than data write, data write circuit 251 sets write control signals /WTa1, /WTb0 to an H level and write control signals WTa0, WTb1 to an L level in each memory cell column. Thus, every bit line BL is set to a floating state during the period other than the data write.

Further, data write circuit 251 sets each of write control signals /WTa1, WTa0, /WTb0, WTb1 corresponding to a non-selected memory cell column at the time of data write, to an H level. Thus, bit line BL of a non-selected column at the time of data write has its both ends connected to ground voltage GND to prevent a flow of an unintended current.

By comparison, data write circuit 251 sets levels of write control signals /WTa1, WTa0, /WTb0, WTb1 corresponding to a selected memory cell column at the time of data write, in accordance with written data DIN.

Specifically, when written data DIN is at an H level, write control signals /WTa1 and WTa0 are set to an L level, and write control signals /WTb0 and WTb1 are set to an H level. Thus, data write current +Iw flows through bit line BL of the selected column in a direction from bit line driver 250a to bit line driver 250b.

On the other hand when written data DIN is at an L level, write control signals /WTa1 and WTa0 are set to an H level, and write control signals /WTb0 and WTb1 are set to an L level. Thus, data write current −Iw flows through bit line BL of the selected column in a direction from bit line driver 250b to bit line driver 250a. Alternatively, the drive voltages of bit line drivers 250a, 250b may be set to any arbitrary voltages other than ground voltage GND and power supply voltage Vcc.

Data write current ±Iw applies a data write magnetic field to MTJ memory cell MC along the easy axis (EA). In MTJ memory cell MC having its corresponding write digit line WDL and bit line BL through both of which the data write currents flow, data to be written is magnetically written in accordance with the direction of data write current ±Iw on bit line BL.

Vpp# generating circuit 240# controls internal voltage Vpp# being applied as a substrate voltage to driver transistors 252 and 256 formed of P-MOS transistors. Internal voltage Vpp# is transmitted via internal voltage interconnection 241#. The configuration of Vpp generating circuit 240# is identical to that of internal voltage control circuit 40# shown in FIG. 11, and thus, detailed description thereof is not repeated. Specifically, Vpp# generating circuit 240# can set internal voltage Vpp# stepwise, in accordance with adjustment signals PP0#–PP3# provided from the BIST circuit in a test mode and from the program circuit in an actual operation.

Similarly, Vbb# generating circuit 240 controls internal voltage Vbb# being applied as a substrate voltage to driver transistors 254 and 258 formed of N-MOS transistors. Internal voltage Vbb is transmitted via internal voltage interconnection 41. Vbb# generating circuit 240 has a configuration identical to that of internal voltage generating circuit 40 shown in FIG. 4, and thus, detailed description thereof is not repeated. Specifically, Vbb# generating circuit 240 can set internal voltage Vbb# in steps, in accordance with adjustment signals P0#–P3# provided from the BIST circuit in a test mode and from the program circuit in an actual operation.

With such a configuration, controlling internal voltages Vbb#, Vpp# in accordance with adjustment signals P0#–P3#, PP0#–PP3# makes it possible to change threshold voltages of driver transistors 252, 254, 256, 258 and hence to adjust their current driving capabilities. Accordingly, adjustment of the level of data write current ±Iw, and fine adjustment of the intensity of the data write magnetic field in the easy axis direction, become possible. Further, separate settings of adjustment signals P0–P3, PP0–PP3 and P0#–P3#, PP0#–PP3# permit adjustment of the intensities of the data write magnetic fields in the hard axis direction and in the easy axis direction independently from each other.

Now, the configuration associated with data read is described.

Referring again to FIG. 14, row decoder 215R generates row decode signals Rdr for respective memory cell rows based on row addresses RA. At the time of data read, row decoder 215R activates row decode signal Rdr of a selected row to an H level, and inactivates row decode signal Rdr of a non-selected row to an L level. During a period other than the data read, row decoder 215R inactivates every row decode signal Rdr to an L level.

Thus, at the time of data read, read word line RWL of a selected row is activated to an H level, and read word line RWL of a non-selected row is inactivated to an L level, in accordance with row decode signals Rdr. On the other hand, during a period other than data write, every read word line RWL is inactivated to an L level. As a result, at the time of data read, access transistors ATR turn on in the memory cells in the selected row, and every bit line BL is pulled down to ground voltage GND via tunneling magneto-resistance element TMR of corresponding MTJ memory cell MC.

Referring again to FIG. 18, a read select gate RCSG is provided between each bit line BL and a data line DIO. Read select gate RCSG turns on or off in response to a corresponding column select line CSL. Column select line CSL is activated to an H level in a selected column at the time of data read, and otherwise inactivated to an L level.

Thus, at the time of data read, data line DIO is pulled down to ground voltage GND via read select gate RCSG, bit line BL of a selected column, and tunneling magneto-resistance element TMR in a selected memory cell. In this state, data line DIO is pulled up to power supply voltage Vcc by a current supply transistor 260 which turns on at the time of data read. Current supply transistor 260 is formed, e.g., of a P-MOS transistor, which is connected between power supply voltage Vcc and data line DIO and has its gate receiving a control signal /RE. Control signal /RE is activated to an L level for a prescribed time period during the data read.

As a result, at the time of data read, a voltage occurs on data line DIO in accordance with an electric resistance (i.e., stored data) of a selected memory cell. Thus, the stored data of the selected memory cell can be read out by data read circuit 265, by comparison between the voltage of data line DIO and a read reference voltage VRref. Read reference voltage VRref is set to an intermediate level between the voltage of data line DIO in the case where it is connected to a selected memory cell having its stored data corresponding to electric resistance Rmin, and the voltage of data line DIO in the case where it is connected to a selected memory cell having its stored data corresponding to electric resistance Rmax.

A switch circuit 270 is arranged at a succeeding stage of data read circuit 265. Switch circuit 270, during a period other than a test mode, transmits an output signal of data read circuit 265 to a path through which output data DOUT is output to the outside of the MRAM device. By comparison, in the test mode, switch circuit 270 transmits the output of data read circuit 265 to a data comparison circuit 280 in response to test control signal TST.

Data comparison circuit 280 has a function to compare a test expected value provided from BIST circuit 30 with read data from a selected memory cell in the test mode. Data comparison circuit 280 is formed, e.g., of an exclusive NOR gate. Alternatively, data comparison circuit 280 may be configured to have a function to latch a plurality of bits of the output signal of data read circuit 265. In such a case, it can perform the comparison between the test expected value and the read data in the test mode for the relevant plurality of bits. An output of data comparison circuit 280 is transmitted to test memory 35.

In the test mode, in order to evaluate data write characteristics, data write currents Ip, ±Iw for test write of data of a prescribed level are supplied to write digit line(s) WDL and bit line(s) BL corresponding to at least some of the memory cells within memory cell array 210.

Thereafter, data are read out of MTJ memory cell MC having been the target of the test write, and evaluation as to whether data of the prescribed level has been written or not is made based on the output of data comparison circuit 280. This permits evaluation as to whether the data write magnetic field has an appropriate intensity, i.e., whether data write currents Ip, ±Iw are at proper levels. If the levels of data write currents Ip, ±Iw are too low, the data write operation becomes unstable. If they are too high, power consumption increases. Therefore, in the MRAM device, it is important to adjust the data write currents to appropriate levels with high precision.

Figure 19:
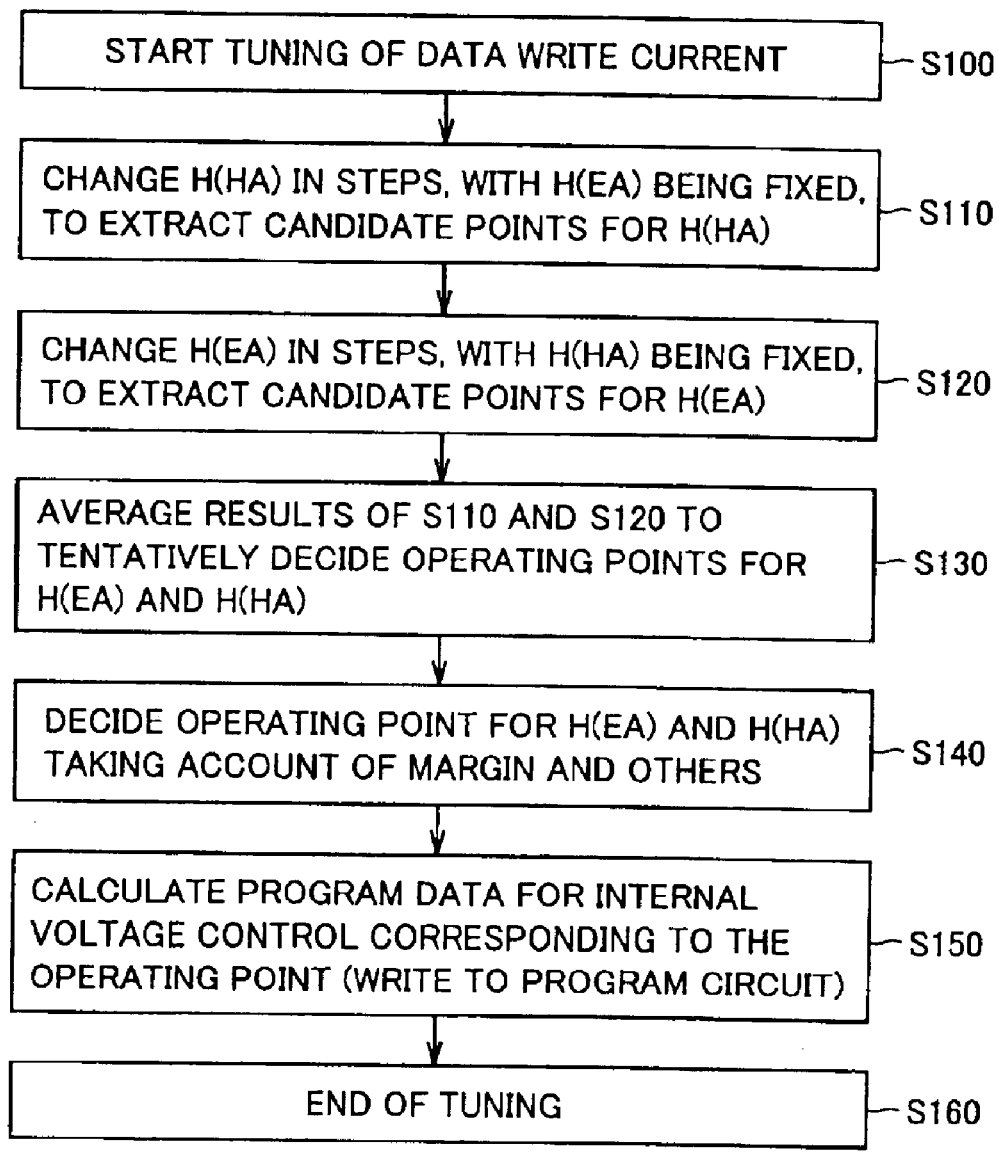
FIG. 19 is a flow chart illustrating a method of adjusting a data write current in the MRAM device according to the third embodiment.

FIG. 19 illustrates a method for adjusting a data write current in a test mode.

Referring to FIG. 19, when tuning of the data write current is started (step S100), firstly, while internal voltages Vbb#, Vpp# being substrate voltages of the driver transistors in bit line drivers 250a, 250b are fixed, the settings of internal voltages Vbb, Vpp being substrate voltages of driver transistors 222, 224 in write digit line drive circuit 220 are changed stepwise, and an operation test as to whether data write of a prescribed level can be carried out normally or not, is performed. That is, the test is conducted by changing the setting of data write magnetic field H(HA) in the hard axis direction in steps, while fixing the setting of data write magnetic field H(EA) in the easy axis direction.

Data comparison circuit 280 shown in FIG. 18 is used to evaluate the data write results at the respective set levels of data write magnetic field H(HA). As a result, candidate points for data write magnetic field H(HA) being applied at the time of data write are extracted based on a set level at which the data write result changed from no good (NG) to good (OK) (step S110).

Next, an operation test as to whether data write of a prescribed level can be carried out normally or not, is performed by changing the settings of internal voltages Vbb#, Vpp# being substrate voltages of driver transistors corresponding to bit line BL in steps, while fixing the settings of internal voltages Vbb, Vpp being substrate voltages of driver transistors 222, 224 corresponding to write digit line WDL. That is, the test is conducted with the setting of data write magnetic field H(HA) in the hard axis direction being fixed and the setting of data write magnetic field H(EA) in the easy axis direction being changed in steps.

As a result, candidate points for data write magnetic field H(EA) being applied at the time of data write are extracted based on a set level at which the data write result changed from no good (NG) to good (OK) (step S120).

Further, data write magnetic fields H(EA) and H(HA) at the candidate points obtained in steps S110 and S120 are averaged, and data write magnetic fields H(EA) and H(HA) corresponding to the operating points at the time of data write are decided tentatively (step S130). Still further, with respect to the operating points tentatively decided in step S130, margin and others are taken into account for the easy axis and the hard axis, and the operating point is decided ultimately (step S140).

As already described, the intensities of data write magnetic fields H(EA) and H(HA) are adjustable by the substrate voltages of the driver transistors. Thus, adjustment signals P0–P3, PP0–PP3, P0#–P3#, PP0#PP3# necessary to generate the magnetic fields of the intensities at the operating point decided in step S140 are calculated by analyzing the operation test results. The obtained program data are written into the program circuit (step S150). Accordingly, in the actual operation of the MRAM device, the data write magnetic fields corresponding to the operating point decided in step S140 can be generated. The tuning of the data write current is completed through the procedure described above (step S160).

Now, specific examples of the data write current tuning illustrated in FIG. 19 are described with reference to FIGS. 20–23.

In each of FIGS. 20–23, the horizontal axis represents data write magnetic field H(EA) along the easy axis, and the vertical axis represents data write magnetic field H(HA) along the hard axis. Data write magnetic field H(EA) can be set stepwise by adjustment signals P0#–P3# and PP0#–PP3# provided to Vbb# generating circuit 240 and Vpp# generating circuit 240#, respectively, shown in FIG. 18. Similarly, data write magnetic field H(HA) can be set in steps by adjustment signals PP0–PP3 and P0–P3 provided to Vpp generating circuit 40# shown in FIG. 14 and Vbb generating circuit 40 shown in FIG. 17, respectively.

When adjustment signals of four bits are employed, each of data write magnetic fields H(EA) and H(HA) can be adjusted in 16 steps, as shown in FIG. 6. That is, the point "0" on the horizontal and vertical axes corresponds to adjustment level "0" shown in FIG. 6. From this state, the adjustment signals can be changed in steps, to change the settings of internal voltages Vbb, Vpp, Vbb#, Vpp# in a direction with which data write currents Ip, ±Iw increase/decrease. As a result, it is possible to adjust the settings of data write magnetic fields H(EA), H(HA) in steps.

Figure 20:
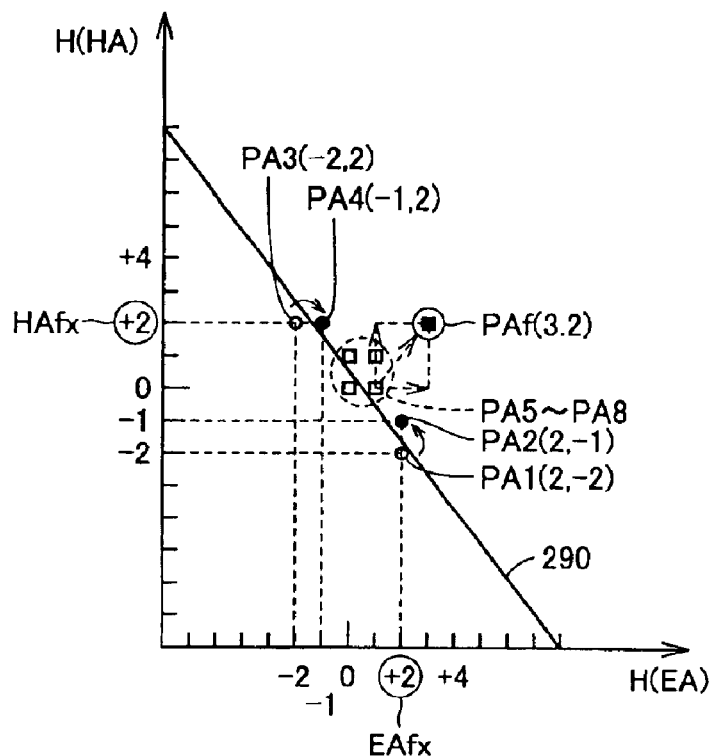
FIGS. 20–23 are conceptual diagrams illustrating first through fourth examples of the data write current tuning shown in FIG. 19.

FIG. 20 shows adjustment of the data write current in a typical case.

Referring to FIG. 20, firstly, data write magnetic field H(HA) in the hard axis direction is changed, while data write magnetic field H(EA) in the easy axis direction is fixed to a fixed value EAfx, as in step S110 in FIG. 19. In FIG. 20, fixed value EAfx is "+2" by way of example.

Accordingly, two test points PA1 (2, −2) and PA2 (2, −1) are obtained, across asteroid characteristic line 290, corresponding to a boundary at which the data write result changes from no good (NG) to good (OK).

Similarly, as in step S120 in FIG. 19, data write magnetic field H(EA) in the easy axis direction is changed while data write magnetic field H(EA) in the hard axis direction is fixed to fixed value HAfx (e.g., HAfx="+2"). Thus, two test points PA3 (−2, 2) and PA4 (−1, 2) are obtained across asteroid characteristic line 290, corresponding to a boundary at which the data write result changes from no good (NG) to good (OK).

The test points (i.e., candidate points) where data write was normal, PA2, PA4, are averaged to obtain tentative operating points, as in step S130 in FIG. 19. In the example of FIG. 20, PA5 (0, 0), PA6 (0, 1), PA7 (1, 0) and PA8 (1, 1) are obtained as the tentative operating points.

Further, as shown in step S140 in FIG. 19, magnetic field margins (here, "+2" for both H(EA) and H(HA)) are added to tentative operating points PA5–PA8, to obtain an operating point PAf (3, 2).

As shown in step S150 in FIG. 19, adjustment signals P0–P3, PP0–PP3, P0#–P3#, PP0#–PP3# for generating data write magnetic fields (i.e., data write currents) corresponding to the relevant operating point PAf are written into the program circuit. Thus, in the actual operation, the substrate voltages of the driver transistors are set based on the programmed adjustment signal group, and thus, data write is carried out by applying the data write magnetic fields corresponding to operating point PAf.

Figure 21:
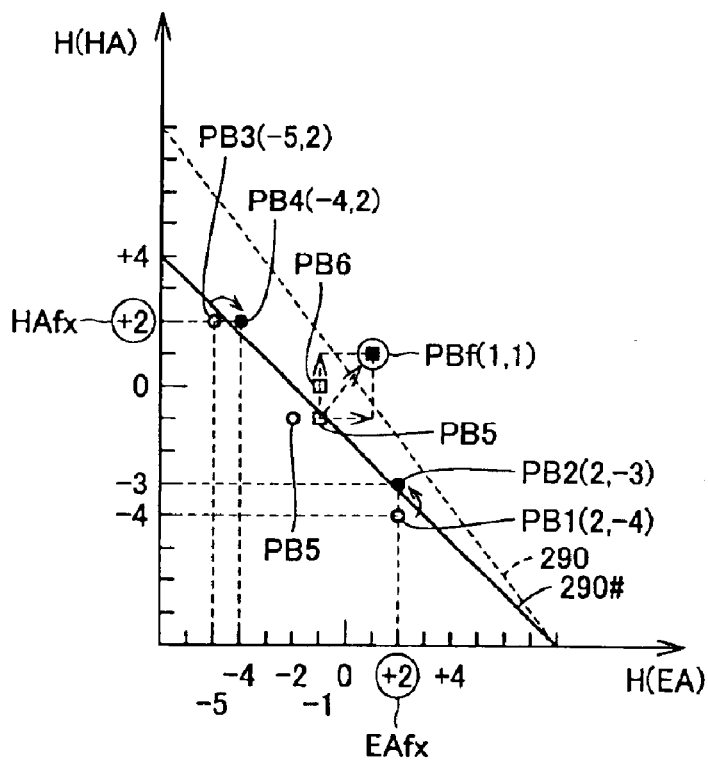

FIG. 21 illustrates, as one of the effects of such data write current adjustment, adjustment of the data write current in the case where the asteroid characteristic line has been displaced from asteroid characteristic line 290 as designed to an actual asteroid characteristic line 290#, due to variation in manufacture or the like.

Referring to FIG. 21, as in the case of FIG. 20, steps S110 and S120 in FIG. 19 are performed with fixed values EAfx="+2" and HAfx="+2". As a result, two sets of test points, a set of PB1 (2, −4) and PB2 (2, −3) and a set of PB3 (−5, 2) and PB4 (−4, 2), are obtained across asteroid characteristic line 290# corresponding to a boundary at which the data write result changes from no good (NG) to good (OK).

Further, step S130 in FIG. 19 is performed to average candidate points PB2 and PB4 to obtain tentative operating points. In the example of FIG. 20, tentative operating points PB5 (−1, −1) and PB6 (−1, 0) are obtained. Further, step S140 in FIG. 19 is performed to add magnetic field margins (here, "+2" for both H(EA) and H(HA)) to tentative operating points PB5, PB6, to obtain an operating point PBf (1, 1). The adjustment signals for generating the data write magnetic fields corresponding to the obtained operating point PBf are stored in the program circuit. In the actual operation, the substrate voltages of the driver transistors are set based on the adjustment signal group thus programmed.

As described above, even if the asteroid characteristic line is offset from the designed value, the data write current can be set to a proper level, to secure a data write margin and to prevent an increase of the power consumption due to excessive current supply as well as generation of internal magnetic noise.

In FIGS. 20 and 21, the case where data write magnetic fields H(EA) and H(HA) applied are balanced with each other, has been described. This corresponds to the adjustment conducted when the driver transistors supplying data write currents for generation of data write magnetic fields H(HA) and H(EA) have been completed as designed to a certain degree.

By comparison, a case is conceivable where either one of the driver transistors has current supplying capability that is lower than a designed value due to variation in finished transistor size or the like.

Figure 22:
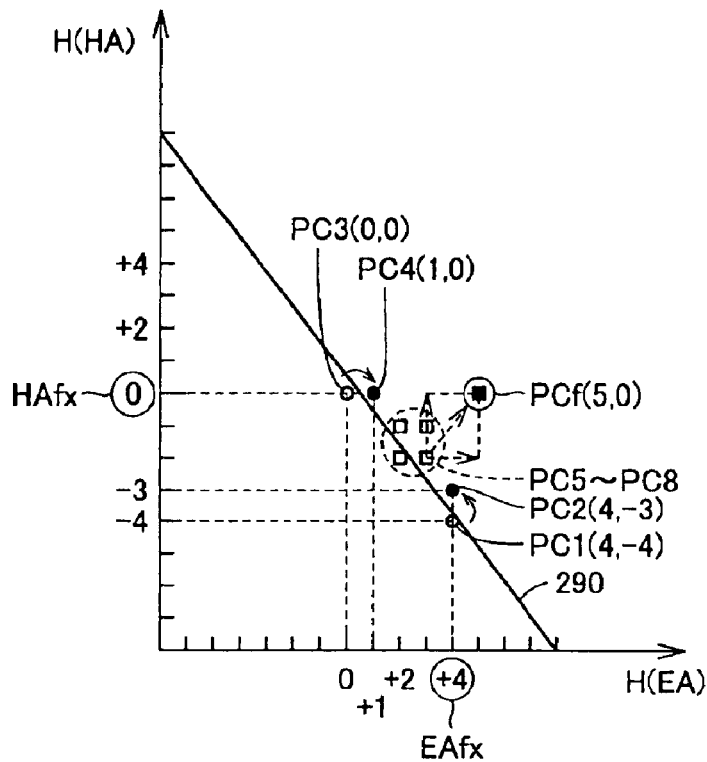
Figure 23:
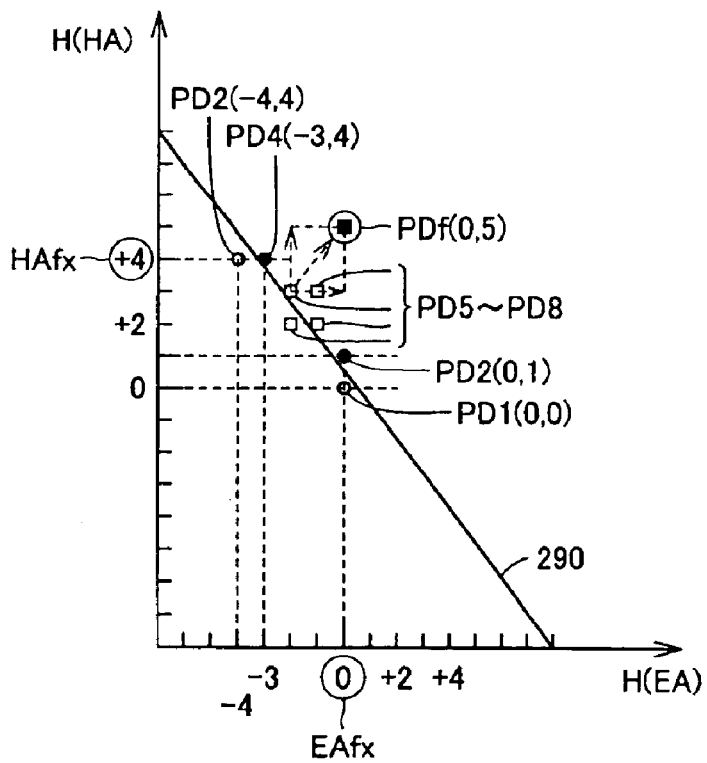

FIGS. 22 and 23 show that adjustment of the data write current is possible even in such a case.

FIG. 22 illustrates an adjustment method in the case where the driver transistor for supplying data write magnetic field H(EA) has been completed with relatively low supplying capability.

In such a case, fixed values EAfx and HAfx of the data write magnetic fields are set to unbalanced values, unlike the cases of FIGS. 20 and 21. For example, fixed value EAfx is set to "+4", while HAfx is set to "0".

In this state, the flow for tuning the data write current shown in FIG. 19 is carried out. As a result, two sets of test points, PC1 (4, −4) and PC2 (4, −3), and PC3 (0, 0) and PC4 (1, 0), are obtained across asteroid characteristic line 290, corresponding to the boundary at which the data write result changes from no good (NG) to good (OK).

Further, candidate points PC2, PC4 are averaged to obtain tentative operating points. In the example shown in FIG. 22, PC5–PC8 are obtained as the tentative operating points. Magnetic field margins are added to tentative operating points PC5–PC8, and thus, an operating point PCf (5, 0) is obtained. The adjustment signals for generating the data write magnetic fields corresponding to the operating point PCf obtained are stored in the program circuit. In the actual operation, the substrate voltages of the driver transistors are set based on the adjustment signal group programmed.

FIG. 23 illustrates an adjustment method in the case where the driver transistor for supplying data write magnetic field H(HA) has been completed with relatively low supplying capability.

In this case, again, unlike the cases of FIGS. 20 and 21, fixed values EAfx and HAfx of the data write magnetic fields are set to unbalanced values, e.g., HAfx="+4" and EAfx="0".

In this state, the tuning flow of the data write current shown in FIG. 19 is performed, and two sets of test points, PD1 (0, 0) and PD2 (0, 1), and PD3 (−4, 4) and PD4 (−3, 4), are obtained across asteroid characteristic line 290, corresponding to the boundary at which the data write result changes from no good (NG) to good (OK).

Further, candidate points PD2 and PD4 are averaged to obtain tentative operating points. In the example in FIG. 23, PD5–PD8 are obtained as the tentative operating points. Magnetic field margins are added to tentative operating points PD5–PD8, and thus, an operating point PDf (0, 5) is obtained. The adjustment signals for generating the data write magnetic fields corresponding to the obtained operating point PDf are stored in the program circuit. In the actual operation, the substrate voltages of the driver transistors are set based on the programmed adjustment signal group.

As shown in FIGS. 22 and 23, even in the case where a relative difference occurs in current supplying capabilities between the driver transistors supplying data write currents for generating respective data write magnetic fields H(HA) and H(EA) due to variation in manufacture or the like, the data write currents can be set to proper levels to secure a data write margin and to prevent an increase of the power consumption due to excessive current supply and generation of internal magnetic noise.

As described above, in the configuration according to the third embodiment, the internal voltage of the driver transistor is controlled by the internal voltage control circuit according to the first embodiment. Accordingly, it is possible to precisely adjust the data write current to a proper level in a test mode, and also set the data write current in an actual operation according to the adjustment result obtained in the relevant test mode.

Although the substrate voltage of the driver transistor has been used to adjust the data write current in the third embodiment, it is also possible to set the level of the voltage applied to the source or gate, instead of the substrate, of the driver transistor in the same manner.

Further, the configuration where CMOS drivers are applied to bit line drivers 250a, 250b has been described in the third embodiment. Alternatively, they may be configured with driver transistors of only the same conductivity type (e.g., N-MOS transistors having relatively large current driving capabilities). In such a configuration, again, the data write current level can likewise be adjusted in accordance with the settings of the applied voltages to the driver transistors.

Fourth Embodiment

In the fourth embodiment, adjustment of a data write current in an OUM device is described.

Figure 24:
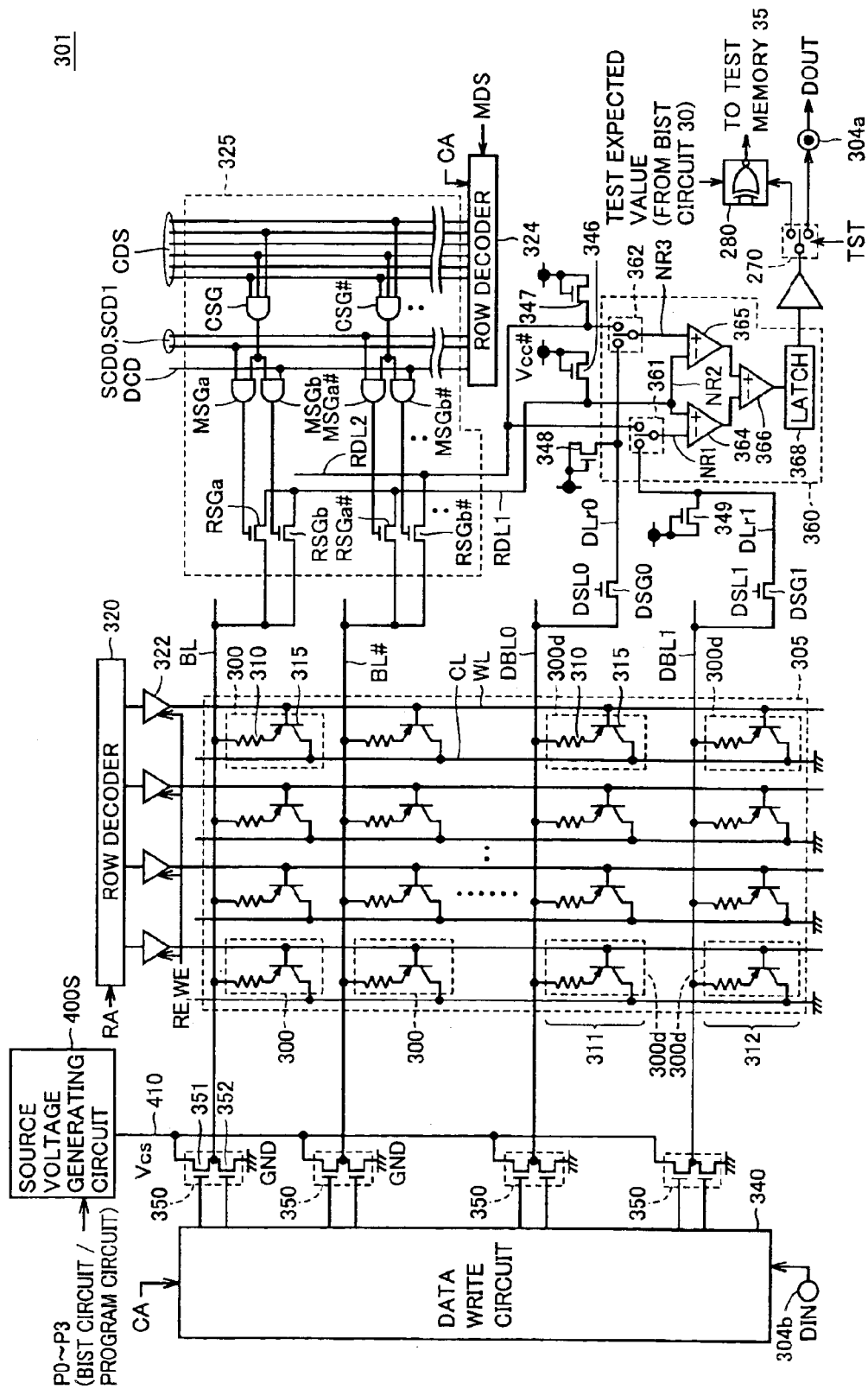
FIG. 24 is a circuit diagram illustrating an entire configuration of the OUM device according to a fourth embodiment of the present invention.

Referring to FIG. 24, the OUM device 301 according to the fourth embodiment is provided with data terminals 304a, 304b, a memory cell array 305, a row decoder 320, a word line driver 322, a column decoder 324, and a column select portion 325.

Memory cell array 305 has a plurality of OUM cells. These OUM cells are classified into normal memory cells 300 (hereinafter, also simply referred to as "memory cells 300") and dummy memory cells 300d which form dummy cell columns 311 and 312. Dummy memory cells 300d arranged in dummy cell columns 311 and 312 have the same characteristics (shapes and structures) as memory cells 300, and are arranged to share the memory cell rows with memory cells 300.

Word lines WL and collector lines CL are arranged corresponding to respective memory cell rows shared by memory cells 300 and dummy memory cells 300d. Bit lines BL are arranged corresponding to respective memory cell columns formed of memory cells 300, and dummy bit lines DBL0 and DBL1 are arranged for dummy cell columns 311 and 312, respectively. Collector lines CL are connected to ground voltage GND.

Each of memory cells 300 and dummy memory cells 300d has a chalcogenide layer 310 and a switching transistor 315 connected in series between corresponding bit line BL (or dummy bit line DBL0, DBL1) and collector line CL.

Here, the configuration and data storage principle of the OUM cell are described.

Figure 25:
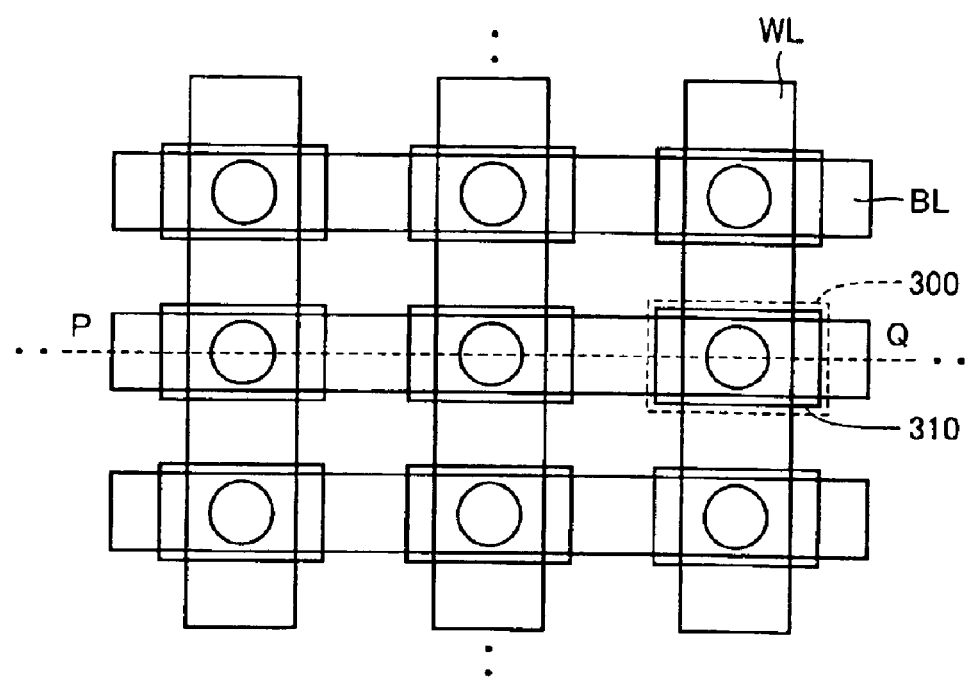
FIG. 25 is a top plan view showing a portion of the memory cell array formed of the OUM cells.

FIG. 25 shows a portion of the memory cell array formed of the OUM cells.

Referring to FIG. 25, memory cells 300 having chalcogenide layers 310 are arranged corresponding to the crossings of word lines WL and bit lines BL arranged in rows and columns.

Figure 26:
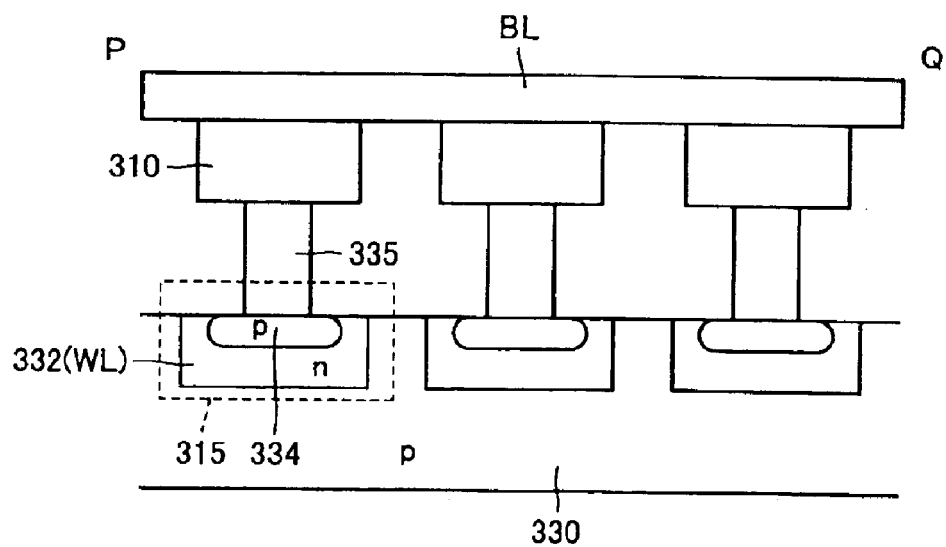
FIG. 26 is a schematic cross sectional view of the portion in FIG. 25, for illustration of the OUM cell structure.

FIG. 26 is a cross sectional view taken along the line P-Q in FIG. 25.

Referring to FIG. 26, switching transistor 315 has an n type region 332 formed on a p type region 330, and a p type region 334 formed in n type region 332. Switching transistor 315 is formed of a pnp type vertical parasitic bipolar transistor with p type region 330, n type region 332 and p type region 334.

N type region 332 corresponds to word line WL shown in FIGS. 24 and 25. A heating element 335 is provided between chalcogenide layer 310 and switching transistor 315, which generates heat by a current passing therethrough. At the time of data write, switching transistors 315 is turned on, and a data write current is passed from bit line BL through chalcogenide layer 310 and heating element 335. Chalcogenide layer 310 changes in phase to either a crystalline state or an amorphous state, in accordance with a supply pattern of the relevant data write current (e.g., supply period and supply current amount). Chalcogenide layer 310 has different electric resistances in the amorphous state and in the crystalline state. Specifically, the chalcogenide layer in the amorphous state has an electric resistance that is greater than in the crystalline state.

That is, the OUM cell, like the MTJ memory cell, has either one of electric resistances Rmax and Rmin in accordance with the stored data. Although the MTJ memory cell and the OUM cell have different electric resistances at the time of data storage, herein, their two types of electric resistances according to the levels of stored data are commonly represented as Rmax and Rmin.

As such, at the time of data read, switching transistor 315 is turned on, and a data read current at a level not to cause a phase change is passed through chalcogenide layer 310. This enables the data read based on the electric resistance of a selected memory cell.

That is, in the OUM device, whether the data write is done successfully or not depends on the level of the data write current, as in the MRAM device. Thus, it is necessary to precisely set the data write current level, for the purposes of ensuring the data write margin and suppressing the power consumption.

As described above, the data read from the OUM cell is performed by detecting an electric resistance difference in accordance with a stored data level, typically by detecting a current passing through a selected memory cell. However, the through current at the time of data read is limited to a minute level taking account of reliability of the memory cell and others.

Thus, in an array configuration where data storage of one bit is performed for each OUM cell, the data should be read by comparing the current passing through one OUM cell selected as a target of the data read with a prescribed reference current. In such an array configuration, although an area per bit may be made small to achieve higher integration, high-precision current detection as described above becomes necessary. Fluctuation in current level attributable to variation in manufacture or the like may degrade the accuracy of the data read.

Accordingly, in an application where reliability of stored data is highly required, it is desirable to employ an array configuration where data storage of one bit is performed with two OUM cells having complementary data written therein. Such an array configuration, however, hinders high integration, and cannot ensure adequate performance in an application where data storage capacity is given a high priority.

If different array configurations were employed according to different applications of memory devices requiring different characteristics, designing and manufacturing thereof would become complicated and cost thereof would increase. This is true especially in the case where MRAM devices are incorporated into a system LSI (Large Scale Integrated circuit) formed of a plurality of functional blocks different in use.

The OUM device 301 according to the fourth embodiment can solve such a problem, as it has a first mode where each of memory cells 300 stores data of one bit, and a second mode where each pair of memory cells 300 stores data of one bit. In the first and second modes, one memory cell and a pair of memory cells, respectively, are selected as an access target based on a decoded result of an input address. Thus, hereinafter, the respective modes are also referred to as the "1-cell decode mode" and the "2-cell decode mode". A mode control signal MDS is an electric signal which designates whether OUM device 301 operates in the 1-cell decode mode or in the 2-cell decode mode.

Further, as will be understood from the description below, the OUM device according to the fourth embodiment is provided with a configuration for adjustment of the setting of data write current level, as in the MRAM device according to the third embodiment.

Referring again to FIG. 24, address selection in the OUM device according to the fourth embodiment is described.

Word line drivers 322 are provided corresponding to respective word lines WL. Word line drivers 322 respond to a row select result from row decoder 320, and activate word line WL of a selected row to an H level at each of data read and data write. Column decoder 324 receives column address CA indicated by an input address and mode control signal MDS indicating the decode mode in OUM device 301.

In memory cell array 305, the columns of memory cells 300 are divided into pairs of successive two columns. At the time of decoding of two cells, neighboring cells in the respective pair, i.e., two memory cells belonging to the same memory cell row, form a memory cell set on which data storage of one bit is performed. In FIG. 24, one odd-numbered memory cell column (hereinafter, referred to as the "odd column") and one even-numbered memory cell column (hereinafter, referred to as the "even column") are shown representatively. Hereinafter, a bit line in an odd column is represented as bit line BL, and a bit line in an even column is represented as bit line BL#.

Column decoder 324 generates a column decode signal CDS and decode control signals SCD0, SCD1, DCD, in accordance with mode control signal MDS and column address CA.

Column select portion 325 includes a column select portion CSG, decode select portions MSGa, MSGb, and read select gates RSGa, RSGb provided corresponding to a respective odd column, and a column select portion CSG#, decode select portions MSGa# MSGb#, and read select gates RSGa#, RSGb# provided corresponding to a respective even column.

Column select portions CSG and CSG# corresponding to the memory cell columns forming a pair have their outputs controlled by common column decode signal CDS. Accordingly, at each of the 1-cell decode mode and the 2-cell decode mode, the outputs of column select portions CSG and CSG# belonging to the pair corresponding to the selected memory cell(s) are activated to an H level, whereas the outputs of remaining column select portions CSG and CSG# are inactivated to an L level.

In the 1-cell decode mode, one and the other of decode control signals SCD0, SCD1 are set to an H level and an L level, respectively, in accordance with column address CA. Decode control signal DCD is set to an L level. By comparison, in the 2-cell decode mode, both decode control signals SCD0, SCD1 are fixed to an L level, and decode control signal DCD is set to an H level.

In an odd column, decode select portion MSGa outputs an AND operation result of the output of corresponding column select portion CSG and decode control signal SCD0. Decode select portion MSGb outputs an AND operation result of the output of corresponding column select portion CSG and decode control signal DCD. In an even column, decode select portion MSGa# outputs an AND operation result of the output of corresponding column select portion CSG# and decode control signal SCD1. Decode select portion MSGb# outputs an AND operation result of the output of corresponding column select portion CSG# and decode control signal DCD.

In an odd column, read select gates RSGa and RSGb are connected in parallel between corresponding bit line BL and read data line RDL1. Read select gates RSGa and RSGb have their gates receiving outputs of decode select portions MSGa and MSGb, respectively.

In an even column, read select gates RSGa# and RSGb# are connected between corresponding bit line BL# and read data lines RDL1 and RDL2, respectively. Read select gates RSGa# and RSGb# have their gates receiving outputs of respective decode select portions MSGa# and MSGb#. Read select gates RSGa, RSGb, and RSGa#, RSGb# are formed of N-MOS transistors.

Thus, at the time of data read in the 1-cell decode mode, one memory cell column is selected, and read select gate RSGa (or RSGa#) in the selected column turns on. Bit line BL or BL# of the selected column is connected to read data line RDL1, while read data line RDL2 is connected to none of the bit lines.

By comparison, at the time of data read in the 2-cell decode mode, two memory cell columns (odd column and even column) forming a pair are selected, and read select gates RSGb and RSGb# turn on in the respective selected columns. As a result, bit lines BL and BL# in the selected columns are connected to read data lines RDL1 and RDL2.

Although not shown, the identical configurations are provided for respective memory cell columns in column select portion 325.

As such, accesses to memory cells 300 based on an input address are switched by row decoder 320, column decoder 324 and column select portion 325. That is, in the 1-cell decode mode, one of memory cells 300 corresponding to the input address is selected as an access target, while in the 2-cell decode mode, one pair from among the pairs of memory cells 300 is selected in accordance with the input address, and the two memory cells constituting the relevant pair are selected as access targets.

Now, the configuration for data write is further described.

A bit line driver 350 is provided for each bit line BL and each dummy bit line DBL0, DBL1. Bit line driver 350 has driver transistors 351 and 352, each formed of an N channel MOS transistor having relatively large current driving capability. Driver transistor 351 is connected between an internal voltage interconnection 410 and corresponding bit line BL or dummy bit line DBL0, DBL1. Driver transistor 352 is connected between ground voltage GND and corresponding bit line BL or dummy bit line DBL0, DBL1.

In each memory cell column, driver transistors 351 and 352 have their gate voltages controlled by a data write circuit 340 based on column address CA and input data DIN, for control of the amount and timing of the currents passed therethrough.

An internal voltage Vcs transmitted by internal voltage interconnection 410 is applied as a source voltage to bit line driver 350 driving a data write current, as described above.

A source voltage generating circuit 400S has the same configuration as internal voltage control circuit 40 shown in FIG. 4, and controls internal voltage Vcs to an object level in accordance with adjustment signals P0–P3. That is, source voltage generating circuit 400S can set internal voltage Vcs in steps, in accordance with adjustment signals P0–P3 that are provided from the BIST circuit in a test mode and from the program circuit in an actual operation.

With such a configuration, it is possible to adjust the level of the data write current through adjustment of the current driving capabilities of driver transistors 351, 352 in accordance with adjustment signals P0–P3.

Figure 27:
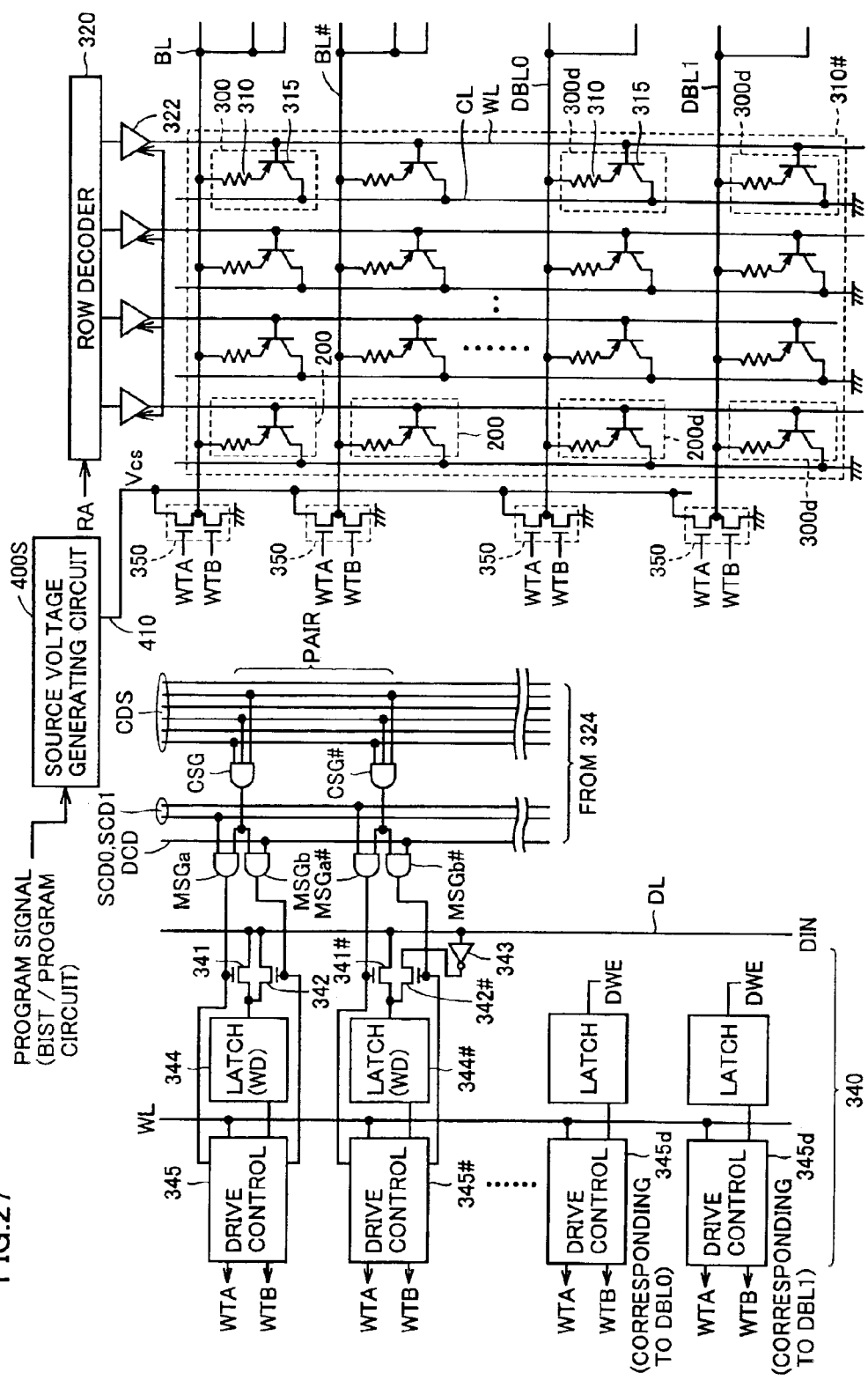
FIG. 27 is a circuit diagram showing a data write configuration in the OUM device according to the fourth embodiment.

FIG. 27 shows a configuration for data write in the OUM device according to the fourth embodiment. In FIG. 27, the configuration of data write circuit 340 shown in FIG. 24 is specifically shown.

Referring to FIG. 27, data write circuit 340 has transmission gates 341, 342, a latch circuit 344 and a drive control circuit 345 provided corresponding to a respective odd column, and transmission gates 341#, 342#, an inverter 343, a latch circuit 344# and a drive control circuit 345# provided corresponding to a respective even column. Further, a drive control circuit 345d is provided for dummy bit lines DBL0, DBL1 of the dummy cell columns.

Transmission gates 341 and 342 are connected in parallel between latch circuit 344 and a write data line DL which transmits input data DIN to data terminal 304b. Transmission gates 341 and 342 are formed of N-MOS transistors, and have their gates receiving outputs of respective decode select portions MSGa and MSGb described in conjunction with FIG. 24.

Inverter 343 inverts and outputs input data DIN on write data line DL. Transmission gate 341# is connected between write data line DL and latch circuit 344#, and transmission gate 342# is connected between an output node of inverter 343 and latch circuit 344#. Transmission gates 341# and 342# are formed of N-MOS transistors, and have their gates receiving outputs of respective decode select portions MSGa# and MSGb# shown in FIG. 24.

Thus, in the 1-cell decode mode, transmission gate 341 or 341# turns on in a selected column corresponding to the selected memory cell, and input data DIN is transmitted to corresponding latch circuit 344 or 344#, where it is held as written data WD.

By comparison, in the 2-cell decode mode, transmission gates 342 and 342# turn on in two selected columns forming a pair corresponding to the selected memory cells. As a result, input data DIN and its inverted data are transmitted to respective latch circuits 344 and 344# corresponding to the two selected columns, and they held as written data WD.

Each of drive control circuits 345, 345# generates write control signals WTA, WTB for control of an operation of corresponding bit line driver 350, in accordance with a select result of the corresponding memory cell column and written data WD latched in corresponding latch circuits 344, 344#.

Each drive control circuit 345, 345# sets each write control signal WTA, WTB to an L level to perform a non-write operation at the time other than the data write (control signal WE=L level), or at the time of the data write when the corresponding memory cell column is not selected. Thus, in the non-write operation, corresponding bit line BL (BL#) is set to a floating state.

By comparison, at the time of the data write (WE=H level) and when the corresponding memory cell column is selected, each drive control circuit 345, 345# sets write control signals WTA, WTB in accordance with written data WD latched by corresponding latch circuits 344, 344#.

Specifically, on/off of corresponding driver transistors 351; 352 are controlled by write control signals WTA, WTB, such that data write currents having a pattern (e.g., supply period and supply current amount) causing chalcogenide layer 310 to undergo a phase change to either a crystalline state or an amorphous state corresponding to the written data WD, flow through bit lines BL, BL#.

The identical configurations are provided for respective odd columns and even columns. Alternatively, the drive voltage of bit line driver 350 may be any arbitrary voltage independent from ground voltage GND and power supply voltage Vcc.

As a result, in the OUM device according to the fourth embodiment, input data DIN is written into one selected memory cell at the time of data write in the 1-cell decode mode. In the 2-cell decode mode, input data DIN is written into one (in an odd column) of two selected memory cells forming a pair, and inverse data (complementary data) of input data DIN is written into the other of the selected memory cells. As such, the data read and write operations can be switched in response to mode control signal MDS being an electric signal, corresponding to the 1-cell decode mode and the 2-cell decode mode.

Further, as already described, the data write current can be adjusted to a proper level within a range ensuring a data write margin, for lower power consumption.

In the OUM device 301 according to the fourth embodiment, the configuration where the data write current is adjusted by adjustment of the setting of the source voltage of bit line driver 350 has been described. Alternatively, a configuration where the data write current is adjusted through adjustment of the setting of substrate voltage or gate apply voltage of driver transistors 351, 352 may be employed.

Referring again to FIG. 24, a data read configuration in the OUM device is described.

OUM device 301 is further provided with read data lines RDL1, RDL2, reference data lines DLr0, DLr1, dummy select gates DSG0, DSG1, current supply transistors 346–349, and a data read circuit 360.

Current supply transistors 346 and 347 are formed of N-MOS transistors, for example, and are connected between power supply voltage Vcc# and read data lines RDL1 and RDL2, respectively. Current supply transistors 346 and 347 are formed of, e.g., N-MOS transistors, and are connected between power supply voltage Vcc# and reference data lines DLr0 and DLr1, respectively. Each of current supply transistors 346–349 has current supplying capability of the same level, and has its gate connected to power supply voltage Vcc#, for example. Thus, each of read data lines RDL1, RDL2 and reference data lines DLr0, DLr1 is pulled up by power supply voltage Vcc#. Alternatively, it may be configured such that the read data lines and the reference data lines are pulled up with power supply voltage Vcc# solely in a read data operation, by making the gates of current supply transistors 346–349 receive a signal that is activated at the time of the data read.

Dummy select gate DSG0 is connected between dummy bit line DBL0 and reference data line DLr0, and turns on in response to activation (to an H level) of dummy control signal DSL0. Dummy select gate DSG1 is connected between dummy bit line DBL1 and reference data line DLr1, and turns on/off in response to dummy control signal DSL1. Dummy select gates DSG0, DSG1 are formed of, e.g., N channel MOS transistors. Dummy control signals DSL0 and DSL1 are each set to an H level in the 1-cell decode mode, and set to an L level in the 2-cell decode mode.

At the time other than data read, read select gates RSGa, RSGb, RSGa#, RSGb# and dummy select gates DSG0, DSG1 are each forcibly turned off, irrelevant to the decode mode and the column select result.

Data read circuit 360 has switches 361, 362, sense amplifiers 364–366, and a latch circuit 368. Switch 361 selectively connects one of read data line RDL2 and reference data line DLr1 to a node NR1. Switch 362 selectively connects one of read data line RDL2 and reference data line DLr0 to a node NR3. A node NR2 is connected to read data line RDL1.

Sense amplifier 364 amplifies a voltage difference (or current difference) between nodes NR1 and NR2. Sense amplifier 365 amplifies a voltage difference (or current difference) between nodes NR2 and NR3 in a polarity opposite to that of sense amplifier 364. Sense amplifier 366 further amplifies the output difference between sense amplifiers 364 and 365. Latch circuit 368 latches the output of sense amplifier 366 at a timing where the output of sense amplifier 366 reaches an amplitude of greater than a prescribed level, taking account of a time required for the amplification operations of sense amplifiers 364–366.

Now, data read in the respective decode modes are described in detail.

In the data read operation, word line WL of a selected row is activated to an H level in response to row address RA, and switching transistors 315 turn on in corresponding memory cells 300 and dummy memory cells 300d. Thus, bit lines BL, BL# and dummy bit lines DBL0, DBL1 are each pulled down to collector line CL (ground voltage GND) via corresponding chalcogenide layer 310.

As already described, in the 1-cell decode mode, column select portion 325 connects bit line BL (or BL#) of a selected column to read data line RDL1, and disconnects read data line RDL2 from any bit line. Thus, a current and a voltage occur in read data line RDL1 in accordance with electric resistance Rmax or Rmin (i.e., stored data) of the selected memory cell.

Since dummy select gates DSG0 and DSG1 both turn on, a current and a voltage corresponding to electric resistance Rmax occur in reference data line DLr0, and a current and a voltage corresponding to electric resistance Rmin occur in reference data line DLr1.

In the 1-cell decode mode, switches 361 and 362 connect reference data lines DLr1 and DLr0 to nodes NR1 and NR3, respectively. As a result, sense amplifier 364 compares access results to the selected memory cell and to dummy memory cell DMC (of electric resistance Rmin), and sense amplifier 365 compares access results to the selected memory cell and to dummy memory cell DMC (of electric resistance Rmax). In this case, the output of either one of sense amplifiers 364 and 365 hardly changes in amplitude, whereas the output of the other of sense amplifiers 364 and 365 changes in amplitude in a polarity in accordance with the stored data in the selected memory cell. Accordingly, the stored data can be read out of the selected memory cell by further amplifying the outputs of sense amplifiers 364 and 365 by sense amplifier 366.

In the 2-cell decode mode, the row selection is performed in the same manner as in the 1-cell decode mode. Specifically, each of bit lines BL, BL# and dummy bit lines DBL0, DBL1 is pulled down to collector line CL (ground voltage GND) via corresponding chalcogenide layer 310.

As already described, in the 2-cell decode mode, column select portion 325 connects bit lines BL and BL# of the selected columns to read data lines RDL1 and RDL2, respectively. Thus, currents and voltages corresponding to the electric resistances (i.e., stored data) of respective selected memory cells occur in read data lines RDL1 and RDL2. Dummy select gates DSG0 and DSG1 each turn off.

In the 2-cell decode mode, switches 361 and 362 connect read data line RDL2 to nodes NR1 and NR3, respectively.

Thus, sense amplifiers 364 and 365 compare, in polarities opposite to each other, access results to the selected memory cells having complementary data written therein. As a result, the outputs of sense amplifiers 364 and 365 change in amplitude in different polarities, in accordance with the stored data in the selected memory cells. Thus, by further amplifying the outputs of sense amplifiers 364 and 365 by sense amplifier 366, it is possible to detect whether the electric resistances of the selected memory cells are closer to Rmax or Rmin. As a result, the stored data in the selected memory cells can be read out.

A switch circuit 270 and a data comparison circuit 280 are arranged at the succeeding stages of data read circuit 360, as in the configuration of the MRAM device shown in FIG. 18. The operations of switch circuit 270 and data comparison circuit 280 are as described in conjunction with FIG. 18, and thus, detailed description thereof is not repeated here.

Accordingly, in the OUM device according to the fourth embodiment, it is possible to evaluate whether a data write current amount is appropriate or not, as in the MRAM device according to the third embodiment. Specifically, data of a prescribed level is test written to at least some of the memory cells in memory cell array 305 by a data write current adjustable in accordance with adjustment signals P0–P3. The data is then read out of MTJ memory cell MC(s) having been the target(s) of the relevant test write, and the data write current amount is evaluated based on the output of data comparison circuit 280 at that time.

In the configuration according to the fourth embodiment, accesses to memory cells upon data read and data write can be switched between the 1-cell decode mode and the 2-cell decode mode, in accordance with the level of mode control signal MDS. That is, the number of memory cells used for storage of one-bit data can be switched, in accordance with the level of an electric signal, in a common array configuration.

Further, it is possible to provide an operation region for the 1-cell decode mode and an operation region for the 2-cell decode mode within a same memory cell array, by appropriately correlating addresses to the mode control signal. As a result, the nonvolatile memory device according to the fourth embodiment of the present invention can flexibly be adapted to both an application where data capacity is given priority and an application where data reliability is given priority, without modification of the array configuration.

In particular, the setting of the boundary between the relevant operation regions can be switched at a software level by changing the settings of addresses and mode control signal, without modification of the array configuration. Accordingly, the OUM device according to the fourth embodiment can also realize a flexible operation with which the operation region for the 1-cell decode mode is increased when data capacity is greatly demanded, or the operation region for the 2-cell decode mode is increased when data reliability is highly demanded, depending on its specific application.

Further, by making dummy memory cells 300d have the same characteristics (configurations and shapes) as normal memory cells 300, special designing and manufacturing steps for the dummy memory cells become unnecessary, and some of the OUM cells successively fabricated can be used as the dummy memory cells. Thus, the dummy memory cells can be manufactured without incurring problems of an increased chip area due to complicated manufacturing steps, degradation in process margin of the memory cell array, and others. In particular, continuity in structure within memory cell array 305 is ensured, which also contributes to stable characteristics of the memory cells and the dummy memory cells.

Still further, even in the 1-cell decode mode where data read accuracy is relatively inferior, data read can be done by referring to dummy memory cells having the same characteristics as respective memory cells MC storing an H level and an L level. Accordingly, the data read accuracy improves.

The MTJ memory cell and the OUM cell are common in that data read is performed in accordance with an electric resistance (or through current) of a selected memory cell. Thus, the configuration shown in the fourth embodiment can also be applied to a memory cell array formed of the MTJ memory cells. In this case, the data read configuration as shown in FIG. 24 can be employed, although the data write configuration needs to include the write digit line drive circuit and the bit line driver shown in FIGS. 17 and 18.

Fifth Embodiment

In the fifth through ninth embodiments, techniques for the adjustment of the data write current level in the MRAM device described in the third embodiment will be explained corresponding to various cases.

FIGS. 28A, 28B, 29A and 29B are conceptual diagrams illustrating the adjustment of the data write current according to the fifth embodiment.

Figure 28B:
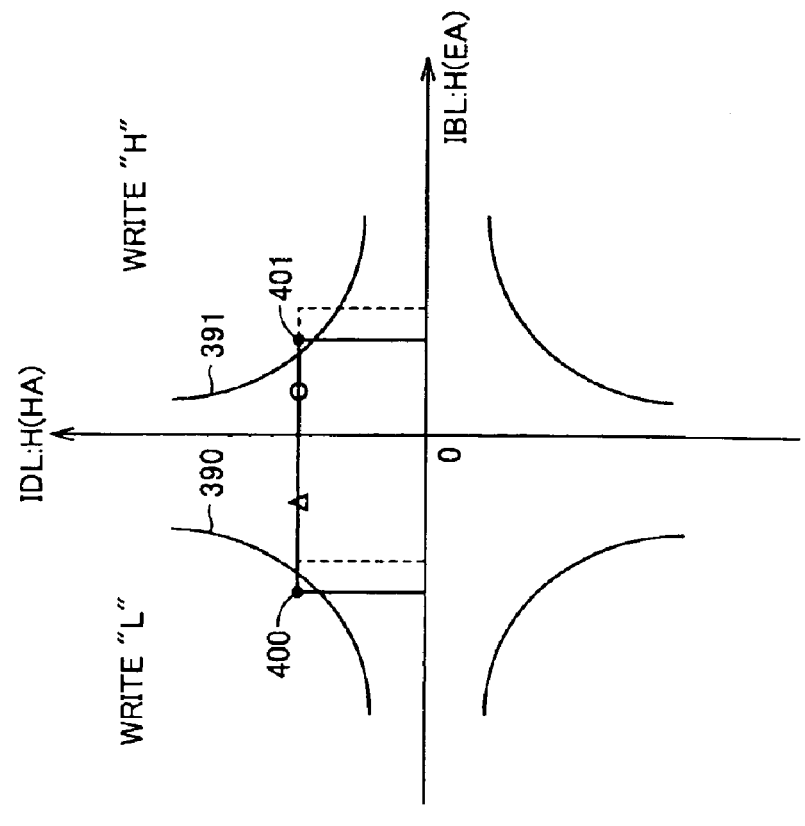
FIGS. 28A, 28B, 29A and 29B are conceptual diagrams illustrating adjustment of a data write current according to a fifth embodiment of the present invention.
Figure 28A:
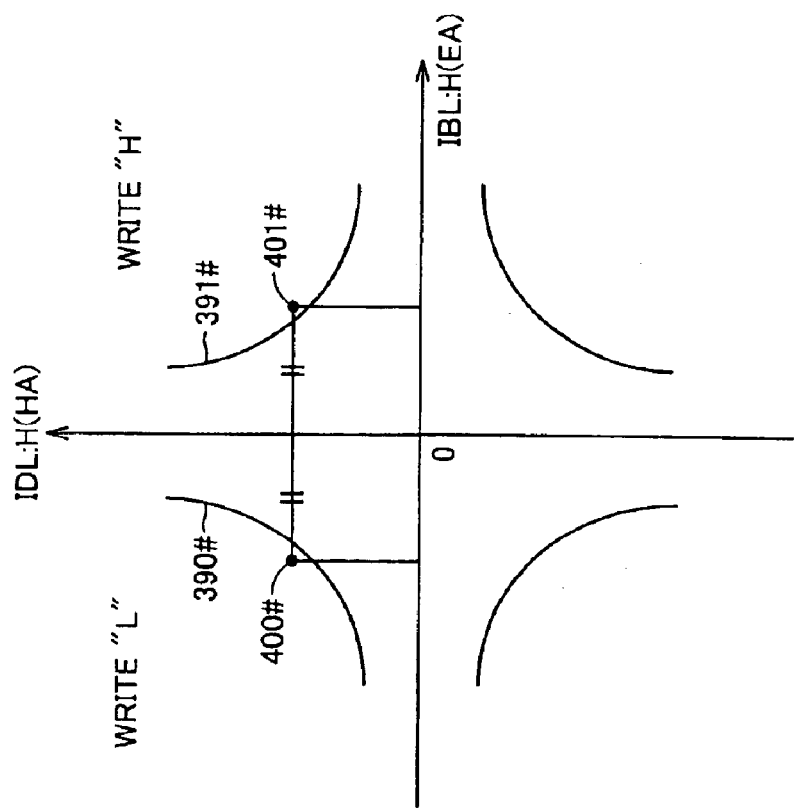

FIG. 28A shows ideal data write characteristics as designed, as in FIG. 16. Referring to FIG. 28A, the horizontal axis represents direction and magnitude of magnetic field H(EA) in an easy axis direction. The vertical axis represents direction and magnitude of magnetic field H(HA) in a hard axis direction. As already described, the direction and magnitude of magnetic field H(EA) are determined in accordance with direction and magnitude of bit line current IBL passing through a selected bit line BL, and the direction and magnitude of magnetic field H(HA) are determined in accordance with direction and magnitude of digit line current IDL passing through a selected write digit line WDL. Thus, hereinafter, the vertical axis and the horizontal axis in the diagrams showing the data write characteristics are indicated by bit line current IBL and digit line current IDL, respectively.

As already described, data write current Ip on write digit line WDL flows in a constant direction. Thus, it is assumed that a data write operation is carried out only in a region satisfying IDL>0. On the other hand, bit line current IBL differs in direction according to whether write data is at an H level or an L level. Thus, it is assumed that IBL>0 is set (i.e., IBL=+Iw) when writing data of an H level, and IBL<0 is set (i.e., IBL=−Iw) when writing data of an L level.

In the ideal state shown in FIG. 28A, an asteroid characteristic line 390# at the time of L level data write and an asteroid characteristic line 391# at the time of H level data write are symmetrical with respect to the IDL axis (vertical axis). This means that an operating point 400# at the time of the L level data write and an operating point 401# at the time of the H level data write are also symmetrical with respect to the IDL axis (vertical axis). As a result, bit line currents IBL at the times of the H level data write and the L level data write are opposite in direction and equal in magnitude (absolute value) with respect to each other.

As shown in FIG. 28B, in the fifth embodiment, assuming a case where actual asteroid characteristic lines 390 and 391 at the times of L level data write and H level data write to a produced MTJ memory cell become asymmetrical due to variation in manufacture of the memory cell or the like, a way of adjusting the data write current to address such a case is described.

That is, the fifth embodiment assumes asymmetry of data write characteristics where a proper magnitude of bit line current IBL differs in accordance with data to be written. In this case, operating points 400# and 401# as designed, shown in FIG. 28A, need to be displaced to adjusted operating points 400 and 401, shown in FIG. 28B, in conformity with actual asteroid characteristic lines 390 and 391. In other words, in the fifth embodiment, bit line current IBL necessary for data write has different absolute values according to whether the write data is at an H level or an L level, and thus, adjustment of the data write current corresponding thereto is required.

If it is impossible to adjust the magnitude of bit line current IBL for each current direction, data write of the both levels should be carried out in conformity with the condition where a relatively large bit line current is necessary (at the time of L level data write in the case of FIGS. 28A, 28B). In this case, however, an excessive bit line current would flow under the condition where a relatively small bit line current is necessary (at the time of H level data write in the case of FIGS. 28A, 28B). This leads to an increase of magnetic noise to non-selected memory cells, and degradation in stability of the data write operation.

Figure 29A:
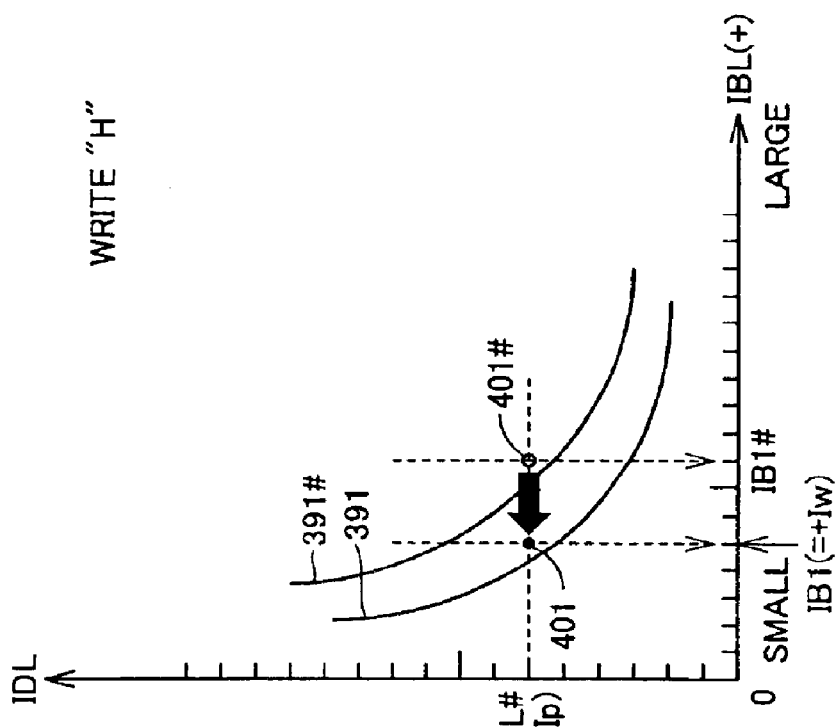
Figure 29B:
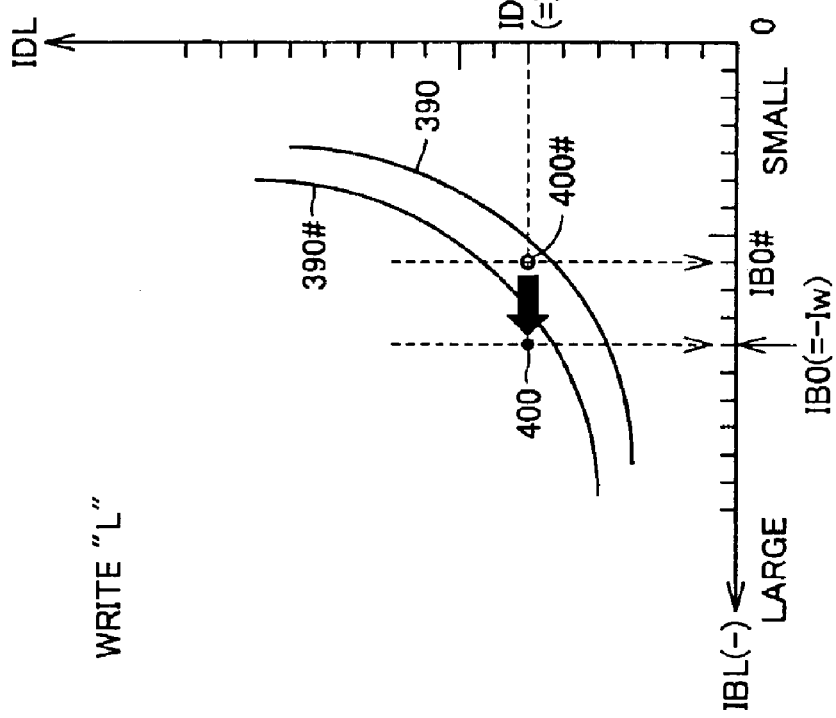

FIGS. 29A and 29B show the situations of FIGS. 28A and 28B in more detail.

FIG. 29A shows asteroid characteristic line 390# as designed (FIG. 28A) and actual asteroid characteristic line 390 (FIG. 28B) in the range of IBL<0, i.e., at the time of the L level data write. As the asteroid characteristic line is displaced from the one as designed, the operating point at the time of the L level data write is also adjusted from operating point 400# as designed to actual operating point 400. That is, the bit line current corresponding to data write current −Iw is adjusted from a designed value IB0# to a value IB0.

Similarly, FIG. 29B shows asteroid characteristic line 391# as designed (FIG. 28A) and actual asteroid characteristic line 391 (FIG. 28B) in the range of IBL>0, i.e., at the time of the H level data write. Since the asteroid characteristic line is deviated from what is designed, actual operating point 401 at the time of the H level data write is adjusted to become different from operating point 401# as designed. That is, the bit line current corresponding to data write current +Iw is adjusted from a designed value IB1# to a value IB1.

In the case shown in FIGS. 28A, 28B, 29A and 29B, it is necessary to adjust the bit line current at the time of the L level data write to be greater than designed value IB0# (|IB0|>|IB0#|), and the bit line current at the time of the H level data write to be smaller than designed value IB1# (|IB1|<|IB1#|). That is, in the fifth embodiment, while digit line current IDL corresponding to data write current Ip is fixed to a designed value IDL#, the magnitude (absolute value) of bit line current IBL is adjusted to differ in writing of L level data and in writing of H level data.

A configuration of the MRAM device permitting adjustment of the operating points as shown in FIGS. 29A, 29B is now described.

Figure 30:
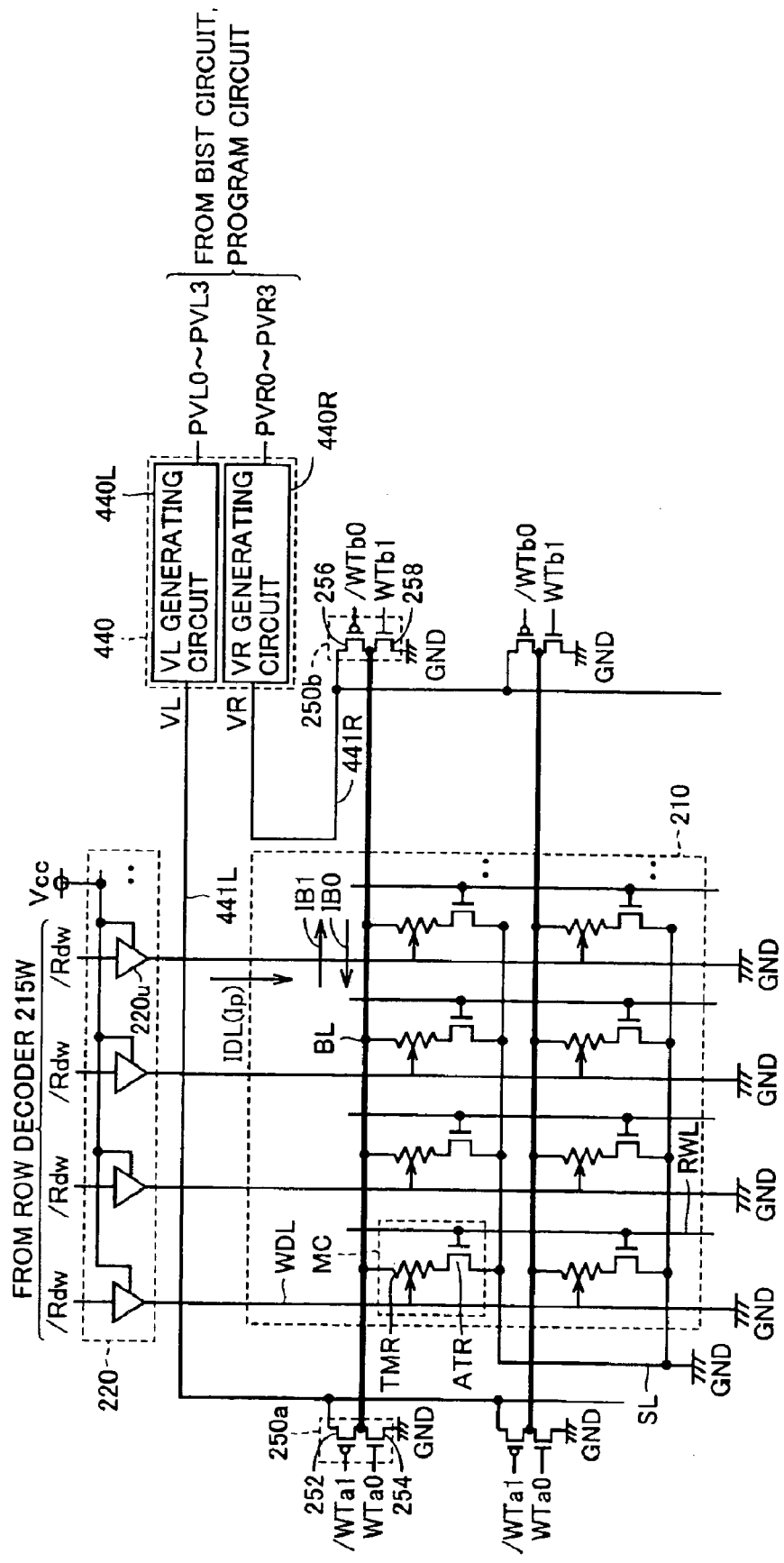
FIG. 30 is a block diagram showing a configuration of the MRAM device according to the fifth embodiment.

Referring to FIG. 30, the MRAM device according to the fifth embodiment includes a memory cell array 210 having a plurality of memory cells MC arranged in rows and columns, write digit lines WDL and read word lines RWL provided corresponding to the respective rows of memory cells MC, bit lines BL provided corresponding to the respective columns of memory cells MC, bit line drivers 250a, 250b provided for each bit line BL, and a write digit line drive circuit 220, as in the case of the MRAM device according to the third embodiment described in conjunction with FIGS. 14 and 18.

Although not shown, the MRAM device of the fifth embodiment further includes row decoders 215R, 215W as shown in FIG. 14, and data write circuit 251 and the data read configuration as shown in FIG. 18, again as in the case of the MRAM device of the third embodiment. These elements of the MRAM device of the fifth embodiment are the same as those of the third embodiment, and therefore, detailed description thereof is not repeated here.

Write digit line drive circuit 220 has drive units 220u provided for respective write digit lines WDL. Each drive unit 220u corresponds to driver transistor 222 shown in FIG. 14, and is supplied with power supply voltage Vcc. Drive unit 220u in a selected row responds to a row decode signal /Rdw from row decoder 215W, which is generated for each row, to drive one end of corresponding write digit line WDL to power supply voltage. Vcc. Thus, current IDL corresponding to data write current Ip is passed through write digit line WDL of the selected row.

The MRAM device according to the fifth embodiment further includes a voltage control circuit 440 and internal voltage interconnections 441R, 441L. Voltage control circuit 440 includes a VL generating circuit 440L and a VR generating circuit 440R which generate and provide separate internal voltages VL and VR to internal voltage interconnections 441L and 441R, respectively.

The configuration of VL generating circuit 440L may be made similar to that of internal voltage control circuit 40 shown in FIG. 4 by properly setting an object voltage Vtrg in the expression (2) described in the first embodiment. That is, internal voltage VL generated by VL generating circuit 440L may be set in steps in accordance with adjustment signals PVL0–PVL3. Similarly, the configuration of VR generating circuit 440R may be made the same as that of internal voltage control circuit 40 shown in FIG. 4 by properly setting the object voltage Vtrg in the expression (2). That is, internal voltage VR generated by VR generating circuit 440R may be set stepwise in accordance with adjustment signals PVR0–PVR3. As such, voltage control circuit 440 can control internal voltages VR and VL independently from each other. Adjustment signals PVL0–PVL3 and PVR0–PVR3 may be provided from the BIST circuit in a test mode and from the program circuit in an actual operation, as in the case of adjustment signals P0–P3 explained previously.

Internal voltage interconnection 441L is connected to the source of driver transistor (P-MOS transistor) 252 within each bit line driver 250a. Similarly, internal voltage interconnection 441R is connected to the source of driver transistor (P-MOS transistor) 256 within each bit line driver 250b. As such, it is possible to set a source voltage being applied to each driver transistor 252 and a source voltage being applied to each driver transistor 256 independently from each other, since adjustment signals PVL0–PVL3 for VL generating circuit 440L and adjustment signals PVR0–PVR3 for VR generating circuit 440R are provided separately from each other.

At the time of H level data write, bit line current IB1 corresponding to data write current +Iw flows on bit line BL by means of driver transistors 252 and 258. That is, the level of bit line current IB1 changes in accordance with the source voltage of each driver transistor 252. On the other hand, at the time of L level data write, driver transistors 256 and 254 cause bit line current IB0 corresponding to data write current −Iw to flow on bit line BL. That is, the level of bit line current IB0 changes in accordance with the source voltage of each driver transistor 256. Thus, the above-described configuration enables the adjustment to make bit line current IB1 at the time of H level data write different in size from bit line current IB0 at the time of L level data write.

In the MRAM device according to the fifth embodiment, a data write test is carried out in a test mode with respect to some or all of memory cells MC within memory cell array 210, by changing adjustment signals PVL0–PVL3, PVR0–PVR3 stepwise by the BIST circuit. Thus, internal voltages VR and VL for causing flow of bit line currents IB0 and IB1 corresponding to adjusted operating points 400 and 401 shown in FIGS. 28B and 29B can be obtained. Adjustment signals PVL0–PVL3, PVR0–PVR3 for achieving internal voltages VL and VR obtained in the test mode are stored in the program circuit. In an actual operation, these adjustment signals PVL0–PVL3, PVR0–PVR3 stored in the program circuit are used to generate internal voltages VR and VL. Accordingly, it is possible to write data of an L level and an H level by bit line currents IB0 and IB1 corresponding to adjusted operating points 400 and 401.

In other words, voltage control circuit 440 functions as the "first current adjust portion" which can adjust the current amounts to be flown by driver transistors 252 and 256 respectively driving the bi-directional bit line currents, independently from each other.

As described above, according to the MRAM device of the fifth embodiment, even in the case where an actually produced MTJ memory cell suffers asymmetry in data write characteristics as shown in FIG. 28B, the bit line current can be adjusted as appropriate in accordance with data to be written, so that stable data write is ensured.

Sixth Embodiment

In the fifth embodiment, the asymmetry of data write characteristics as shown in FIG. 28B has been addressed by adjusting an operating point at the time of data write with adjustment of only bit line current IBL, with digit line current IDL being fixed. In the sixth embodiment, a configuration for adjusting both bit line current IBL and digit line current IDL is explained.

Figure 31A:
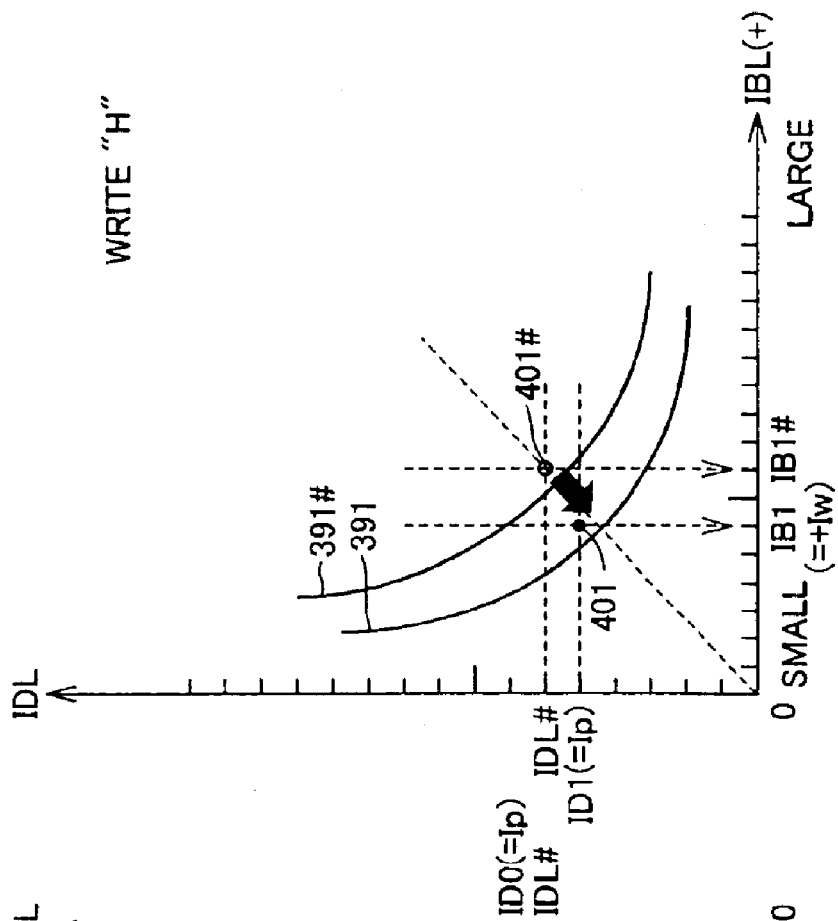
FIGS. 31A and 31B are conceptual diagrams illustrating adjustment of a data write current according to a sixth embodiment of the present invention.
Figure 31B:
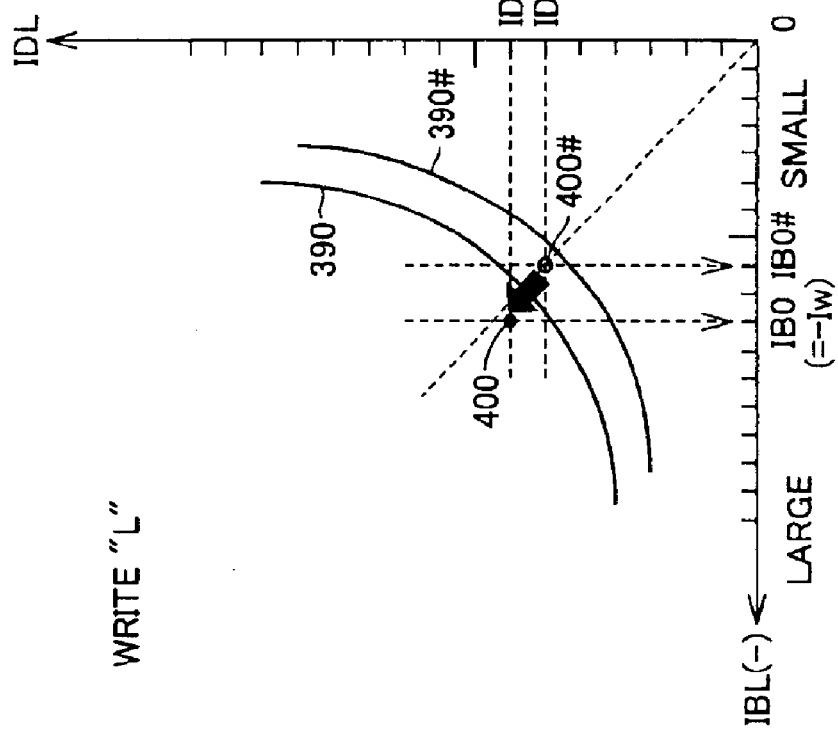

FIGS. 31A and 31B are conceptual diagrams illustrating adjustment of the data write current according to the sixth embodiment.

Comparing FIG. 31A with FIG. 29A, in the sixth embodiment, operating point 400 at the time of L level data write is determined by adjusting both bit line current IBL and digit line current IDL. The bit line current corresponding to data write current −Iw is adjusted from designed value IB0# to a value IB0, and the digit line current corresponding to data write current Ip is adjusted from designed value IDL# to a value ID0.

Similarly, comparing FIG. 31B with FIG. 29B, operating point 401 at the time of H level data write is determined by adjusting both bit line current IBL and digit line current IDL. The bit line current corresponding to data write current +Iw is adjusted from designed value IB1# to a value IB1, and the digit line current corresponding to data write current Ip is adjusted from designed value IDL# to a value ID1.

Figure 32:
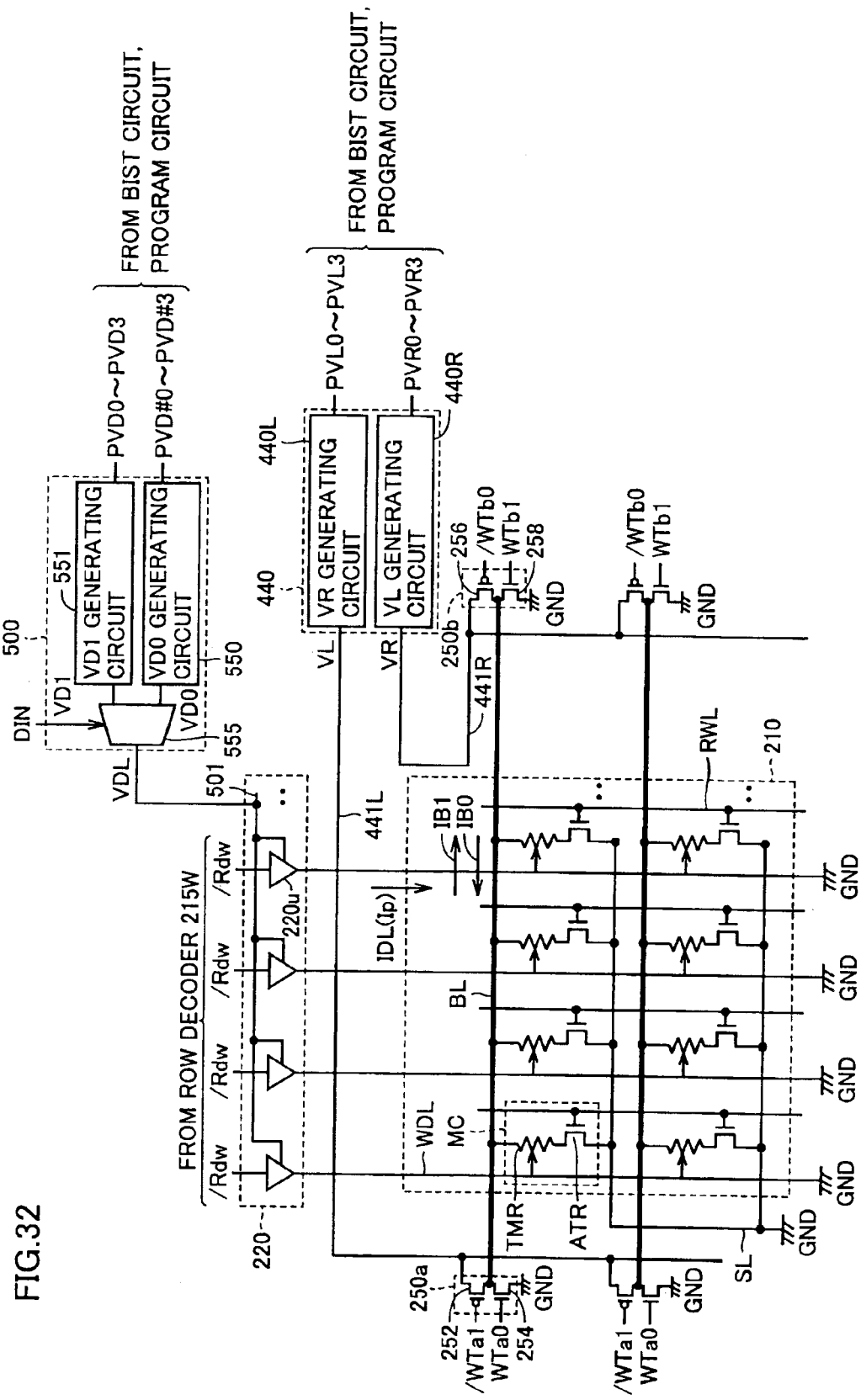
FIG. 32 is a block diagram showing a configuration of the MRAM device according to the sixth embodiment.

Referring to FIG. 32, compared to the MRAM device of the fifth embodiment shown in FIG. 30, the MRAM device according to the sixth embodiment further includes a voltage control circuit 500 and an internal voltage interconnection 501. In addition, each drive unit 220u in write digit line drive circuit 220 is driven by an internal voltage VDL on internal voltage interconnection 501. That is, in the MRAM device according to the sixth embodiment, the P-MOS transistor being the driver transistor 222 (not shown) constituting drive unit 220u has its source connected to internal voltage interconnection 501.

Otherwise, the configuration of the MRAM device of the present embodiment is identical to that of the MRAM device of the fifth embodiment, and therefore, detailed description thereof is not repeated.

Voltage control circuit 500 includes a VD0 generating circuit 550 and a VD1 generating circuit 551 generating independent internal voltages VD0 and VD1, respectively, and a selector 555.

VD0 generating circuit 550 and VD1 generating circuit 551 may each have a configuration identical to that of internal voltage control circuit 40 shown in FIG. 4, similarly to VL generating circuit 440L and VR generating circuit 440R described in conjunction with FIG. 30. Thus, internal voltage VD0 generated by VD0 generating circuit 550 may be set in steps in accordance with adjustment signals PVD#0–PVD#3, and internal voltage VD1 generated by VD1 generating circuit 551 may be set in steps in accordance with adjustment signals PVD0–PVD3. As such, internal voltages VD0 and VD1 are controlled by voltage control circuit 550 independently from each other. Adjustment signals PVD#0–PVD#3 and PVD0–PVD3 may be provided from the BIST circuit in a test mode and from the program circuit in an actual operation, as in the case of adjustment signals P0–P3 described previously.

Selector 555 provides one of internal voltage VD0 from VD0 generating circuit 550 and internal voltage VD1 from VD1 generating circuit 551 to internal voltage interconnection 501 as internal voltage VDL, in accordance with the level of write data DIN. That is, selector 555 applies internal voltage VD0 when write data DIN is at an L level, or internal voltage VD1 when write data DIN is at an H level, to the source of the P-MOS transistor constituting drive unit 220u.

Thus, when write data DIN is at an L level, digit line current IDL (ID0) is provided to write digit line WDL of a selected row by the P-MOS transistor having received internal voltage VD0 as its source voltage. On the other hand, when write data DIN is at an H level, the P-MOS transistor having received internal voltage VD1 as its source voltage provides digit line current IDL (ID1) to write digit line WDL of the selected row.

That is, voltage control circuit 500 functions as the "second current adjust portion" which adjusts the current amount to be flown by driver transistor 222 driving the digit line current in a prescribed direction.

In the MRAM device according to the sixth embodiment, in the data write test in the test mode, adjustment signals PVD#0–PVD#3, PVD0–PVD3 for adjustment of the digit line current are changed stepwise by the BIST circuit, in addition to adjustment signals PVL0–PVL3, PVR0–PVR3 for adjustment of the bit line current described in the fifth embodiment. Thus, it is also possible to obtain internal voltages VD0 and VD1 for causing flow of digit line currents ID0 and ID1 corresponding to adjusted operating points 400 and 401. Adjustment signals PVL0–PVL3, PVR0–PVR3 and PVD#0–PVD#3, PVD0–PVD3 obtained in the test mode are stored in the program circuit.

In an actual operation, these adjustment signals stored in the program circuit are used to generate internal voltages VR, VL, VD0 and VD1. Accordingly, it is possible to perform data write of an L level and an H level by bit line currents IB0, IB1 and digit line currents ID0, ID1 corresponding to adjusted operating points 400 and 401.

As described above, according to the MRAM device of the sixth embodiment, it is possible to address the asymmetry in data write characteristics of an actually produced MTJ memory cell to improve a data write margin, as in the case of the MRAM device of the fifth embodiment. In particular, adjustment of both bit line current IBL and digit line current IDL improves the degree of freedom in adjustment of an actual operating point at the time of data write.

Modification of Sixth Embodiment

In a modification of the sixth embodiment, a configuration of an efficiently configured current control circuit 510 which can replace voltage control circuit 500 shown in FIG. 32 for the purpose of supplying digit line currents IDL of different levels is described. That is, current control circuit 510 has the same function as voltage control circuit 500 in terms of supply of the digit line current.

Figure 33:
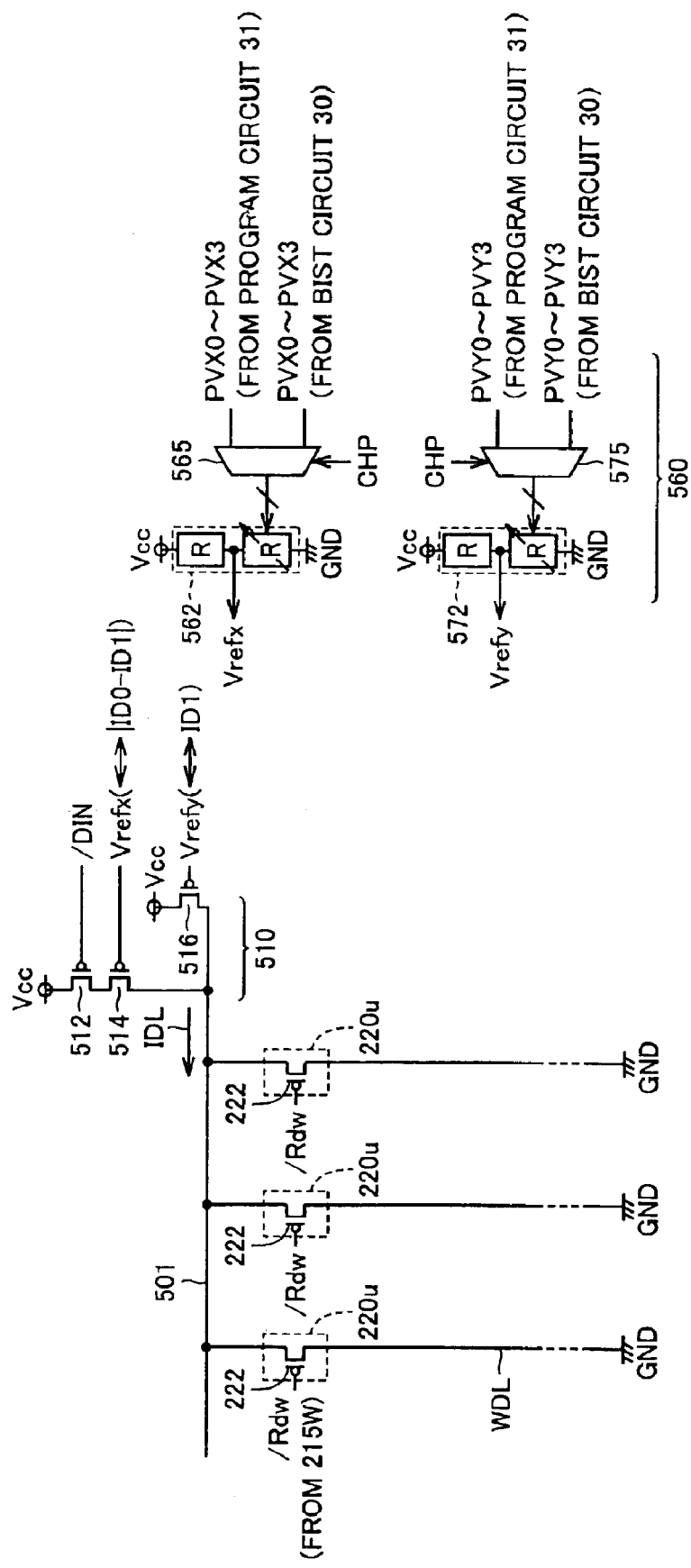
FIG. 33 is a circuit diagram showing a configuration of the current control circuit for adjusting a digit line current according to a modification of the sixth embodiment.

FIG. 33 is a circuit diagram showing a configuration of current control circuit 510 for adjusting the digit line current according to the modification of the sixth embodiment.

Referring to FIG. 33, current control circuit 510 has P-MOS transistors 512, 514 connected in series between power supply voltage Vcc and internal voltage interconnection 501, and a P-MOS transistor 516 connected in parallel with transistors 512, 514 between power supply voltage Vcc and internal voltage interconnection 501.

Transistor 512 has its gate receiving inverted write data /DIN, and transistors 514 and 516 have their gates receiving reference voltages Vrefx and Vrefy, respectively, generated by a reference voltage generating circuit 560. That is, transistor 512 operates as a switch element which is controlled to turn on/off in accordance with inverted write data /DIN. Transistors 514 and 516 operate as the current supply portion which supplies currents corresponding to respective reference voltages Vrefx and Vrefy.

The configuration of the MRAM device according to the modification of the sixth embodiment is identical to that of the MRAM device of the sixth embodiment, except that voltage control circuit 500 shown in FIG. 32 is replaced with current control circuit 510 shown in FIG. 33. Specifically, driver transistor (P-MOS transistor) 222 constituting drive unit 220u has its source connected to internal voltage interconnection 501, and digit line current IDL supplied from current control circuit 510 via internal voltage interconnection 501 is passed through write digit line WDL of a selected row by driver transistor 222.

Reference voltage generating circuit 560 has a voltage-divider circuit 562 and a selector circuit 565 for generating reference voltage Vrefx, and a voltage-divider circuit 572 and a selector circuit 575 for generating reference voltage Vrefy. Voltage-divider circuits 562 and 572 each have the same configuration as voltage-divider circuit 46 described in conjunction with FIGS. 4 and 5. Selector circuits 565 and 575 each have the same configuration as selector circuit 50 shown in FIG. 4.

Thus, reference voltage Vrefx can be adjusted stepwise in accordance with adjustment signals PVX0–PVX3, which may be input from both BIST circuit 30 and program circuit 31 in the same manner as explained in conjunction with FIG. 4. Selector circuit 565 responds to switch signal CHP from BIST circuit 30, and supplies adjustment signals PVX0–PVX3 from BIST circuit 30 to voltage-divider circuit 562 in a test mode. During actual operations other than the test mode, selector circuit 565 supplies adjustment signals PVX0–PVX3 from program circuit 31 to voltage-divider circuit 562.

Similarly, reference voltage Vrefy can be adjusted stepwise in accordance with adjustment signals PVY0–PVY3. Adjustment signals PVY0–PVY3 may be input from both BIST circuit 30 and program circuit 31, as in the case of adjustment signals PVX0–PVX3. Selector circuit 575 responds to switch signal CHP and supplies adjustment signals PVY0–PVY3 from BIST circuit 30 to voltage-divider circuit 572 in a test mode. During actual operations other than the test mode, it supplies adjustment signals PVY0–PVY3 from program circuit 31 to voltage-divider circuit 572.

In current control circuit 510, transistor 516 supplies a current corresponding to reference voltage Vrefy to internal voltage interconnection 501, irrelevant to the level of the write data. On the other hand, the current supply from transistor 514 to internal voltage interconnection 501 is carried out or stopped in accordance with the level of write data DIN by transistor 512 acting as a switch.

The configuration shown in FIG. 33 corresponds to the case where ID0>ID1 as shown in FIGS. 31A and 31B, i.e., the case where the digit line current is adjusted to increase when writing data of an L level. Thus, at the time of the L level data write, transistor 512 is turned on, and a sum of supply currents of transistors 514 and 516 is provided to write digit line WDL of a selected row via internal voltage interconnection 501 and driver transistor 222. On the other hand, at the time of the H level data write, transistor 512 is turned off, and thus, only the supply current of transistor 516 is provided to write digit line WDL of a selected row via internal voltage interconnection 501 and driver transistor 222.

As such, reference voltage Vrefy is set to correspond to a gate voltage for causing transistor 516 to supply the smaller digit line current ID1. By comparison, reference voltage Vrefx is set to correspond to a gate voltage for causing transistor 514 to supply a difference of the digit line currents at the times of H level data write and L level data write, i.e., |ID0–ID1|.

In other words, in current control circuit 510, one of the digit line currents IDL set for the respective levels of the write data, and a difference current between the larger one and the smaller one of the digit line currents IDL, are adjusted by adjustment signals PVX0–PVX3, PVY0–PVY3. The level of reference voltage Vrefx is set such that transistor 514 is turned off in the case where there occurs no deviation in the data write characteristics or the asteroid characteristic lines and thus there is no difference in digit line currents IDL at the times of H level data write and L level data write.

With such a configuration, the current switched according to the level of write data DIN becomes small. Accordingly, it is possible to reduce an error in setting of digit line current IDL attributable to the impedance of the switch element (transistor 512), and to further stabilize the data write.

In other words, the configuration of FIG. 33, which adjusts the difference current, may be replaced with a configuration where digit line currents ID0 and ID1 are adjusted separately and the parallel supplying paths of digit line currents ID0 and ID1 are provided with switch elements which turn on/off complimentarily with each other in accordance with write data DIN. Such a configuration, however, is likely to suffer a setting error of digit line current due to the impedance of the switch elements, since currents of large amounts would be passed through the switch elements.

Further, the current control circuit shown in FIG. 33 may be configured such that non-switched transistor 516 supplies the larger digit line current (ID0) and, upon turning on of transistor 512 as the switch element, a difference of supply currents of transistors 514 and 516 is provided to internal voltage interconnection 501. In this case, transistors 512 and 514 need to be arranged such that the supply current of transistor 514 is drawn from the current path from transistor 516 to internal voltage interconnection 501 in response to the turning on of transistor 512.

The current control circuit adjusting a difference current as shown in FIG. 33 may be applied to adjustment of a bit line current.

Figure 34:
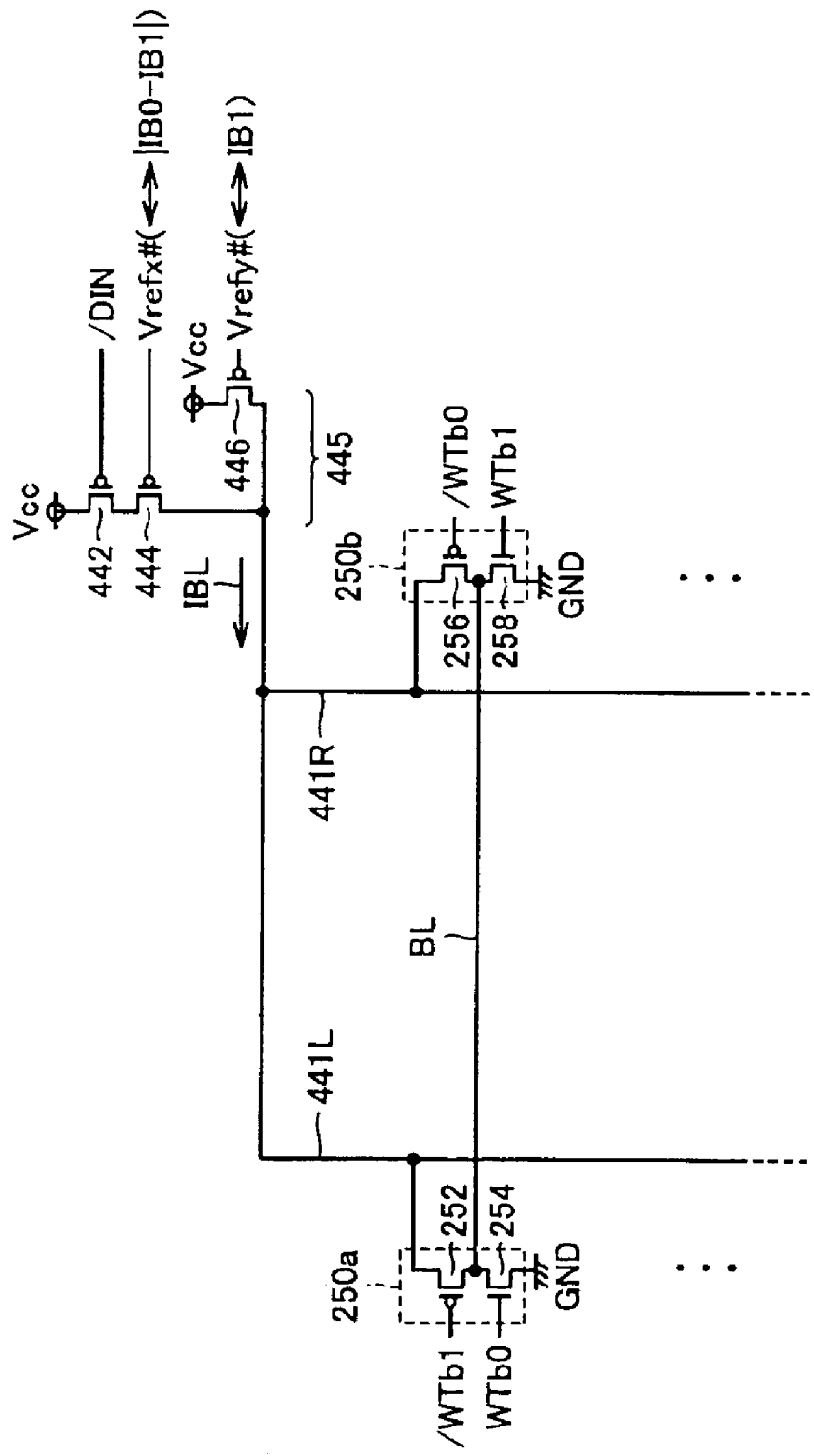
FIG. 34 is a circuit diagram showing a configuration of the current control circuit for adjusting a bit line current according to the modification of the sixth embodiment.

FIG. 34 is a circuit diagram showing a configuration of a current control circuit 445 for adjustment of a bit line current according to the modification of the sixth embodiment. Current control circuit 445 may be applied to the MRAM devices shown in FIGS. 30 and 32 in place of voltage control circuit 440. Further, internal voltage interconnections 441L and 441R are connected to each other, and receive supply of bit line current IBL from current control circuit 445.

Referring to FIG. 34, current control circuit 445 has P-MOS transistors 442, 444 connected in series between power supply voltage Vcc and internal voltage interconnections 441L, 441R and a P-MOS transistor 446 connected in parallel with transistors 442 and 444 between power supply voltage Vcc and internal voltage interconnections 441L, 441R. Transistor 442 has its gate receiving inverted write data /DIN. Transistors 444 and 446 have their gates receiving reference voltages Vrefx# and Vrefy#. Reference voltages Vrefx# and Vrefy# are generated in the same manner as reference voltages Vrefx and Vrefy in FIG. 33.

In current control circuit 445, bit line current IBL is supplied only by transistor 446 when the write data is at an H level. When the write data is at an L level, bit line current IBL is supplied by a sum of supply currents of transistors 444 and 446.

Thus, reference voltage Vrefy# is adjusted to correspond to a gate voltage for causing transistor 446 to supply the smaller bit line current IB1 (FIG. 29B). On the other hand, reference voltage Vrefx# is adjusted to correspond to a gate voltage for causing transistor 444 to supply a difference of bit line currents at the times of H level data write and L level data write, i.e., |IB0–IB1|.

As such, current control circuit 445 having the same configuration as current control circuit 501 of FIG. 33 makes it possible to adjust bit line current IBL at the time of data write to different levels in accordance with the write data. That is, current control circuit 440 has the same function as voltage control circuit 400 in terms of supply of the bit line current. Accordingly, it is possible to improve the setting precision of bit line current IBL at the time of data write, as described in conjunction with FIG. 33, to further stabilize the data write.

The current control circuit shown in FIG. 34 may be configured such that the larger bit line current (IB0) is supplied by non-switched transistor 446, and a difference of supply currents of transistors 444 and 446 is supplied to internal voltage interconnection 501 upon turning on of transistor 442 as the switch element. In this case, transistors 442, 444 may be arranged such that the supply current of transistor 444 is drawn from the current path from transistor 446 to internal voltage interconnections 441R, 441L in response to the turning on of transistor 442.

Seventh Embodiment

In the seventh embodiment, adjustment of a data write current in the case where each MTJ memory cell is designed in an asymmetrical shape is described.

Figure 35:
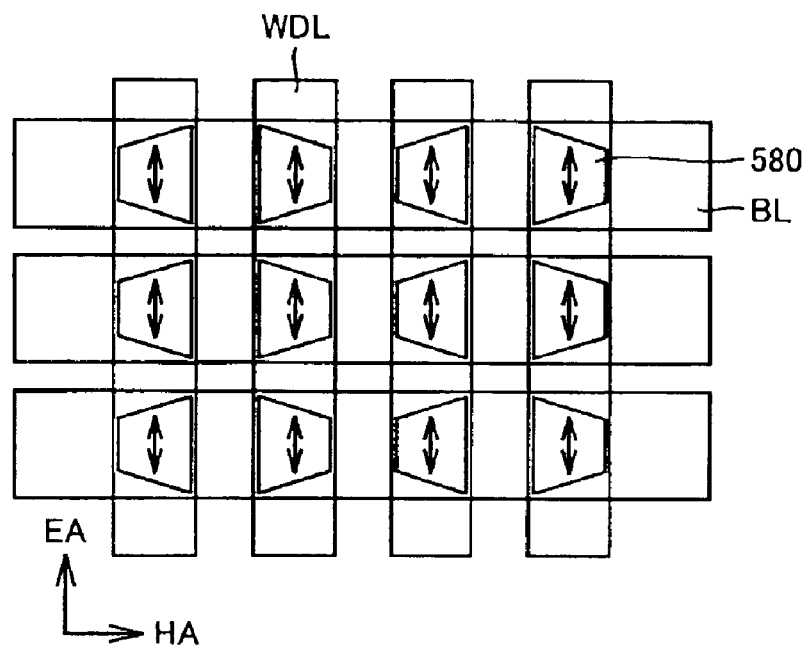
FIG. 35 illustrates a first example of an asymmetrical memory cell having an asymmetrical tunneling magneto-resistance element.
Figure 36:
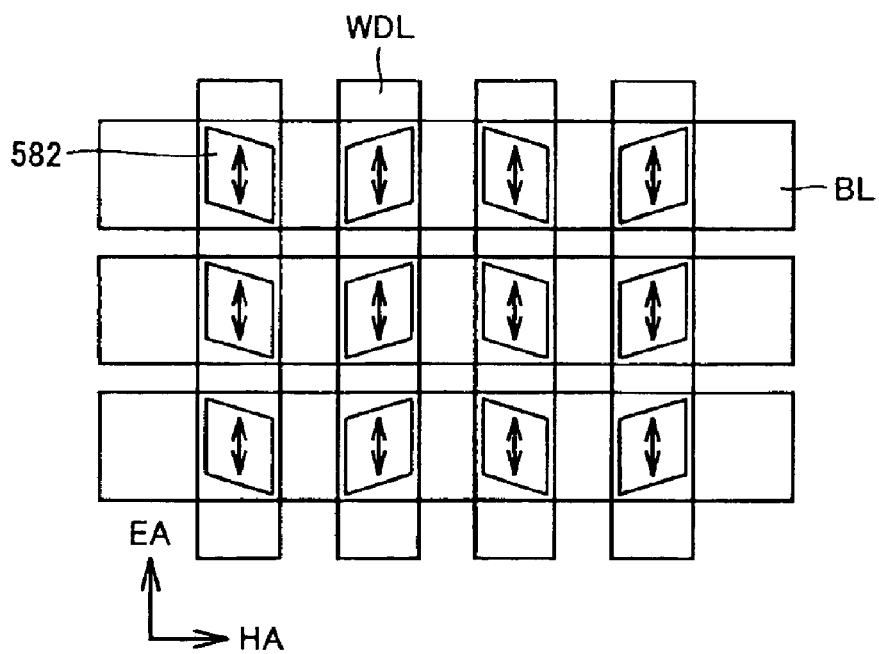
FIG. 36 illustrates a second example of the asymmetrical memory cell.

FIGS. 35 and 36 are conceptual diagrams illustrating examples of asymmetrical memory cells provided with asymmetrical tunneling magneto-resistance elements TMR. FIG. 35 shows an asymmetrical memory cell 580 having a tunneling magneto-resistance element of a trapezoid shape. FIG. 36 shows an asymmetrical memory cell 582 having a tunneling magneto-resistance element of a parallelogram shape.

The asymmetrical memory cells as shown in FIGS. 35 and 36 may be applied along with advancement of downsizing of the memory cells. As the memory cells are downsized, micromachining of the respective memory cells becomes difficult. Thus, symmetrically formed memory cells (tunneling magneto-resistance elements) are halved along write digit lines WDL to obtain respective MTJ memory cells. As a result, each MTJ memory cell (tunneling magneto-resistance element) has a shape asymmetrical with respect to an axis extending along write digit line WDL, and such asymmetrical memory cells of two kinds of shapes are arranged alternately in every other row over the entire memory cell array.

Figure 37:
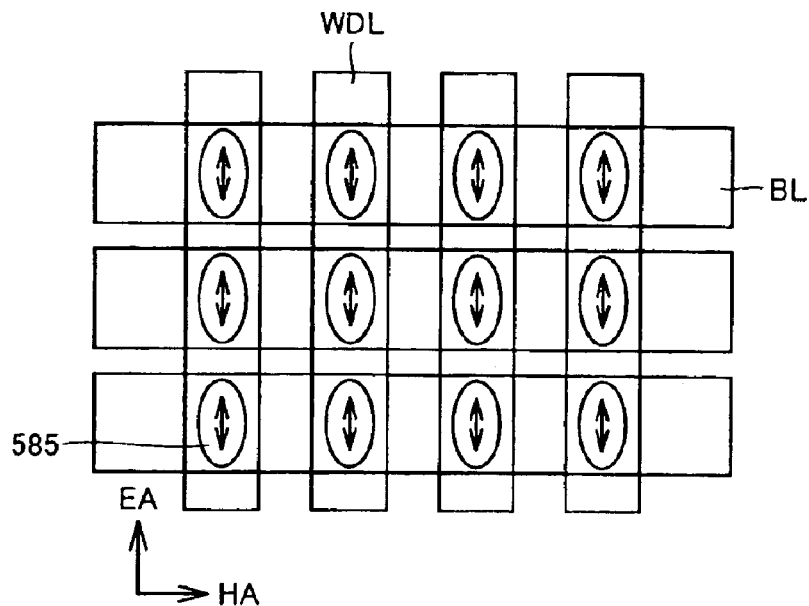
FIG. 37 illustrates an example of a symmetrical memory cell.

FIG. 37 shows, for the purpose of comparison, a symmetrical memory cell 585 having a tunneling magneto-resistance element of a shape symmetrical with respect to an axis extending along write digit line WDL.

Figure 38A:
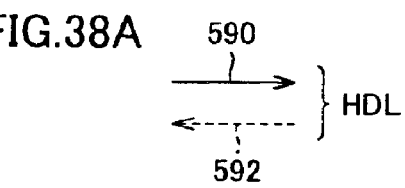
FIGS. 38A and 38B are conceptual diagrams comparing magnetization characteristics of the symmetrical and asymmetrical memory cells.
Figure 38A:
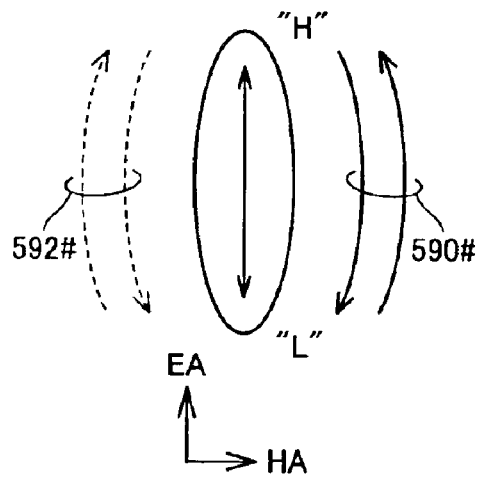
Figure 38B:
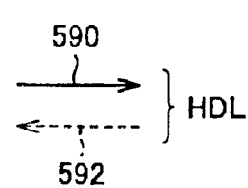
Figure 38B:
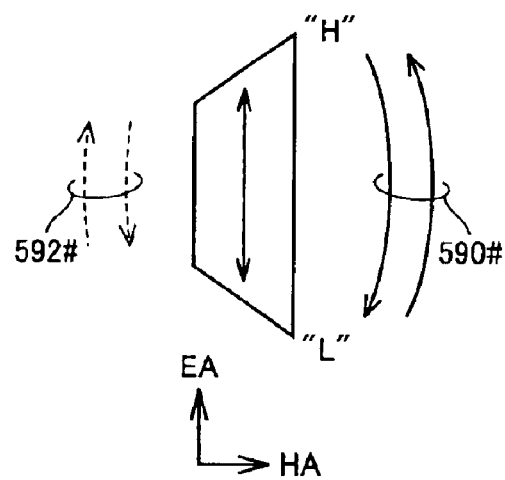

FIGS. 38A and 38B are conceptual diagrams for comparison in magnetization characteristics of the symmetrical memory cell and the asymmetrical memory cell.

Referring to FIG. 38A, in the case where magnetic field HDL along hard axis HA is in a direction shown by a reference number 590, data write is carried out by inverting the magnetization direction along easy axis EA as shown by a reference number 590#. On the other hand, when magnetic field HDL along hard axis HA is in a direction shown by a reference number 592, the magnetization direction along easy axis EA is inverted as shown by a reference number 592# to write data. In the case of a symmetrical memory cell, the tunneling magneto-resistance element has its shape symmetrical with respect to an axis (i.e., the easy axis) along write digit line WDL. Therefore, threshold values for the inversions of the magnetization directions shown by 590# and 592# become the same level.

By comparison, as shown in FIG. 38B, in the case of an asymmetrical memory cell of which tunneling magneto-resistance element has a shape asymmetrical with respect to the easy axis, it is assumed that the threshold values for the inversions of the magnetization directions shown by 590# and 592# become different levels. As such, in the asymmetrical memory cell, the threshold value for the inversion of the magnetization direction changes in accordance with the relation between magnetic field HDL and the shape of the memory cell. For example, in the case of asymmetrical memory cell 580 of a trapezoid shape, when magnetic field HDL is applied in a direction from the long side toward the short side of the asymmetrical memory cell, it is expected that the magnetic domain is likely to be inverted, so that the threshold value becomes relatively small. On the other hand, when magnetic field HDL is applied in a direction from the short side toward the long side of the asymmetrical memory cell, the magnetic domain is unlikely to be inverted, and therefore, the threshold value becomes relatively large.

Figure 39B:
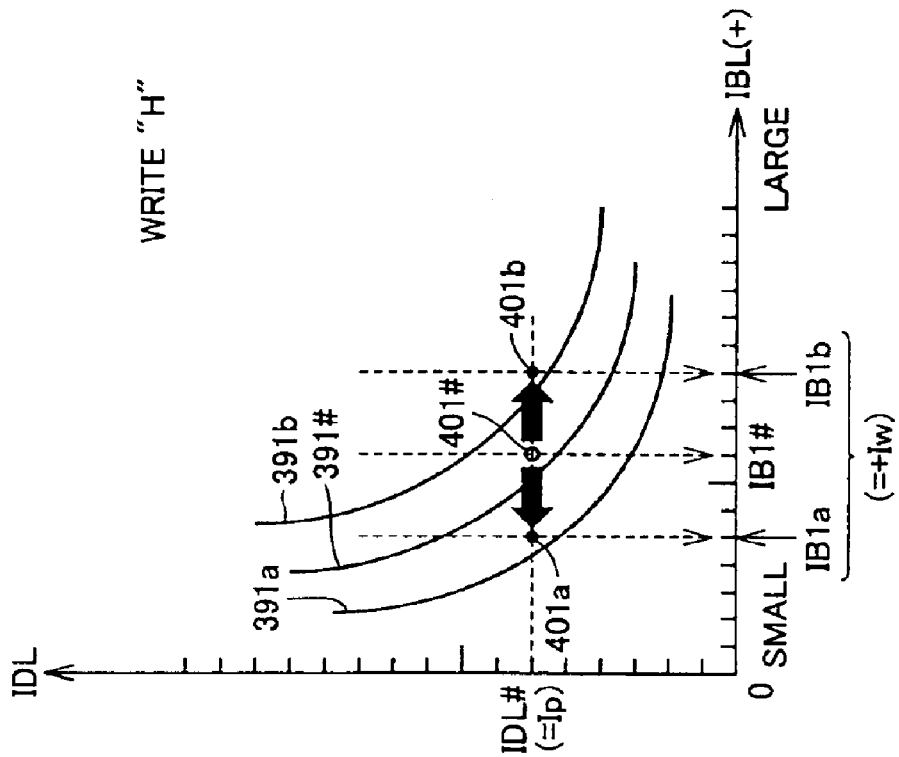
FIGS. 39A and 39B are conceptual diagrams illustrating the data write characteristics of the asymmetrical memory cell and the corresponding adjustment of the data write current.
Figure 39A:
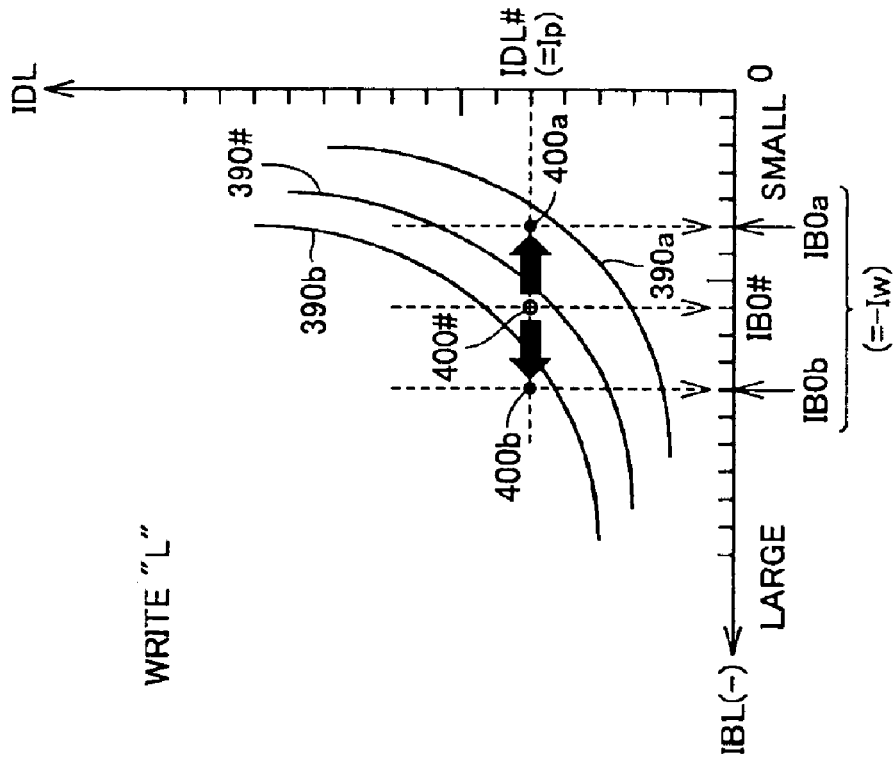

FIGS. 39A and 39B are conceptual diagrams illustrating such data write characteristics of the asymmetrical memory cell and adjustment of the data write current corresponding thereto.

In FIGS. 39A and 39B, asteroid characteristic lines 390a, 391a, and 390b, 391b of an asymmetrical memory cell are shown, which are compared with asteroid characteristic lines 390# and 391# of a symmetrical memory cell as the reference. The data write characteristics of the asymmetrical memory cell when magnetic field HDL is applied in a direction where the magnetic domain is likely to be inverted (corresponding to 592# in FIG. 38B) are shown by asteroid characteristic lines 390a, 391a. The data write characteristics when magnetic field HDL is applied in a direction where inversion of the magnetic domain is unlikely to occur (corresponding to 590# in FIG. 38B) are shown by asteroid characteristic lines 390b, 391b.

As such, when writing data to an asymmetrical memory cell, it is necessary to use either operating points 400a, 401a or operating points 400b, 401b, which are different from operating points 400# and 401# upon data write to a symmetrical memory cell, in accordance with the relation between the arranged direction of the memory cell and the direction of magnetic field HDL. In particular, when the direction of digit line current IDL is fixed, the data write should be conducted at operating points 400a, 401a or at operating points 400b, 401b, for every other write digit line WDL, i.e., for every other row.

In a memory cell row corresponding to operating points 400a, 401a, it is necessary to adjust bit line current IBL to IB0a, IB1a having smaller absolute values than bit line currents IB0#, IB1# corresponding to operating points 400#, 401#. On the other hand, in a memory cell row corresponding to operating points 400b, 401b, it is necessary to adjust bit line current IBL to IB0b, IB1b having larger absolute values than IB0#, IB1#. In contrast, in each of operating points 400#, 401#, 400a, 401a, 400b and 401b, digit line current IDL is fixed to IDL# in the same direction and of the same level.

In the seventh embodiment, asymmetry of the asteroid characteristic lines with respect to the IDL axis (vertical axis) as in the fifth embodiment (FIGS. 28A, 28B) is not assumed. That is, |IB0a|=|IB1a| and |IB0b|=|IB1b| stand among the bit line currents.

Thus, in the MRAM device provided with asymmetrical memory cells having the data write characteristics as shown in FIGS. 39A and 39B, it is necessary to adjust the magnitude of bit line current IBL to different levels in accordance with the arranged direction of the asymmetrical memory cell as a target of data write. When the asymmetrical memory cells are arranged in different directions alternately for every other row as shown in FIGS. 35 and 36, the arranged direction of the asymmetrical memory cell as a target of data write can be identified by the row address, or more particularly, by the least significant bit indicating whether an even row or an odd row was selected.

If the magnitude of bit line current IBL cannot be adjusted in accordance with the arranged direction of the asymmetrical memory cell, then it is necessary to perform the overall data write to satisfy the condition requiring a relatively large bit line current (operating points 400b, 401b in FIGS. 39A, 39B). In this case, however, an excessive bit line current would flow in the condition requiring a relatively small bit line current (operating points 400a, 401a in FIGS. 39A, 39B). This leads to an increase of magnetic noise to non-selected memory cells and degradation in stability of the data write operation, and thus, a data write margin cannot be guaranteed.

Figure 40:
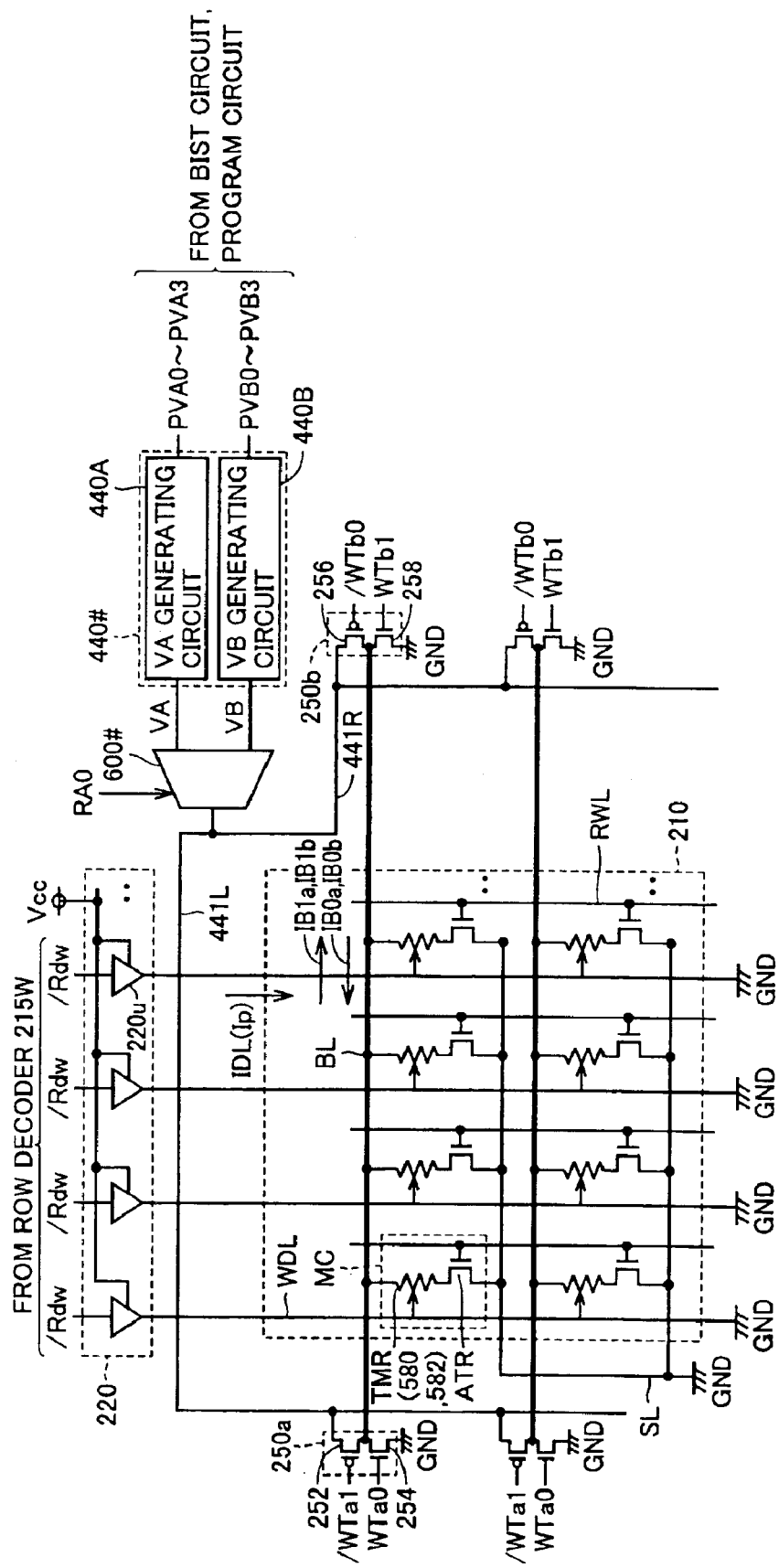
FIG. 40 is a block diagram showing a configuration of the MRAM device according to a seventh embodiment of the present invention.

Referring to FIG. 40, the MRAM device according to the seventh embodiment differs from the MRAM device shown in FIG. 30 in that it includes a voltage control circuit 440# instead of voltage control circuit 440 and it further includes a selector 600#. Further, internal voltage interconnections 441L and 441R are connected to each other to transmit a common internal voltage. Otherwise, the configuration of the MRAM device of the seventh embodiment is identical to that of the MRAM device shown in FIG. 30, and thus, detailed description thereof is not repeated.

Voltage control circuit 440# includes a VA generating circuit 440A and a VB generating circuit 440B which generate independent internal voltages VA and VB, respectively. The configuration of internal voltage control circuit 40 shown in FIG. 4 may be applied to each of VA generating circuit 440A and VB generating circuit 440B, as in the case of the VL generating circuit 440L and VR generating circuit 440R.

Thus, internal voltage VA generated by VA generating circuit 440A can be set in steps in accordance with adjustment signals PVA0–PVA3, and internal voltage VB generated by VB generating circuit 440B can be set in steps in accordance with adjustment signals PVB0–PVB3. As such, internal voltages VA and VB are controlled by voltage control circuit 440# independently from each other. Adjustment signals PVA0–PVA3 and PVB0–PVB3 may be provided from the BIST circuit in a test mode and from the program circuit in an actual operation, as in the case of adjustment signals P0–P3 described previously.

Selector 600# is provided between voltage control circuit 440# and internal voltage interconnections 441L, 441R. Selector 600# supplies one of internal voltage VA from VA generating circuit 440A and internal voltage VB from VB generating circuit 440B to both internal voltage interconnections 441L and 441R in accordance with the least significant bit RA0 of the row address.

Figure 41:
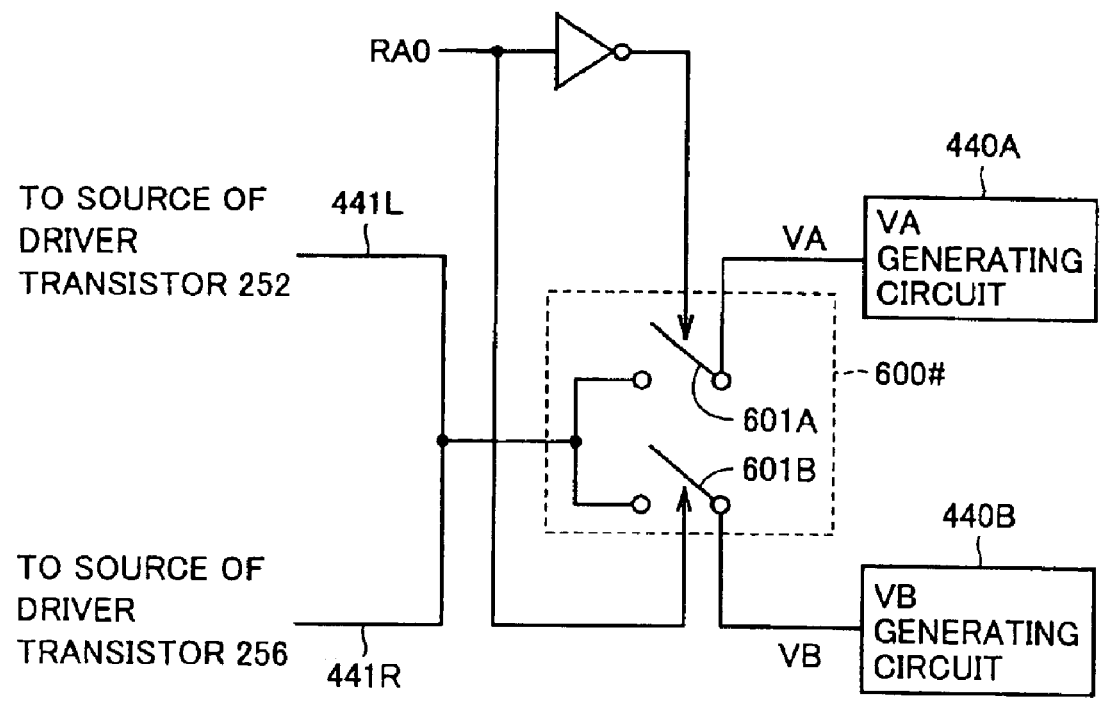
FIG. 41 is a circuit diagram showing a specific configuration of the selector shown in FIG. 40.

Referring to FIG. 41, selector 600# has switches 601A and 601B which complementarily turn on/off in accordance with the least significant bit RA0. Switch 601A is connected between an output node of VA generating circuit 440A and internal voltage interconnections 441R, 441L. Switch 601A turns on when the least significant bit RA0 is at an L level (upon selection of an even row), and turns off when bit RA0 is at an H level (upon selection of an odd row).

Switch 601B is connected between an output node of VB generating circuit 440B and internal voltage interconnections 441R, 441L. Switch 601B turns on when the least significant bit RA0 is at an H level (upon selection of an odd row) and turns off when bit RA0 is at an L level (upon selection of an even row).

With this configuration, when an even row is selected, internal voltage VA is applied to sources of driver transistors (P-MOS transistors) 252, 256 via internal voltage interconnections 441L, 441R, respectively. When an odd row is selected, internal voltage VB is applied to the sources of driver transistors 252, 256 via respective internal voltage interconnections 441L, 441R. That is, selector 600# switches between internal voltages VA and VB to be applied to the sources of driver transistors 252, 256 in accordance with the least significant bit RA0 identifying the arranged direction of the selected memory cell.

Referring again to FIG. 40, selector 600# permits switching of the source voltages of driver transistors (P-MOS transistors) 252, 256 within respective bit line drivers 250a, 250b, at the time of selection of an even row and at the time of selection of an odd row. Thus, at the time when an even row is selected, bit line current IB0a or IB1a corresponding to internal voltage VA is supplied as the data write current to a selected bit line BL. When an odd row is selected, bit line current IB0b or IB1b corresponding to internal voltage VB is supplied as the data write current to the selected bit line BL.

In the MRAM device according to the seventh embodiment, a data write test is carried out on some or all of memory cells MC within memory cell array 210 in a test mode, by changing adjustment signals PVA0–PVA3 and PVB0–PVB3 stepwise by the BIST circuit. Thus, internal voltage VA for causing flow of bit line currents IB0a, IB1a corresponding to operating points 400a, 401a shown in FIGS. 39A, 39B, and internal voltage VB for causing flow of bit line currents IB0b, IB1b corresponding to operating points 400b, 401b can be obtained. Adjustment signals PVA0–PVA3 and PVB0–PVB3 for attaining internal voltages VA, VB adjusted in the test mode are stored in the program circuit. In an actual operation, these adjustment signals stored in the program circuit are used to generate internal voltages VA, VB. As such, voltage control circuit 440# has a function similar to that of voltage control circuit 440 in terms of supply of the bit line current.

With this configuration, it is possible to adjust the absolute value of bit line current IBL at the time of data write to different levels for every other row, based on the relation between the shape of the memory cell and the direction of magnetic field HDL. As a result, in the MRAM device having asymmetrical memory cells arranged therein, operating points 400a, 401a and 400b, 401b can be applied alternately for every other row, to stabilize the data write.

Modification of Seventh Embodiment

Figure 42:
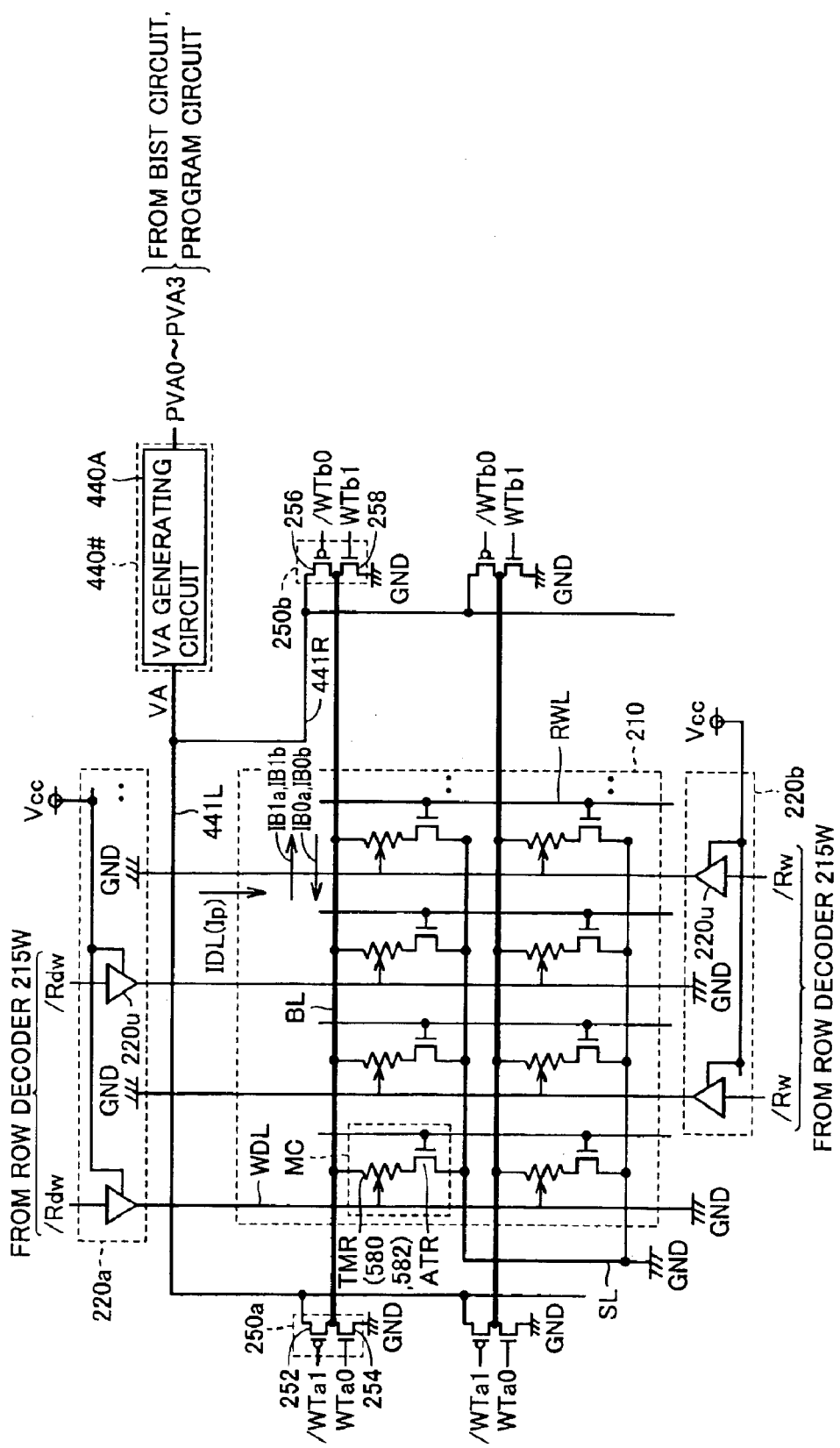
FIG. 42 is a block diagram showing a configuration of the MRAM device according to a modification of the seventh embodiment.

Referring to FIG. 42, the MRAM device according to the modification of the seventh embodiment differs from the MRAM device of the seventh embodiment in that drive units 220u, which are arranged corresponding to respective write digit lines WDL, are arranged alternately for every other row. More specifically, drive units 220u are arranged, between neighboring memory cell rows, alternately in regions on opposite sides of memory cell array 210. Each write digit line is connected to ground voltage GND on the side opposite to the side where drive unit 220u is arranged.

With this configuration, the relation between the direction of magnetic field HDL from write digit line WDL and the shape of the asymmetrical memory cell becomes the same in every memory cell row. As a result, the operating points for data write are fixed in every memory cell row to either operating points 400a, 401a, or operating points 400b, 401b, shown in FIGS. 39A, 39B. Accordingly, it is possible to set the source voltages of driver transistors 252, 256 at the time of data write to a common internal voltage, irrelevant to the row selection result.

As a result, in the MRAM device according to the modification of the seventh embodiment, selector 600# can be eliminated, and voltage control circuit 440# can be configured with a single VA generating circuit 440A. As such, in the MRAM device according to the modification of the seventh embodiment, it is possible to further stabilize the data write to the asymmetrical memory cell, with a simplified configuration for adjusting source voltages of the driver transistors of the bit lines.

Further, the alternate arrangement of drive units 220u also facilitates the layout of the driver transistors for driving write digit lines WDL.

Eighth Embodiment

In the seventh embodiment above, the adjustment of the data write current in the MRAM device provided with asymmetrical memory cells has been described assuming the case where the asteroid characteristic lines at the times of H level data write and L level data write are symmetrical with respect to the IDL axis (vertical axis). That is, as shown in FIGS. 39A and 39B, it has been assumed that asteroid characteristic lines 390a and 391a, and asteroid characteristic lines 390b and 391b for the same memory cell are symmetrical with respect to the IDL axis (vertical axis).

In the eighth embodiment, the data write current adjustment is explained assuming the case where the data write characteristics of the asymmetrical memory cell are different between the time of H level data write and the time of L level data write, as in the case of the fifth embodiment.

Figure 43A:
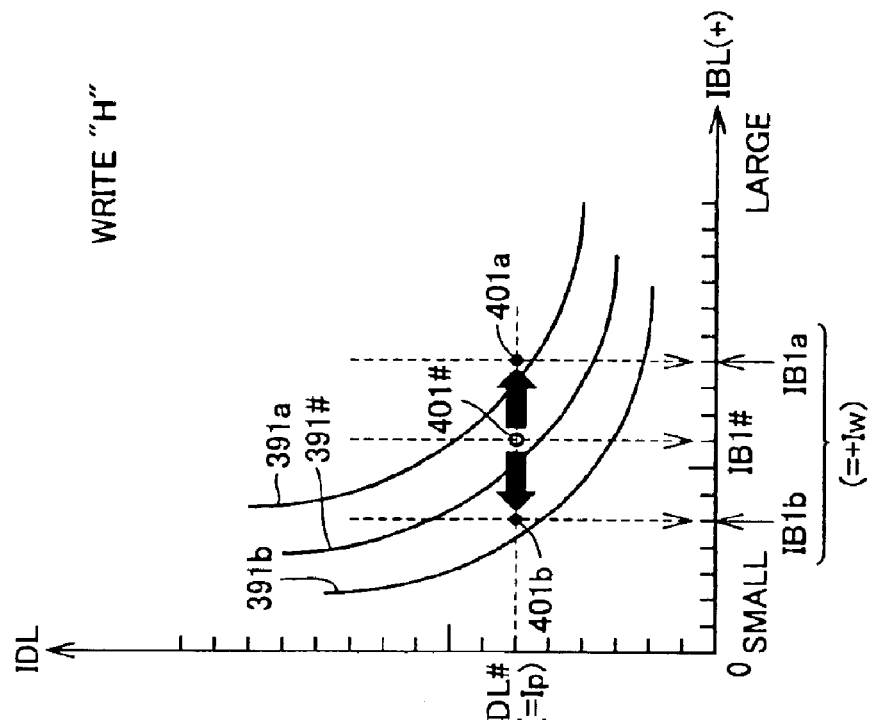
FIGS. 43A and 43B are conceptual diagrams illustrating the data write characteristics of an asymmetrical memory cell according to an eighth embodiment of the present invention and the corresponding adjustment of the data write current.
Figure 43B:
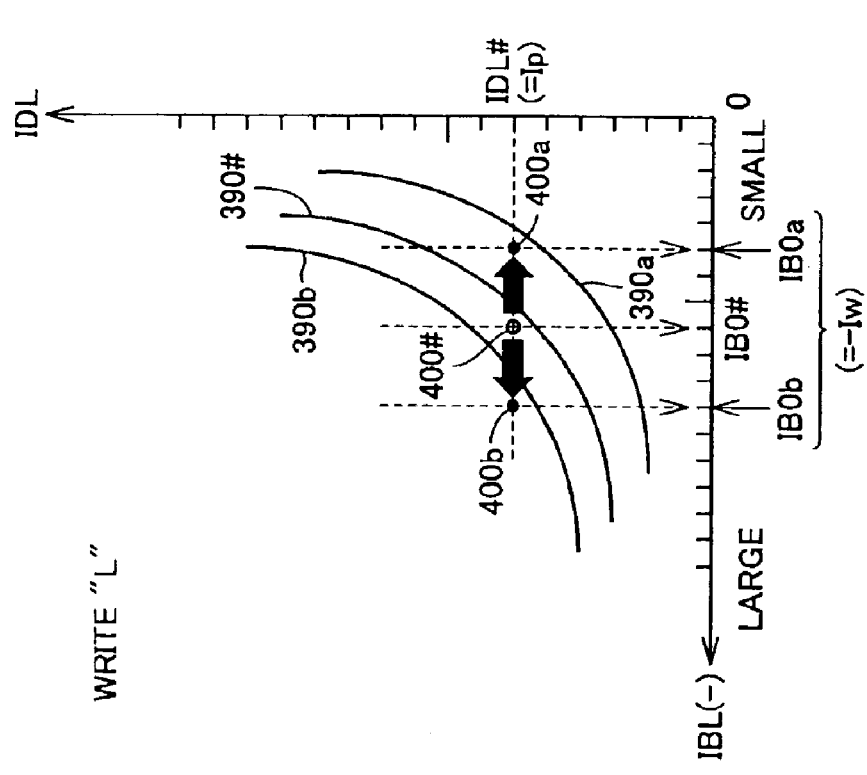

FIGS. 43A and 43B are conceptual diagrams illustrating the data write characteristics of the asymmetrical memory cell and the corresponding adjustment of data write current according to the eighth embodiment.

Referring to FIGS. 43A and 43B, the data write characteristics of the asymmetrical memory cells in every other row are indicated by asteroid characteristic lines 390a, 391a or asteroid characteristic lines 390b, 391b. While asteroid characteristic lines 390# and 391# of a symmetrical memory cell are symmetrical with respect to the IDL axis (vertical axis), asteroid characteristic lines 390a and 391a are asymmetrical with respect to the IDL axis (vertical axis). Similarly, asteroid characteristic lines 390b and 391b are asymmetrical with respect to the IDL axis (vertical axis).

Thus, either operating points 400a, 401a or operating points 400b, 401b should be used for data write to the asymmetrical memory cell, which is the same as described in the seventh embodiment. In particular, when the direction of digit line current IDL is fixed, it is necessary to perform the data write using operating points 400a, 401a or operating points 400b, 401b alternately for every other write digit line WDL, or every other row. In the eighth embodiment, unlike the case of the seventh embodiment, the adjustment of the bit line currents corresponding to the H level data write and the L level data write needs to be switched for every other row in accordance with the arranged directions of the asymmetrical memory cells.

In a memory cell row to which operating points 400a, 401a are applied, |IB0a|<|IB1a| stands between bit line currents IB0a (L level data write) and IB1a (H level data write). In a memory cell row to which operating points 400b, 401b are applied, |IB0b|>|IB1b| stands between bit line currents IB0b (L level data write) and IB1b (H level data write). Such switching in magnitude of the bit line currents occurs according to the relation between the shape of the memory cell and the direction of magnetic field HDL. Thus, |IB0a|=|IB1b| and |IB1a|=|IB0b| further stand among the bit line currents.

In the eighth embodiment, it is necessary to switch the adjustment of bit line current IBL corresponding to the write data for every other row, taking account of the data write characteristics as described above.

Figure 44:
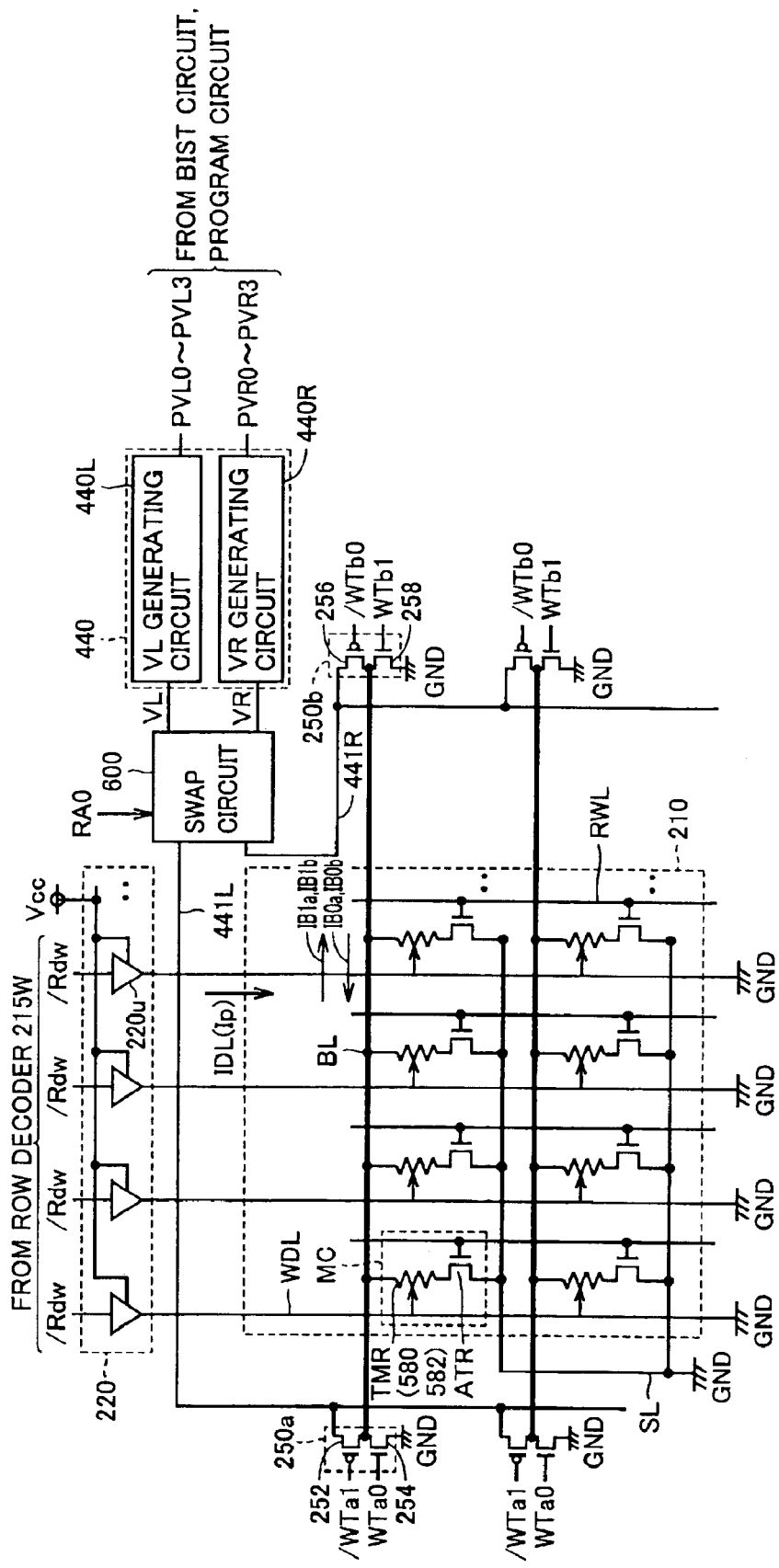
FIG. 44 is a block diagram showing a configuration of the MRAM device according to the eighth embodiment.

Referring to FIG. 44, the MRAM device according to the eighth embodiment differs from the MRAM device shown in FIG. 30 in that it further includes a swap circuit 600 which is provided as the "connection switching circuit". Swap circuit 600 is provided between VL generating circuit 440L, VR generating circuit 440R on one side and internal voltage interconnections 441L, 441R on the other side. Swap circuit 600 switches the lines to which internal voltages VL and VR are to be supplied, in accordance with the least significant bit RA0 of the row address.

Figure 45:
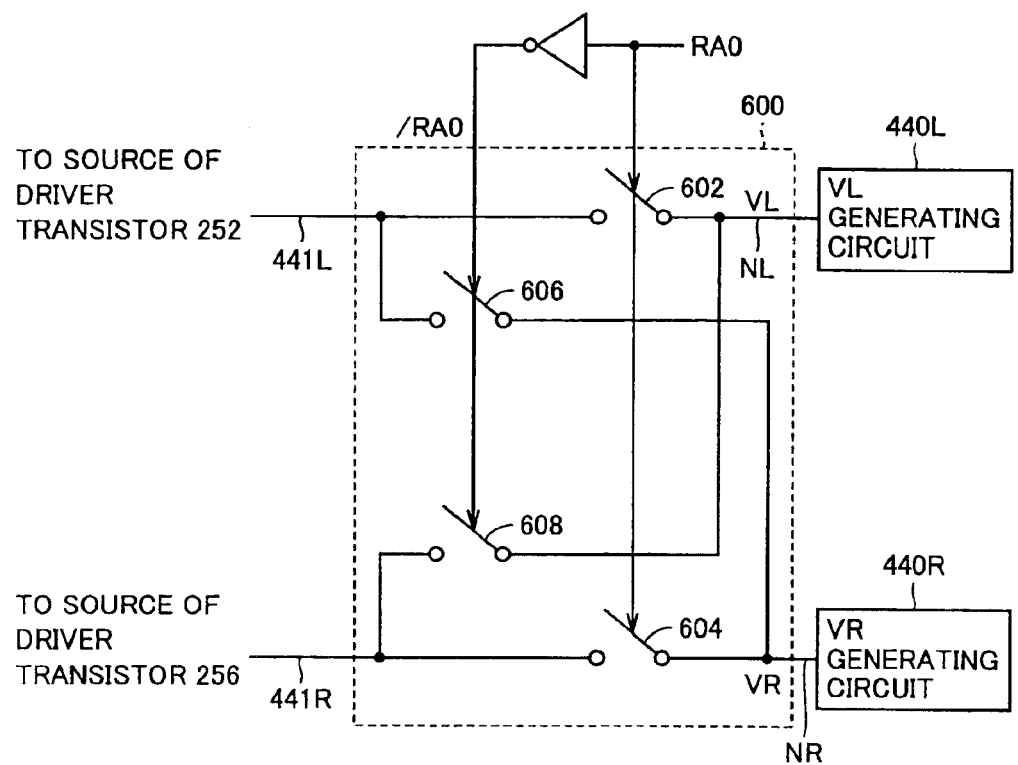
FIG. 45 is a circuit diagram showing a specific configuration of the swap circuit shown in FIG. 44.

Referring to FIG. 45, swap circuit 600 has switches 602, 604 which turn on/off in accordance with the address bit RA0, and switches 606, 608 which turn on/off, complimentarily to switches 602, 604, in accordance with an inverted address bit /RA0.

Switch 602 is provided between an output node NL of VL generating circuit 440L generating internal voltage VL, and internal voltage interconnection 441L. Switch 608 is provided between the output node NL and internal voltage interconnection 441R. Similarly, switch 604 is provided between an output node NR of VR generating circuit 440R generating internal voltage VR and internal voltage interconnection 441R, and switch 606 is provided between the output node NR and internal voltage interconnection 441L.

Thus, when an even row is selected, the source voltage of driver transistor 252 becomes internal voltage VR, and the source voltage of driver transistor 256 becomes internal voltage VL. Conversely, when an odd row is selected, the source voltage of driver transistor 252 becomes internal voltage VL, and the source voltage of driver transistor 256 becomes internal voltage VR. As such, swap circuit 600 switches between a first connection pattern where internal voltage VR is applied to the source of driver transistor 252 and internal voltage VL is applied to the source of driver transistor 256 and a second connection pattern where internal voltage VL is applied to the source of driver transistor 252 and internal voltage VR is applied to the source of driver transistor 256, in accordance with the least significant bit RA0 for identification of the arranged direction of the selected memory cell.

Referring again to FIG. 44, by provision of swap circuit 600, the magnitudes of bit line currents IB1a, IB0b come to correspond to internal voltage VR, and the magnitudes of bit line currents IB1b, IB0a come to correspond to internal voltage VL.

In the MRAM device according to the eighth embodiment, a data write test is conducted on some or all of memory cells MC within memory cell array 210 in a test mode, by changing adjustment signals PVL0–PVL3 and PVR0–PVR3 in steps by the BIST circuit. Thus, internal voltage VR for causing flow of bit line currents IB0b, IB1a corresponding to operating points 400b, 401a shown in FIGS. 43A and 43B, and internal voltage VL for causing flow of bit line currents IB0a, IB1b corresponding to operating points 400a, 401b can be obtained. Adjustment signals PVR0–PVR3 and PVL0–PVL3 for attaining internal voltages VR, VL adjusted in the test mode are stored in the program circuit. These adjustment signals stored in the program circuit are used in an actual operation to generate internal voltages VR, VL.

With this configuration, it is possible to adjust bit line current IBL at the time of data write to different levels for every other row, corresponding to the arranged directions of the asymmetrical memory cells. As a result, the data write in the MRAM device provided with the asymmetrical memory cells can be stabilized by applying operating points 400a, 401a and 400b, 401b alternately for every other row.

Modification of Eighth Embodiment

Figure 46:
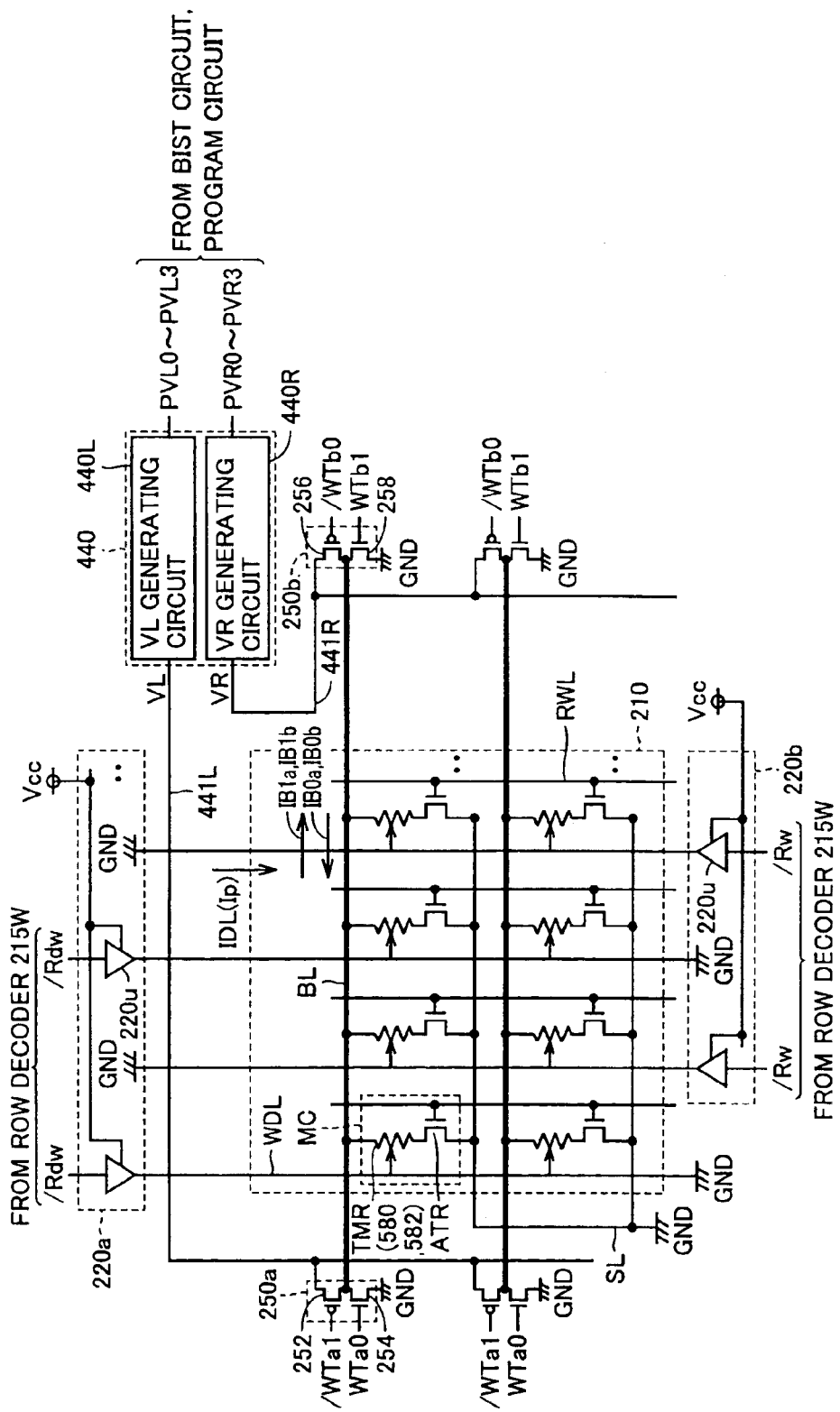
FIG. 46 is a block diagram showing a configuration of the MRAM device according to a modification of the eighth embodiment.

Referring to FIG. 46, the MRAM device according to the modification of the eighth embodiment differs from the MRAM device according to the eighth embodiment in that drive units 220u, which are arranged for respective write digit lines WDL, are arranged alternately for every other row. More specifically, drive units 220u are arranged between neighboring memory cell rows, alternately in regions on opposite sides of memory cell array 210. Each write digit line is connected to ground voltage GND on the side opposite to the side where drive unit 220u is arranged.

With this configuration, the layout of the driver transistors constituting drive units 220u is facilitated.

Further, in every memory cell row, the relation between the direction of magnetic field HDL from write digit line WDL and the shape of the asymmetrical memory cell becomes the same. Thus, the operating points upon data write are fixed in every memory cell row to either operating points 400a, 401a or operating points 400b, 401b shown in FIGS. 43A and 43B.

Accordingly, in the MRAM device of the modification of the eighth embodiment, swap circuit 600 provided in the MRAM device of the eighth embodiment can be eliminated, and the data write corresponding to the asymmetry in data write characteristics of the asymmetrical memory cells can be implemented by adjusting internal voltages VR and VL. As such, in the MRAM device according to the modification of the eighth embodiment, it is possible to further stabilize the data write to the asymmetrical memory cell, while simplifying the configuration for the source voltage adjustment of the driver transistors of the bit lines.

Ninth Embodiment

Figure 47:
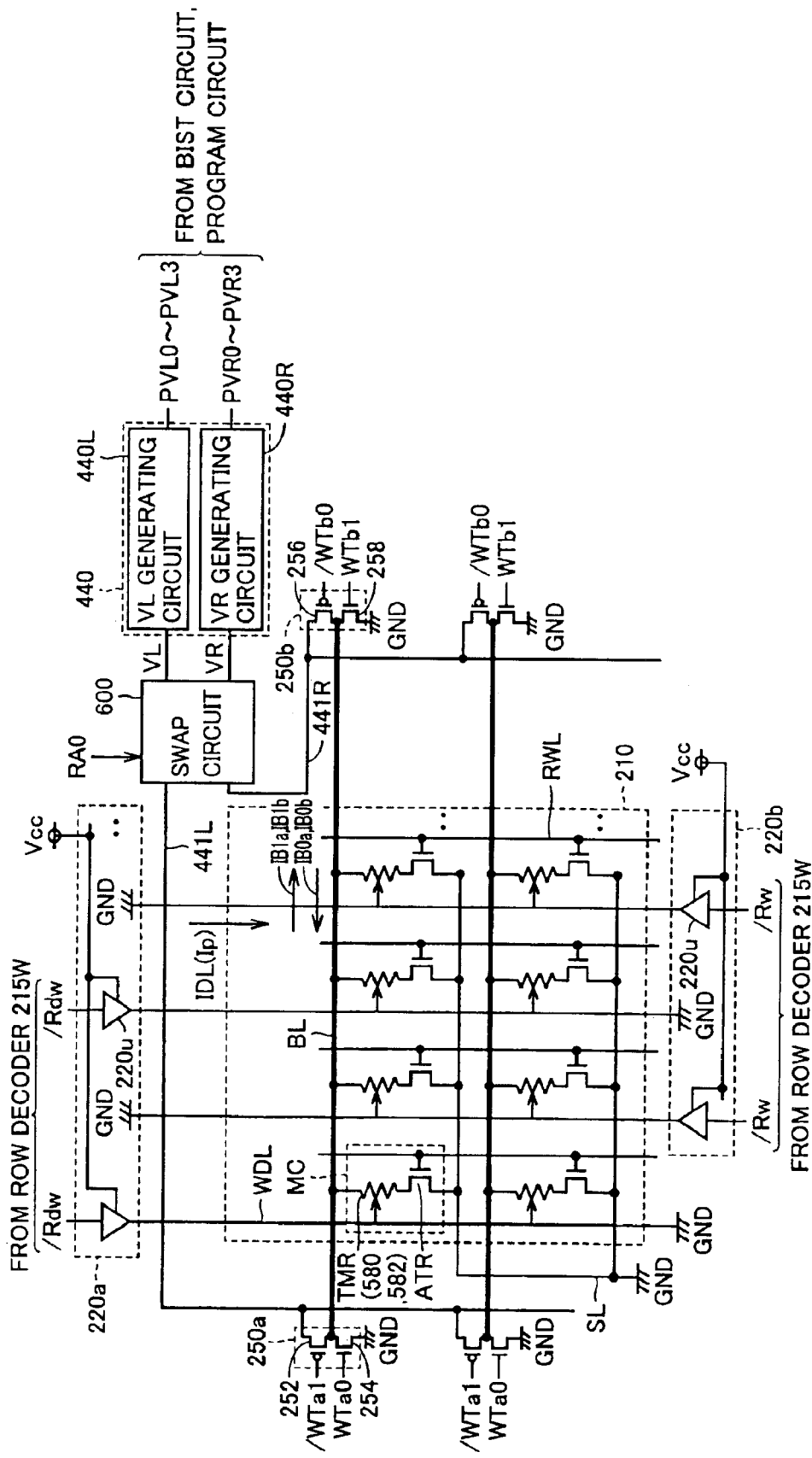
FIG. 47 is a block diagram showing a configuration of the MRAM device according to a ninth embodiment of the present invention.

Referring to FIG. 47, it is assumed in the MRAM device according to the ninth embodiment that each memory cell MC is formed of a symmetrical memory cell as shown in FIG. 37 and that each memory cell has asymmetry in data write characteristics as in the case of the fifth embodiment (FIG. 28B).

In the MRAM device according to the ninth embodiment, drive units 220u of write digit lines WDL are arranged on opposite sides of memory cell array 210 alternately for every other row, as in the cases of the modifications of the seventh and eighth embodiments.

Assume that arrangement of all memory cells MC is displaced in one direction in the MRAM device of the ninth embodiment. In such a case, it is necessary to switch the adjustment of bit line current IBL in accordance with write data for every other row, as in the eighth embodiment, since digit line currents IDL flow in opposite directions in every other memory cell row.

Thus, in the configuration where drive units 220u are arranged alternately, swap circuit 600 as described in conjunction with FIGS. 44 and 45 can be used to adjust bit line current IBL in accordance with the write data and the row selection result. The data write is thus stabilized, as in the case of the MRAM device of the fifth embodiment.

In the fifth through ninth embodiments, it has been described, as a preferable configuration example, that the voltage generating circuits generating internal voltages VL, VR, VD0, VD1, VA and VB to be applied to driver transistors driving data write currents, i.e., VL generating circuit 440L, VR generating circuit 440R, VD0 generating circuit 550, VD1 generating circuit 551, VA generating circuit 440A and VB generating circuit 440B, are each made to have the same configuration as internal voltage control circuit 40 (FIG. 4) according to the first embodiment. However, such a circuit incorporating a feedback loop therein as internal voltage control circuit 40 does not necessarily have to be applied to each of these voltage generating circuits. Specifically, the effects described in the fifth through ninth embodiments can be obtained using voltage generating circuits of any configurations, as long as the internal voltages can be adjusted independently from each other. For example, VL generating circuit 440L, VR generating circuit 440R, VD0 generating circuit 550, VD1 generating circuit 551, VA generating circuit 440A and VB generating circuit 440B may each be configured with a common voltage generating circuit capable of adjusting an output voltage level by trimming or the like.

Further, in the first through ninth embodiments, each adjustment signal for adjustment of an internal voltage has been described to have four bits. However, the adjustment signals may each have any number of bits, in accordance with the degree of fineness required for the internal voltage adjustment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    an internal circuit receiving supply of an operating current from a power supply node;
    a current switch connected between an operating voltage source and said power supply node; and
    a leakage detecting circuit for detecting whether a leakage current of said internal circuit is not greater than a reference level,
    said leakage detecting circuit including
    a reference current supply portion supplying a current of said reference level to said power supply node in an off period of said current switch, and
    a voltage comparison circuit for comparing a voltage of said power supply node with a prescribed voltage in said off period.

2. The semiconductor device according to claim 1, wherein said reference current supply portion has a reference current adjust portion which changes said reference level stepwise in response to an adjustment designation.

3. The semiconductor device according to claim 1, further comprising:
    an internal voltage control circuit controlling an internal voltage applied to a field effect transistor constituting said internal circuit; and
    an internal voltage interconnection transmitting said internal voltage;
    said internal voltage control circuit including
    an internal voltage comparison circuit comparing a voltage of said internal voltage interconnection with an object voltage,
    a voltage control circuit controlling said internal voltage based on a comparison result in said internal voltage comparison circuit, and
    a voltage adjust portion for changing said object voltage in response to an adjustment input.

4. The semiconductor device according to claim 3, wherein said adjustment input being input in a standby mode is set based on a state where said leakage current becomes not greater than said reference level at the time of an operation test.

5. The semiconductor device according to claim 3, wherein
    said current switch is turned off in a standby mode, and
    said adjustment input to said voltage adjust portion is set based on an output of said voltage comparison circuit.

6. The semiconductor device according to claim 1, wherein said internal circuit includes at least one field effect transistor,
    said semiconductor device further comprising:
    an internal voltage control circuit for controlling an internal voltage applied to one of source, gate, drain and substrate of said field effect transistor included in said internal circuit; and
    an internal voltage interconnection transmitting said internal voltage;
    said internal voltage control circuit including
    an internal voltage comparison circuit for comparing a voltage of said internal voltage interconnection with an object voltage,
    a voltage control circuit controlling said internal voltage based on a comparison result in said internal voltage comparison circuit, and
    a voltage adjust portion for changing said object voltage in response to an adjustment input.

7. The semiconductor device according to claim 6, wherein said adjustment input differs in a normal operation mode and a standby mode.

8. The semiconductor device according to claim 6, wherein
    said voltage adjust portion includes a voltage-divider circuit which divides a voltage difference between said internal voltage and a prescribed voltage with a divide ratio in accordance with said adjustment input, and
    said internal voltage comparison circuit compares the divided voltage output from said voltage-divider circuit with a fixed reference voltage.

9. A semiconductor memory device, comprising:
    a plurality of memory cells each having data written therein in response to supply of a data write current;
    a transistor formed of a field effect transistor and driving said data write current;
    an internal voltage control circuit controlling an internal voltage applied to said transistor; and
    an internal voltage interconnection transmitting said internal voltage;
    said internal voltage control circuit including
    an internal voltage comparison circuit for comparing a voltage of said internal voltage interconnection with an object voltage,
    a voltage control circuit controlling said internal voltage based on a comparison result in said internal voltage comparison circuit, and
    a voltage adjust portion for changing said object voltage in response to an adjustment input.

10. The semiconductor memory device according to claim 9, wherein said internal voltage is applied to said transistor as a substrate voltage.

11. The semiconductor memory device according to claim 9, wherein said internal voltage is applied to one of source, gate and drain of said transistor.

12. The semiconductor memory device according to claim 9, further comprising:
a data read circuit for reading data out of said plurality of memory cells; and
a write test portion for evaluating, in an operation test where said adjustment input can be set in a plurality of steps, whether said data of a prescribed level can be written correctly to said plurality of memory cells in each of said plurality of steps;
wherein said adjustment input in a normal operation is set based on the evaluation by said write test portion in said operation test.

13. The semiconductor memory device according to claim 12, wherein
said write test portion includes a data comparison circuit, and
said data comparison circuit compares, in said operation test, data read out of said plurality of memory cells by said data read circuit after writing of data of said prescribed level with data of an expected value corresponding to said prescribed level.

14. The semiconductor memory device according to claim 12, wherein said adjustment input in a standby mode is set different from that in said normal operation.

15. The semiconductor memory device according to claim 9, further comprising:
an access control circuit for switching accesses to said plurality of memory cells based on an input address, between a first mode where each of said plurality of memory cells stores data of one bit and a second mode where each pair of said plurality of memory cells stores data of one bit;
a data read circuit performing data read from at least one of said plurality of memory cells selected as an access target by said access control circuit; and
a data write circuit performing data write to the at least one of said plurality of memory cells selected as said access target.

16. The semiconductor memory device according to claim 9, further comprising a data write circuit controlling said data write current in accordance with a level of said data to be written, wherein
each of said plurality of memory cells includes
a first magnetic layer having a fixed magnetization direction,
a second magnetic layer magnetized in a direction corresponding to a magnetic field generated by said data write current, and
an insulating film formed between said first and second magnetic layers.

17. The semiconductor memory device according to claim 9, further comprising a data write circuit controlling said data write current in accordance with a level of said data to be written, wherein
each of said plurality of memory cells includes
a heating element which generates heat by said data write current, and
a phase change element which is heated by said heating element and makes a transition between two phase states.

18. A semiconductor memory device, comprising:
a plurality of memory cells each having data written therein in response to supply of a data write current;
a first write current line arranged for each of prescribed groups of said plurality of memory cells and having said data write current flown thereon in one of first and second directions;
a plurality of transistors driving said data write current, said plurality of transistors including
a first driver transistor for driving the current of said first direction to said first write current line, and
a second driver transistor for driving the current of said second direction to said first write current line; and
a first current adjust portion capable of adjusting current amounts flown by said first and second driver transistors independently from each other.

19. The semiconductor memory device according to claim 18, wherein the direction of said data write current flown on said first write current line is set in accordance with write data.

20. The semiconductor memory device according to claim 18, further comprising a second write current line provided in a direction crossing said first write current line and having said data write current flown thereon in a prescribed direction, wherein
said plurality of transistors further include a third driver transistor for driving the current of said prescribed direction to said second write current line,
said semiconductor memory device further comprising a second current adjust portion adjusting a current amount flown by said third driver transistor.

21. The semiconductor memory device according to claim 20, wherein
said second current adjust portion includes
a plurality of voltage generating circuits respectively generating a plurality of voltages adjustable independently from each other, and
a selector circuit selecting one of said plurality of voltages in accordance with the write data to apply to said third driver transistor, and
said third driver transistor is capable of supplying a current corresponding to the voltage applied via said selector circuit to said second write current line.

22. The semiconductor memory device according to claim 18, further comprising:
a second write current line provided in a direction crossing said first write current line and having said data write current flown thereon in a prescribed direction; and
a second current adjust portion supplying one of first and second current amounts to said second write current line,
said second current adjust portion including
a first current supply portion supplying a current corresponding to an adjustable first reference voltage,
a second current supply portion supplying a current corresponding to an adjustable second reference voltage, and
a switch element arranged such that one of the current supplied from said first current supply portion and a sum or difference of the currents supplied from said first and second current supply portions is selectively supplied to said second write current line in accordance with on/off control of said switch element,
said first reference voltage being adjusted corresponding to one of said first and second current amounts, and
said second reference voltage being adjusted corresponding to a difference between said first and second current amounts.

23. The semiconductor memory device according to claim 22, wherein on/off of said switch element is controlled in accordance with the write data.

24. The semiconductor memory device according to claim 18, wherein said first current adjust portion includes a voltage generating circuit generating first and second voltages adjustable independently from each other, said semiconductor memory device further comprising a connection switching circuit provided between said voltage generating circuit and said first and second driver transistors, said connection switching circuit being capable of switching between a first connection for applying said first and second voltages to said first and second driver transistors, respectively, and a second connection for applying said second and first voltages to said first and second driver transistors, respectively, for each access to said semiconductor memory device, and said first and second driver transistors being capable of supplying to said first write current line a current amount corresponding to a voltage applied via said connection switching circuit.

25. The semiconductor memory device according to claim 18, wherein said plurality of memory cells each have an asymmetrical shape so that said data write current necessary for data write differs in magnitude in accordance with an arranged direction of the memory cell.

26. The semiconductor memory device according to claim 25, wherein said first current adjust portion includes a voltage generating circuit generating first and second voltages adjustable independently from each other, said semiconductor memory device further comprising a selector circuit provided between said voltage generating circuit and said first and second driver transistors and switching which of said first and second voltages is applied to respective one of said first and second driver transistors for each access to said semiconductor memory device, said first and second driver transistors each being capable of supplying a current corresponding to the voltage applied via said selector circuit to said first write current line.

27. The semiconductor memory device according to claim 26, wherein said selector circuit switches which of said first and second voltages is applied to respective one of said first and second driver transistors in accordance with information capable of identifying said arranged direction of the memory cell selected as a target of said data write from among said plurality of memory cells.

28. The semiconductor memory device according to claim 18, wherein said plurality of memory cells each have an asymmetrical shape so that said data write current necessary for data write differs in magnitude in accordance with an arranged direction of the memory cell, and in each of said plurality of memory cells, the magnitude of said data write current necessary for the data write differs between said first and second directions.

29. The semiconductor memory device according to claim 28, wherein said first current adjust portion includes a voltage generating circuit generating first and second voltages adjustable independently from each other, said semiconductor memory device further comprising a connection switching circuit provided between said voltage generating circuit and said first and second driver transistors, said connection switching circuit being capable of switching between a first connection for applying said first and second voltages to said first and second driver transistors, respectively, and a second connection for applying said second and first voltages to said first and second driver transistors, respectively, for each access to said semiconductor memory device, and said first and second driver transistors each being capable of supplying a current amount corresponding to the voltage applied via said connection switching circuit to said first write current line.

30. The semiconductor memory device according to claim 29, wherein said connection switching circuit switches between said first and second connections in accordance with information capable of identifying said arranged direction of the memory cell selected as a target of said data write from among said plurality of memory cells.

31. The semiconductor memory device according to claim 18, further comprising a plurality of second write current lines provided in a direction crossing said first write current line and each having said data write current flown thereon in a prescribed direction irrelevant to said write data, wherein said plurality of transistors further include a plurality of third driver transistors provided corresponding to said plurality of second write current lines and each driving a current in a fixed direction as seen from itself to corresponding said second write current line, said plurality of third driver transistors are arranged alternately on one end side and on another end side of said plurality of second write current lines for every said second write current line, said first current adjust portion includes a voltage generating circuit generating first and second voltages adjustable independently from each other, said first driver transistor is capable of supplying to said first write current line a current amount corresponding to one of said first and second voltages that is selected in accordance with address information capable of identifying whether said third driver transistor corresponding to a data write target is arranged on said one end side or on said another end side, and said second driver transistor is capable of supplying to said first write current line a current amount corresponding to the other of said first and second voltages that is complementarily selected in accordance with said address information.

* * * * *